(12) United States Patent
Nishi et al.

(10) Patent No.: US 6,590,634 B1
(45) Date of Patent: Jul. 8, 2003

(54) EXPOSURE APPARATUS AND METHOD

(75) Inventors: Kenji Nishi, Yokohama (JP); Kazuya Ota, Ota-ku (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/716,405

(22) Filed: Nov. 21, 2000

Related U.S. Application Data

(62) Division of application No. 09/666,407, filed on Sep. 20, 2000, which is a continuation of application No. 08/980,315, filed on Nov. 28, 1997.
(60) Provisional application No. 60/059,989, filed on Sep. 25, 1997, provisional application No. 60/059,992, filed on Sep. 25, 1997, provisional application No. 60/060,022, filed on Sep. 25, 1997, provisional application No. 60/060,076, filed on Sep. 25, 1997, and provisional application No. 60/060,677, filed on Sep. 25, 1997.

(30) Foreign Application Priority Data

| Nov. 28, 1996 | (JP) | 8-332843 |
| Nov. 28, 1996 | (JP) | 8-332844 |
| Nov. 28, 1996 | (JP) | 8-332845 |
| Nov. 28, 1996 | (JP) | 8-332846 |
| Nov. 28, 1996 | (JP) | 8-332847 |

(51) Int. Cl.$^7$ .................. G03B 27/42; G03B 27/54; G03B 27/62
(52) U.S. Cl. .................. 355/53; 355/67; 355/75
(58) Field of Search .................. 355/53, 67, 72–76, 355/55; 310/10, 12; 414/936, 941; 356/399–401; 250/548

(56) References Cited

U.S. PATENT DOCUMENTS

| 4,780,617 A | 10/1988 | Umatate et al. |
| 4,861,162 A | 8/1989 | Ina .................. 356/401 |
| 5,117,255 A | 5/1992 | Shiraishi et al. |
| 5,151,750 A | 9/1992 | Magome et al. |

(List continued on next page.)

FOREIGN PATENT DOCUMENTS

| EP | 0 687 957 A1 | 12/1995 |
| GB | 2 155 201 A | 9/1985 |
| JP | 55-167653 | 5/1954 |
| JP | 53-105376 | 9/1978 |
| JP | A-57-183031 | 11/1982 |
| JP | A-60-47418 | 3/1985 |

(List continued on next page.)

OTHER PUBLICATIONS

Translation of JP–A–5–175098.
Partial translation of Japanese Patent Application Laid–Open No. 63–261850.
Partial translation of Japanese Patent Application Laid–Open No. 57–183031.
Partial translation of Japanese Utility Model Application Laid–Open No. 55–167653.

Primary Examiner—Henry Hung Nguyen
(74) Attorney, Agent, or Firm—Oliff & Berridge PLC

(57) ABSTRACT

Two stages (WS1, WS2) holding wafers can independently move between a positional information measuring section (PIS) under an alignment system (24a) and an exposing section (EPS) under a projection optical system (PL). The wafer exchange and alignment are performed on the stage (WS1), during which wafer (W2) is exposed on the stage (WS2). A position of each shot area of wafer (WS1) is obtained as a relative position with respect to a reference mark formed on the stage WS1 in the section (PIS). Relative positional information can be used for the alignment with respect to an exposure pattern when the wafer (WS1) is moved to the section (EPS) to be exposed. Therefore, it is not necessary that a stage position is observed continuously in moving the stage. Exposure operations are performed in parallel by the two wafer stages (WS1) and (WS2) so as to improve the throughput.

50 Claims, 38 Drawing Sheets

U.S. PATENT DOCUMENTS

| | | |
|---|---|---|
| 5,249,016 A | 9/1993 | Tanaka |
| 5,448,332 A | 9/1995 | Sakakibara et al. |
| 5,464,715 A | 11/1995 | Nishi et al. .................... 430/22 |
| 5,477,304 A | 12/1995 | Nishi .......................... 355/53 |
| 5,493,403 A | 2/1996 | Nishi |
| 5,502,311 A | 3/1996 | Imai et al. |
| 5,504,407 A | 4/1996 | Wakai et al. |
| 5,506,684 A | 4/1996 | Ota et al. .................... 356/401 |
| 5,534,970 A | 7/1996 | Nakashima et al. |
| 5,585,925 A | 12/1996 | Sato et al. |
| 5,591,958 A | 1/1997 | Nishi et al. |
| 5,599,365 A | 2/1997 | Alday et al. |
| 5,646,413 A | 7/1997 | Nishi |
| 5,658,700 A | 8/1997 | Sakai |
| 5,677,758 A * | 10/1997 | McEachern et al. .......... 355/53 |
| 5,693,439 A | 12/1997 | Tanaka et al. |
| 5,699,145 A | 12/1997 | Makinouchi et al. |
| 5,715,037 A | 2/1998 | Saiki et al. |
| 5,715,063 A | 2/1998 | Ota |
| 5,721,607 A | 2/1998 | Ota |
| 5,721,608 A | 2/1998 | Taniguchi |
| 5,751,404 A | 5/1998 | Murakami et al. |
| 5,801,832 A | 9/1998 | Van Den Brink |
| 5,815,248 A | 9/1998 | Nishi et al. |
| 5,844,247 A | 12/1998 | Nishi |
| 5,850,279 A | 12/1998 | Nara et al. |
| 5,877,845 A | 3/1999 | Makinouchi |
| 5,929,976 A | 7/1999 | Shibuya et al. |
| 5,942,357 A | 8/1999 | Ota |
| 5,978,071 A | 11/1999 | Miyajima et al. |
| 5,989,761 A | 11/1999 | Kawakubo et al. |
| 5,995,198 A | 11/1999 | Mizutani |
| 6,023,068 A * | 2/2000 | Takahashi ................ 250/492.2 |
| 6,160,619 A | 12/2000 | Magome .................... 356/358 |
| 6,278,957 B1 | 8/2001 | Yasuda et al. |

FOREIGN PATENT DOCUMENTS

| | | |
|---|---|---|
| JP | 61-196532 A | 8/1986 |
| JP | A-63-87725 | 4/1988 |
| JP | A-63-261850 | 10/1988 |
| JP | A-2-166717 | 6/1990 |
| JP | A5-175098 * | 7/1993 |
| JP | A-5-175098 | 7/1993 |
| JP | A-6-291017 | 10/1994 |
| JP | A-7-302748 | 11/1995 |
| JP | A-8-51069 | 2/1996 |
| JP | 8-191045 A | 7/1996 |
| US | 002046015 * | 5/1988 |
| WO | WO 98/40791 | 9/1998 |
| WO | WO 98/06009 | 12/1998 |

* cited by examiner

| | F/B | AF | | | | | | | | | AB | | | | | | | | |
|---|---|---|---|---|---|---|---|---|---|---|---|---|---|---|---|---|---|---|---|
| | No. | 1 | 2 | 3 | 4 | 5 | 6 | 7 | 8 | 9 | 1 | 2 | 3 | 4 | 5 | 6 | 7 | 8 | 9 |
| GROUP NAME | A | | | | | | | ○ | ○ | ○ | | | | | | | | | |
| | B | | | | | | | | | | | | | | ○ | ○ | ○ | ○ | ○ |
| | C | | | | | | ○ | ○ | ○ | ○ | | | | | | | | | |
| | D | ○ | ○ | ○ | | | | | | | | | | | | | | | |
| | E | | | | | | | | | | ○ | ○ | ○ | ○ | ○ | | | | |
| | F | | | | | | | | | | | | ○ | ○ | ○ | ○ | ○ | | |
| | AF | | ○ | ○ | ○ | ○ | ○ | | | | | | | | | | | | |
| | AB | | | | | | | | | | | | ○ | ○ | ○ | ○ | ○ | | |

PATTERN PROHIBITION ZONE

EXPOSURE APPARATUS AND METHOD

This is a division of Application Ser. No. 09/666,407 filed Sep. 20, 2000, which is now U.S. Pat. No. 6,400,441, which in turn is a Continuation of Application Ser. No. 08/980,315 filed Nov. 28, 1997 which is abandoned. The entire disclosure of the prior application(s) is hereby incorporated by reference herein in its entirety.

This application also claims benefit of Provisional Nos. 60/059,989, 60/059,992, 60/060,022, 60/060,076 and 60/060,077 all filed on Sep. 25, 1997.

FIELD OF THE INVENTION

The present invention relates to an exposure apparatus and an exposure method for exposing a sensitive substrate with a laser beam, an electron beam and other charged particle beams. In particular, the present invention relates to an exposure apparatus and an exposure method, which is used for producing semiconductor elements or liquid crystal display elements by means of the photolithography process, and which exposes the sensitive substrate by projecting a pattern formed on a mask via a projection optical system onto the sensitive substrate. Especially, the present invention relates to an exposure apparatus and an exposure method suitable for performing exposure and alignment of two substrates in parallel using two substrate stages.

BACKGROUND OF THE INVENTION

Various exposure apparatuses have been hitherto used, for example, when semiconductor elements or liquid crystal display elements are produced by means of the photolithography step. At present, a projection exposure apparatus is generally used, in which an image of a pattern formed on a photomask or reticle (hereinafter generally referred to as "reticle") is transferred via a projection optical system onto a substrate (hereinafter referred to as "sensitive substrate", if necessary) such as a wafer or a glass blade applied with a photosensitive material such as photoresist on its surface. In recent years, a reduction projection exposure apparatus (so-called stepper) based on the so-called step-and-repeat system is predominantly used as the projection exposure apparatus, in which a sensitive substrate is placed on a substrate stage which is movable two-dimensionally, and the sensitive substrate is moved in a stepwise manner (subjected to stepping) by using the substrate stage to repeat the operation for successively exposing respective shot areas on the sensitive substrate with the image of the pattern formed on the reticle.

Recently, a projection exposure apparatus based on the step-and-scan system (scanning type exposure apparatus as described, for example, in Japanese Laid-Open Patent Publication No. 7-176468, corresponding to U.S. Pat. No. 5,646,413), which is obtained by applying modification to the stationary type exposure apparatus such as the stepper, is also used frequently. The projection exposure apparatus based on the step-and-scan system has, for example, the following merits. That is, (1) the projection optical system is easily produced because a large field can be exposed by using a smaller optical system as compared with the stepper, and a high throughput can be expected owing to the decrease in number of shots because a large field is exposed. Further, (2) an averaging effect is obtained owing to relative scanning for the reticle and the wafer with respect to the projection optical system, and thereby it is possible to expect improvement in distortion and depth of focus. Moreover, it is considered that the scanning type projection exposure apparatus will be predominantly used in place of the stepper, because a large field will become essential in accordance with the increase in the degree of integration of the semiconductor element, which is 16 M (mega) at present and will become 64 M for DRAM, 256 M, and 1 G (giga) in future as the progress proceeds along with time.

With this type of projection exposure apparatus, alignment between the reticle and the wafer needs to be performed highly precisely prior to exposure. To carry out this alignment, the wafer is provided with a position detecting mark (alignment mark) formed (or exposure transferred) by a previous photolithographic process. By detecting the position of this alignment mark, the exact position of the wafer (or a circuit pattern on the wafer) can be detected.

Alignment microscopes for detecting the alignment mark are roughly classified into the on-axis type for detecting the mark through a projection lens, and the off-axis type for detecting the mark without allowing the detecting light pass through a projection lens. With regard to a projection exposure apparatus with an excimer laser light source, which would be predominant in this field, an alignment microscope of the off-axis type is optimal. This is because the projection lens has been corrected for chromatic aberration due to exposure light, so that the on-axis type cannot condense alignment light, or if it could, an error due to chromatic aberration would be marked. An alignment microscope of the off-axis type, on the other hand, is provided separately from the projection lens; therefore, free optical design is possible without regard for such chromatic aberration, and various alignment systems can be used. For example, a phase contrast microscope or a differential interference microscope may also be used.

When the sensitive substrate is subjected to exposure by using the scanning type projection exposure apparatus, the so-called complete pre-measurement control method has been carried out as follows as described, for example, in Japanese Laid-Open Patent Publication No. 6-283403 corresponding to U.S. Pat. No. 5,448,332. That is, all detecting points included in one array provided on a front side in the scanning direction with respect to an exposure field are used as sample points. All values of focus positions at the sample points are previously measured before exposure, followed by the averaging process and the filtering process. The autofocus and the autoleveling mechanisms are controlled in an open manner during the exposure in consideration of phase delay. Concurrently with the foregoing operation, an inclination in the non-scanning direction is determined by means of the least square approximation method from the measured values of the focus positions at the respective sample points in the one array described above to perform the leveling control in the non-scanning direction in accordance with the open control.

Such a projection exposure apparatus is principally used as a mass-production machine for semiconductor elements or the like. Therefore, the projection exposure apparatus necessarily required to have a processing ability that how many sheets of wafers can be subjected to the exposure process for a certain period of time. That is, it is necessarily required for the projection exposure apparatus to improve the throughput.

In this context, in the case of the projection exposure apparatus based on the step-and-scan system described above, when a large field is exposed, the improvement in throughput is expected because the number of shots to be exposed on the wafer is decreased as described above. However, since the exposure is performed during movement at a constant velocity in accordance with synchronized scanning for the reticle and the wafer, it is necessary to provide acceleration and deceleration areas before and after the constant velocity movement area. As a result, if a shot having a size equivalent to a shot size of the stepper is exposed, there is a possibility that the throughput is rather decreased as compared with the stepper.

The outline of the flow of the process in such a projection exposure apparatus is as follows.

(1) At first, a wafer load step is performed, in which a wafer is loaded on a wafer table by using a wafer loader.

(2) Next, a search alignment step is performed, in which the position of the wafer is roughly detected by using a search alignment mechanism. Specifically, the search alignment step is performed, for example, on the basis of the contour of the wafer, or by detecting a search alignment mark on the wafer.

(3) Next, a fine alignment step is performed, in which the position of each of the shot areas on the wafer is accurately determined. In general, the EGA (enhanced global alignment) system is used for the fine alignment step. In this system, a plurality of sample shots included in the wafer are selected beforehand, and positions of alignment marks (wafer marks) affixed to the sample shots are successively measured. Statistical calculation based on, for example, the so-called least square method is performed on the basis of results of the measurement and designed values of the shot array to determine all shot array data on the wafer (see, for example, Japanese Laid-Open Patent Publication No. 61-44429 corresponding to U.S. Pat. No. 4,780,617). In this system, it is possible to determine the coordinate positions of the respective shot areas with high accuracy at a high throughput.

(4) Next, an exposure step is performed, in which the image of the pattern on the reticle is transferred onto the wafer via the projection optical system while successively positioning the respective shot areas on the wafer to be located at exposure positions on the basis of the coordinate positions of the respective shot areas having been determined in accordance with the EGA system or the like described above and the previously measured baseline amount.

(5) Next, a wafer unload step is performed, in which the wafer on the wafer table having been subjected to the exposure process is wafer-unloaded by using a wafer unloader. The wafer unload step is performed simultaneously with the wafer load step (1) described above in which the exposure process is performed. That is, a wafer exchange step is constructed by the steps (1) and (5).

As described above, in the conventional projection exposure apparatus, the roughly classified four operations are repeatedly performed by using one wafer stage, i.e., wafer exchange→search alignment→fine alignment→exposure→wafer exchange.

The throughput THOR [sheets/hour] of such a projection exposure apparatus can be represented by the following expression (1) assuming that the wafer exchange time is T1, the search alignment time is T2, the fine alignment time is T3, and the exposure time is T4.

$$THOR=3600/(T1+T2+T3+T4) \quad (1)$$

The operations of T1 to T4 are executed repeatedly and successively (sequentially) as in T1→T2→T3→T4→T1 .... Accordingly, if the individual elements ranging from T1 to T4 involve high speeds, then the denominator is decreased, and the throughput THOR can be improved. However, as for T1 (wafer exchange time) and T2 (search alignment time), the effect of improvement is relatively small, because only one operation is performed for one sheet of wafer respectively. As for T3 (fine alignment time), the throughput can be improved if the sampling number of shots is decreased in the case of the use of the EGA system, or if the measurement time for a single shot is shortened. However, on the contrary, the alignment accuracy is deteriorated due to shortened T3. Therefore, it is impossible to easily shorten T3.

On the other hand, T4 (exposure time) includes the wafer exposure time and the stepping time for movement between the shots. For example, in the case of the scanning type projection exposure apparatus based on, for example, the step-and-scan system, it is necessary to increase the relative scanning velocity between the reticle and the wafer in an amount corresponding to the reduction of the wafer exposure time. However, it is not allowed to increase the scanning velocity without consideration because the synchronization accuracy is deteriorated.

With the apparatus using an off-axis alignment microscope, such as the projection exposure apparatus with the excimer laser light source which would be predominant in this field, it is not easy to improve the controllability of the stage. With this type of projection exposure apparatus, there is need to precisely control the position of the wafer stage, without Abbe's error, during exposure of the mask pattern through the projection optical system and during alignment, thereby to achieve highly precise superposition. For this purpose, it is necessary to set a constitution in which the measuring axis of the laser interferometer passes through the center of projection of the projection optical system and the center of detection of the alignment microscope. Furthermore, neither the measuring axis passing through the center of projection of the projection optical system nor the measuring axis passing through the center of detection of the alignment microscope should be interrupted in the moving range of the stage during exposure and in the moving range of the stage during alignment. To satisfy this requirement, the stage necessarily becomes large in size.

Important conditions for such a projection exposure apparatus other than those concerning the throughput described above include (1) the resolution, (2) the depth of focus (DOF: Depth of Focus), and (3) the line width control accuracy. Assuming that the exposure wavelength is $\lambda$, and the numerical aperture of the projection lens is N.A. (Numerical Aperture), the resolution R is proportional to $\lambda/N.A.$, and the depth of focus (DOF) is proportional to $\lambda/(N.A.)^2$.

Therefore, in order to improve the resolution R (in order to decrease the value of R), it is necessary to decrease the exposure wavelength $\lambda$, or it is necessary to increase the numerical aperture N.A. Especially, in recent years, semiconductor elements or the like have developed to have high densities, and the device rule is not more than 0.2 $\mu$m L/S (line and space). For this reason, a KrF excimer laser is used as an illumination light source in order to perform exposure for the pattern. However, as described above, the degree of integration of the semiconductor element will be necessarily increased in future. Accordingly, it is demanded to develop an apparatus provided with a light source having a wavelength shorter than that of KrF. Representative candidates for the next generation apparatus provided with the light source having the shorter wavelength as described above include, for example, an apparatus having a light source of ArF excimer laser, and an electron beam exposure apparatus.

However, the case of the ArF excimer laser involves numerous technical problems in that the light is scarcely transmitted through a place where oxygen exists, it is difficult to provide a high output, the service life of the laser is short, and the cost of the apparatus is expensive. The electron beam exposure apparatus is inconvenient in that the throughput is extremely low as compared with the light beam exposure apparatus. In reality, the development of the next generation machine, which is based on the principal viewpoint of the use of a short wavelength, does not proceed so well.

It is conceived to increase the numerical aperture N.A., as another method to increase the resolution R. However, if N.A. is increased, there is a demerit that DOF of the projection optical system is decreased. DOF can be roughly classified into UDOF (User Depth of Focus: a part to be used by user: for example, difference in level of pattern and resist thickness) and the overall focus difference of the apparatus itself. Up to now, UDOF has contributed to DOF in a greater degree. Therefore, the development of the exposure apparatus has been mainly directed to the policy to design those having a large DOF. Those practically used as the technique for increasing DOF include, for example, modified illumination.

By the way, in order to produce a device, it is necessary to form, on a wafer, a pattern obtained by combining, for example, L/S (line and space), isolated L (line), isolated S (space), and CH (contact hole). However, the exposure parameters for performing optimum exposure differ for every shape of the pattern such as L/S and isolated line described above. For this reason, a technique called ED-TREE (except for CH concerning a different reticle) has been hitherto used to determine, as a specification of the exposure apparatus, common exposure parameters (for example, coherence factor σ, N.A., exposure control accuracy, and reticle drawing accuracy) so that the resolution line width is within a predetermined allowable error with respect to a target value, and a predetermined DOF is obtained. However, it is considered that the following technical trend will appear in future.

(1) In accordance with the improvement in process technology (improvement in flatness on the wafer), the difference in pattern level will be progressively lowered, and the resist thickness will be progressively decreased. There will be a possibility that the UDOF may change from an order of 1 $\mu$m→0.4 $\mu$m.

(2) The exposure wavelength changes to be short, i.e., g-ray (436 nm)→i-ray (365 nm)→KrF (248 nm). However, investigation will be made for only a light source based on ArF (193) in future. Further technical hurdle is high. Thereafter, the progress will proceed to EB exposure.

(3) It is expected that the scanning exposure such as those based on the step-and-scan system will be predominantly used for the stepper, in place of the stationary exposure such as those based on the step-and-repeat system. The step-and-scan system makes it possible to perform exposure for a large field by using a projection optical system having a small diameter (especially in the scanning direction), in which it is easy to realize high N.A. corresponding thereto.

In the background of the technical trend as described above, the double exposure method is reevaluated as a method for improving the limiting resolution. Trial and investigation are made such that the double exposure method will be used for KrF exposure apparatus and ArF exposure apparatus in future to perform exposure up to those having 0.1 $\mu$m L/S. In general, the double exposure method is roughly classified into the following three methods.

(1) L/S's and isolated lines having different exposure parameters are formed on different reticles, and exposure is performed for each of them on an identical wafer under an optimum exposure condition.

(2) For example, when the phase shift method is introduced, L/S has a higher resolution at an identical DOF as compared with the isolated line. By utilizing this fact, all patterns are formed with L/S's by using the first reticle, and L/S's are curtailed for the second reticle to form the isolated lines.

(3) In general, when the isolated line is used, a high resolution can be obtained with a small N.A. as compared with L/S (however, DOF is decreased). Accordingly, all patterns are formed with isolated lines, and the isolated lines, which are formed by using the first and second reticles respectively, are combined to form L/S's. The double exposure method described above has two effects of improvement in resolution and improvement in DOF.

However, in the double exposure method, the exposure process must be performed several times by using a plurality of reticles. Therefore, inconveniences arise in that the exposure time (T4) is not less than two-fold as compared with the conventional apparatus, and the throughput is greatly deteriorated. For this reason, actually, the double exposure method has not been investigated so earnestly. The improvement in resolution and depth of focus (DOF) has been hitherto made by means of, for example, the use of an ultraviolet exposure wavelength, modified illumination, and phase shift reticle.

However, when the double exposure method described above is used for the KrF and ArF exposure apparatuses, it is possible to realize exposure with up to 0.1 $\mu$m L/S. Accordingly, it is doubtless that the double exposure method is a promising choice to develop the next generation machine aimed at mass-production of DRAM of 256 M and 1 G. Therefore, it has been expected to develop a new technique for improving the throughput which is a task of the double exposure method as a bottleneck for such a purpose.

In this context, if two or more operations of the four operations, i.e., the wafer exchange, the search alignment, the fine alignment, and the exposure operations can be concurrently processed in parallel, it may be possible to improve the throughput as compared with the case in which the four operations are sequentially performed. For this purpose, it is premised that a plurality of substrate stages are provided. The provision of a plurality of substrate stages is known, which may be considered to be easy from a theoretical viewpoint. However, there are numerous problems which should be solved in order to exhibit a sufficient effect. For example, if two substrate stages each having a size equivalent to those of presently used substrate stages are merely arranged and placed side by side, an inconvenience arises in that the installation area for the apparatus (so-called foot print) is remarkably increased, resulting in increase in cost of the clean room in which the exposure apparatus is placed. In order to realize highly accurate overlay, it is necessary to execute alignment for the sensitive substrate on an identical substrate stage, and then execute positional adjustment for the image of the pattern on the mask and the sensitive substrate by using a result of the alignment so that exposure is carried out. Therefore, for example, if one of the two substrate stages is merely exclusively used for exposure, and the other is merely exclusively used for alignment, there is no real countermeasure.

Further, there have been hitherto the following necessities. That is, when two operations are concurrently processed in parallel to one another while independently controlling movement of two substrate stages, then the movement should be controlled so that the both stages do not make contact with each other (prevention of interference), and the operation performed on one of the stages does not affect the operation performed on the other stage (prevention of disturbance).

Furthermore, in the case of the scanning type projection exposure apparatus, the order of exposure for respective shot areas on the wafer W is determined, for example, by respective parameters of (1) to (4), i.e., (1) acceleration and deceleration times during scanning, (2) adjustment time, (3) exposure time, and (4) stepping time to adjacent shot. However, in general, the acceleration and the deceleration of the reticle stage give the rate-determining condition. Therefore, it is most efficient that scanning is alternately performed for the reticle stage from one side to the other side and from the other side to one side in the scanning direction, in synchronization with which scanning is alternately performed for the wafer in the direction opposite to that for the reticle stage (for this purpose, the wafer is subjected to stepping in an amount corresponding to one shot after exposure for one shot).

However, when the conventional complete pre-measurement control described above is performed (for example, Japanese Laid-Open Patent Publication No. 6-283403), it has been difficult to perform exposure in the aforementioned most efficient order of exposure. That is, when a shot area in the vicinity of the center of the wafer is exposed, the complete pre-measurement control can be performed without any special problem. However, in the case of shot areas existing in the vicinity of the outer circumference of the wafer, and in the case of incomplete shots existing on the outer circumference, it is sometimes difficult to perform the complete pre-measurement control depending on the scanning direction for such shot areas. In the present circumstances, it is inevitable to direct the scanning direction from the inside to the outside of the wafer in order to perform complete pre-measurement. For this reason, the throughput has been consequently lowered.

Japanese Laid-Open Patent Publication No. 8-51069, corresponding to U.S. patent application Ser. No. 261,630 filed on Jun. 17, 1994, discloses a step-and-repeat apparatus comprising a plurality of wafer stations each of which comprises a wafer position observing and tracking apparatus. The apparatus is provided, as the wafer station, with an image-forming station and a characteristic measuring station, and each station has a chuck for holding the wafer thereon. On the characteristic measuring station, as inclination and a depth of a field is determined for each field of the wafer. The image-forming station is provided with an image-forming lens, and the image is printed on each field of the wafer on which the characteristic has been measured in the measuring characteristic station. To measure the characteristic and to form an image in these stations are performed in parallel. This publication discloses that therefore the throughput of this apparatus can be doubled compared with a conventional stepper which performs the measurement of characteristic and the formation of image in order. However, in this type of apparatus, in order that the data concerning the wafer collected on the measuring characteristic station are kept effective and accurate even after the wafer has been transferred to the image-forming station, the wafer must be monitored continuously with an interferometer.

The present invention has been made under the circumstances as described above, and a first object of the invention is to provide a projection exposure apparatus which makes it possible to further improve the throughput.

A second object of the invention is to provide a projection exposure method which makes it possible to further improve the throughput.

A third object of the invention is to provide a projection exposure apparatus which makes it possible to improve the throughput by concurrently processing, for example, the exposure operation and the alignment operation in parallel to one another, miniaturize a substrate stage, and reduce the weight of the substrate stage.

A fourth object of the invention is to provide a projection exposure method which makes it possible to improve the throughput, miniaturize a stage, and reduce the weight of the stage.

A fifth object of the invention is to provide a projection exposure apparatus which makes it possible to further improve the throughput and avoid any mutual influence of disturbance between the both stages.

A sixth object of the invention is to provide a projection exposure apparatus which makes it possible to further improve the throughput and avoid any mutual interference between the both stages.

A seventh object of the invention is to provide a projection exposure method which makes it possible to further improve the throughput and avoid any mutual influence of disturbance between the both stages.

An eighth object of the invention is to provide a projection exposure method which makes it possible to further improve the throughput and avoid any mutual interference between the both stages.

A ninth object of the invention is to provide a projection exposure apparatus which makes it possible to perform highly accurate focus/leveling control while further improving the throughput.

A tenth object of the invention is to provide a projection exposure method which makes it possible to perform highly accurate focus/leveling control while further improving the throughput.

An eleventh object of the invention is to provide a projection exposure method which makes it possible to perform highly accurate focus/leveling control while further improving the throughput even when EGA is performed for conducting positional adjustment with respect to a mask on the basis of an arrangement of sample shot areas.

A twelfth object of the invention is to provide a projection exposure apparatus which makes it possible to perform highly accurate focus/leveling control while further improving the throughput, such that focus information concerning those disposed at the inside, which has been impossible to be subjected to pre-measurement when shot areas in the vicinity of outer circumference of a sensitive substrate are exposed, is used as pre-measurement data for the focus control.

A thirteenth object of the invention is to provide a scanning exposure method which makes it possible to perform highly accurate focus/leveling control while further improving the throughput.

A fourteenth object of the invention is to provide an exposure method capable of improving throughput and determining the size of the substrate stage regardless of the baseline amount.

SUMMARY OF THE INVENTION

If a plurality of actions among the aforementioned three actions, i.e., wafer replacement (including search alignment), fine alignment and exposure, can be performed in parallel even partially, throughput may be improved compared with the sequential execution of these actions. The present invention has been devised in this view and for overcoming the inconveniences of the conventional art.

According to the first aspect of the present invention, there is provided an exposure apparatus for exposing a plurality of areas (SA) divided on a sensitive substrate (W1, W2) respectively with a predetermined pattern, the exposure apparatus comprising;

a plurality of stages (WS1, WS2), each holding a sensitive substrate (W1, W2) thereon, while moving independently between a positional information measuring section (PIS) wherein positional information of the respective divided areas on the sensitive substrate are measured and an exposure section (EPS). The measurement of the positional information on the respective divided areas (shot areas (SA)) on the sensitive substrate is performed on the positional information measuring section (PIS), while the exposure of the respective divided areas is performed on the exposure section (EPS). Since the measurement and the exposure are preformed in parallel, the throughput is remarkably improved compared to a conventional exposure apparatus wherein the process steps in these sections are performed sequentially. In order for the invention exposure apparatus to keep accurate the positional information, such as positions in a directions of X, Y and Z of each area, measured in the positional information measuring section, each stage (WS1, WS2) has a reference mark (MK1, MK2, MK3) for determining a relative position of each divided area on the sensitive substrate on the stage. The alignment of each divided area on the sensitive substrate is performed in the exposure section using the relative position of each divided area with respect to the reference mark measured in the positional information measuring section. Accordingly, it is sufficient for each of the position measuring system (such as interferometers) for measuring position of the stage positioned on the positional information measuring section and the position measuring system (such as interferometers) for measuring position of the stage positioned on the exposure section, to independently measure the stage position only in one section. It is not necessary for one of the position measuring systems to monitor the position of one stage during the movement of the stage between the two sections. Further, there is no need to transmit data between the position measuring systems.

The exposure apparatus further may comprise positional information detecting systems in the positional information measuring section and the exposing section, respectively. The positional information detecting systems may measure or determine the position of each divided area of the sensitive substrate with respect to the reference mark. When the exposure apparatus is a projection exposure apparatus, the positional information detecting system in the positional information measuring section may an alignment system (24a, 24b) and a detection system (130) for detecting the position of the surface of the sensitive substrate, and the positional information detecting system in the exposure section may be a detector for detecting the marks through the projection optical system. The exposure apparatus may further comprise a storing apparatus (91) for storing positional information of each divided area on the sensitive substrate which has been determined in the positional information measuring section.

According to the second aspect of the present invention, there is provided a projection exposure apparatus for exposing a sensitive substrate (W1, W2) by projecting a pattern formed on a mask (R) through a projection optical system (PL) onto the sensitive substrates, characterized by having:

a first substrate stage (WS1) which is movable on a two-dimensional plane while holding a sensitive substrate (W1), the first substrate stage having a reference mark formed thereon;

a second substrate stage (WS2) which is movable independently from the first substrate stage (WS1) on the same plane as that for the first (W2), the second substrate stage having a reference mark formed thereon;

at least one mark detecting system (for example, 24a) provided apart from the projection optical system (PL), for detecting reference mark on the substrate stage (WS1, WS2) or a mark on the sensitive substrate (WS1, WS2) held on the substrate stage (WS1, WS2); and a controller (90) for controlling operations of the both stages (WS1, WS2) so that one of the first and second substrate stages (WS1 and WS2) performs a mark-detecting operation effected by the mark detecting system (24a), while the other stage (WS2 or WS1) performs an exposure operation.

According to the projection exposure apparatus, the controller controls the operations of the both stages (WS1, WS2) so that the one of the stages of the first substrate stage and the second substrate stage performs the mark-detecting operation effected by the mark detecting system, during which the exposure operation is performed on the other stage. Accordingly, the detecting operation for the mark on the sensitive substrate held on the one substrate stage can be processed concurrently with the exposure operation for the sensitive substrate held on the other substrate stage. Therefore, the operation corresponding to the time T2 and the time T3 explained above can be processed concurrently with the operation corresponding to the time T4. Thus, it is possible to improve the throughput as compared with the conventional sequential process which requires the time (T1+T2+T3+T4).

In this projection exposure apparatus, it is still more desirable that when the projection exposure apparatus further comprises a transport system (180 to 200) for delivering the sensitive substrate (W1, W2) with respect to the first and second substrate stages (WS1 and WS2), then the controller (90) controls the operations of the both stages (WS1, WS2) so that one of the substrate stages (WS1 or WS2) performs the delivery of the sensitive substrates with respect to the transport system (180 to 200) and the mark-detecting operation effected by the mark detecting system (24a), during which the other state (WS2 or WS1) performs the exposure operation effected by the projection optical system (PL). In such an arrangement, the operation corresponding to the time T1, the time T2, and the time T3 explained above can be performed by the one substrate state, and the operation corresponding to the time T4 can be performed by the other substrate stage. Accordingly, it is possible to further improve the throughput.

In the projection exposure apparatus, at least one mark detecting system such as alignment system may be provided separately from the projection optical system. However, for example, when two mark detecting systems are provided separately from the projection optical system, it is also preferable, that the two mark detecting systems (24a, 24b) are arranged on both sides of the projection optical system (PL) along a predetermined direction; and the controller (90) is operated such that the reference mark on the first substrate stage (WS1) or the mark on the sensitive substrate (W1) held on the first substrate stage (WS1) is detected by using the one mark detecting system (24a), and the reference mark on the second substrate stage WS2) or the mark on the sensitive substrate (W2) held on the second substrate state (WS2) is detected by using the other mark detecting system (24b). In this embodiment as described above, the sensitive substrate on the one substrate stage may be exposed by using the projection optical system located at the center (exposure operation), during which the sensitive substrate on the other substrate stage may be subjected to the mark detection by using the one mark detecting system (alignment operation). When the exposure operation is changed to the mark detecting operation, then the one substrate stage having been located under the projection optical system can be easily moved to the position of the other mark detecting system, and the other substrate stage having been located at the position of the one mark detecting system can be easily moved to the position under the projection optical system, only by moving the two substrate stages along the predetermined direction toward the other mark detecting system. By doing so, it is possible to alternately use the two mark detecting systems.

According to the third aspect of the present invention, there is provided a projection exposure method for exposing a, sensitive substrate (W1, W2) by projecting a pattern formed on a mask (R) through a projection optical system (PL) onto the sensitive substrates, characterized by:

preparing two substrates stages (WS1, WS2) each of which is movable independently on a two-dimensional plane while holding a sensitive substrate (W1, W2); and performing, by using one stage (WS1 or WS2) of the two substrate stages (WS1, WS2), at least one of an exchange operation for the sensitive substrate and a detecting operation for a mark on the one stage or on the sensitive substrate held on the one stage, while executing an exposure operation for the sensitive substrate by using the other stage (WS2 or WS1) of the two substrate stages.

According to the projection exposure method, at least one of the operation corresponding to the time T1 and the operation corresponding to the time (T2+T3) explained above is performed on the one substrate stage, during which the operation corresponding to the time T4 is performed on the other substrate stage concurrently therewith. Accordingly, it is possible to improve the throughput as compared with the conventional sequential process which requires the time (T1+T2+T3+T4). Especially, when the operation corresponding to the time (T1+T2+T3) is performed by the one stage, during which that operation corresponding to the time T4 is performed by the other stage concurrently therewith, then it is possible to further improve the throughput.

In this aspect, the respective operations performed on the two substrate stage are not necessarily completed at the same time. However, it is also preferable that the operations of the two substrate stages are changed to one another at a point of time of completion of the operations of the two substrate stages. Accordingly, among the two stages, one stage, on which the operation is completed earlier, is subjected to a waiting mode, and the operations are changed to one another at the point of time of completion of the operation of the other stages. The waiting time may behave as a factor to lower the throughput. Therefore, it is desirable that the contents of the operations concurrently processed on the two substrate stages are divided so that the waiting time is decreased as short as possible.

According to the fourth aspect of the present invention, there is provided a method for exposing a sensitive substrate (W) by projecting a pattern formed on a mask (R) through a projection optical system (PL) onto the sensitive substrates, characterized by:

preparing two substrate stages (WS1, WS2) independently movable in the same plane while each holding a sensitive substrate (W);

exposing the sensitive substrate (W) held on one of the two substrate stages (WS1 or WS2) with the pattern image of the mask (R) through the projection optical system (PL);

measuring the positional relation between an alignment mark on the sensitive substrate (W) held on the other of the two substrate stages (WS2 or WS1) and a reference point on the other stage (WS2 or WS1) during exposure of the sensitive substrate (W) held on the one substrate stages (WS1 or WS2);

detecting the positional deviation of the reference point on the other substrate stage from a predetermined reference point in a projection area of the projection optical system and the coordinate position of the other substrate stage, with the reference point on the other substrate stage being positioned in the projection area, after completion of exposure of the sensitive substrate held on the one substrate stage; and controlling the movement of the other substrate stage on the basis of the detected positional relation, the detected positional deviation and the detected coordinate position to perform alignment between the sensitive substrate held on the other stage and the pattern image of the mask.

According to the projection exposure method, while the sensitive substrate (W) held on the one substrate stage (WS1 or WS2) of the two substrate stages (WS1, WS2) is being exposed with the pattern image of the mask (R) through the projection optical system (PL), ① the positional relation between the alignment mark on the sensitive substrate (W) held on the other substrate stage (WS2 or WS1) of the two substrate stages and the reference point on the other stage (WS2 or WS1) is measured. As noted from this, the exposure action on the one substrate stage side and the alignment action on the other substrate stage side (measurement of the positional relation between the alignment mark on the sensitive substrate held on the other substrate stage and the reference point on the other substrate stage) can be performed in parallel. Thus, throughput can be improved in comparison with conventional technologies by which these actions were performed sequentially.

After exposure of sensitive substrate held on the one substrate stage, ② the positional deviation of the reference point on the other substrate stage from the predetermined reference point in the projection area of the projection optical system (PL) and ③ the coordinate position of the other substrate stage at the time of detecting the positional deviation are detected, with the reference point on the other substrate stage (WS2 or WS1) being positioned in the projection area. Then, the movement of the other substrate stage (WS2 or WS1) is controlled on the basis of the detected positional relation ①, the detected positional deviation ② and the detected coordinate position ③ to perform alignment between the sensitive substrate held on the other stage and the pattern image of the mask.

Thus, it presents no disadvantages whether the interferometer (or coordinate system) for managing the position of the substrate stage at the time of detecting the positional relation ① between the predetermined reference point on the other substrate stage and the alignment mark on the sensitive substrate is the same as or different from the interferometer (or coordinate system) for managing the position of the stage during the detection of the positional deviation ② and during the detection of the coordinate position of the substrate stage ③. Regardless of whether these two interferometers are different, the alignment of the pattern image of the mask with the sensitive substrate placed on the other substrate stage can be performed highly accurately. This means that there is no need to successively measure the positions of the stage by one interferometer during the alignment operation, the movement operation from an alignment position to the exposure position and the exposure operation.

Thus, when an off-axis alignment system (a detector for detecting an alignment mark is not directly below the projection optical system) is used as a mark detection system for detecting the alignment mark, for example, it becomes unnecessary to measure the positional relation between the predetermined reference point in the projection area of the projection optical system (the center of projection of the pattern image of the mask) and the center of detection of the alignment system, that is, unnecessary to measure the baseline amount. As a result, whatever distance exists between the projection optical system and the alignment system produces no disadvantage. Thus, the size of the substrate stage can be design irrespective of the baseline amount. Even if the substrate stage becomes small in size or light in weight, no disadvantage will emerge, and mark position measurement and pattern projection by exposure through surface of the sensitive substrate. In this case, no influence of changes in the baseline amount is exerted.

According to the fifth aspect of the present invention, there is provided a projection exposure apparatus for exposing a sensitive substrate (W) by projecting a pattern through a projection optical) system (PL) onto the sensitive substrates, comprising:

a first substrate stage (WS1), on which a reference mark is formed, moving in a two-dimensional plane while holding a sensitive substrate (W);

a second substrate stage (SW2), on which a reference mark is formed, moving in the same plane in which the first substrate stage (WS1) moves independently of the first substrate stage (WS1) while holding a sensitive substrate (W);

a mark detecting system (WA), provided apart from the projection optical system (PL), for detecting the reference mark on the substrate stage (WS1, WS2) or a mark on the sensitive substrate (W) held on the stage;

an interferometer system (26) for measuring the two-dimensional positions of the first substrate stage and the second substrate stage;

a moving device (201, 22) for moving each stage between a predetermined first position in a stage moving range during exposure during which the sensitive substrate held on the stage is exposed through the projection optical system, and a predetermined second position in a stage moving range during mark detecting during which the mark on the stage or the mark on the sensitive substrate held on the stage is detected by the mark detecting system; and controller (28) for controlling the actions of the first substrate stage and the second substrate stage while monitoring the measured values of the interferometer system (26) so that during exposure of the sensitive substrate held on one of the first substrate stage and the second substrate stage, a mark detecting action by the mark detecting system (WA) is performed on the other of the first substrate stage and the second substrate stage, and then controlling the moving device (201, 22) to interchange the positions of the one substrate stage and the other substrate stage.

According to the above constitution, the controller (28) controls the actions of the two stages while monitoring the measured values of the interferometer system (26) so that during exposure of the sensitive substrate held on one stage of the two stages, a mark detecting action by the mark detecting system (for example, an alignment system) (WA) is performed on the other stage, and then controls the moving device (201, 221) to interchange the position of the one stage with the position of the other stage. This parallel execution of the exposure action on the one stage side and the alignment action on the other stage side enables throughput to be improved. Also, if the sensitive substrate is replaced on the substrate stage at the second position after interchange of the positions, actions of the two stages are interchanged, whereby during exposure of the sensitive substrate held on the other stage, a mark detecting action by marking detecting system (for example, the alignment system) (WA) can be performed on the one stage.

According to the projection exposure apparatus, the interferometer system (26) may has the first measuring axis (Xe) and the second measuring axis (Ye) intersecting each other perpendicularly at the center of projection of the projection optical system (PL), and the third measuring axis (Xa) and the fourth measuring axis (Ya) intersecting each other perpendicularly at the center of detection of the mark detecting system (WA). It is desirable that the controller (28) resets the measuring axes (Xe, Ye, Xa, Ya) of the interferometer system (26) in interchanging the positions of the one stage and the other stage. By means of constituting the interferometer system and the controller in this manner, since the interferometer system (26) has the first measuring axis (Xe) and the second measuring axis (Ye) intersecting each other perpendicularly at the center of projection of the projection optical system (PL), and the third measuring axis (Xa) and the fourth measuring axis (Ya) intersecting each other perpendicularly center of detection of the mark detecting system (alignment system) (WA), the position of the substrate stages (WS1, WS2) can be managed precisely without Abbe's error both during exposure of the sensitive substrate with the pattern through the projection optical system and during detection of the position detecting mark by the mark detecting system. Furthermore, the controller (28) resets the measuring axes (Xe, Ye, Xa, Ya) of the interferometer system (26) in interchanging the positions of the one stage and the other stage. During positions interchange, the measuring axes of the interferometer system that has managed the positions of the substrate stages until then may be interrupted. Even in this case, it suffices to predetermine the positions at which to reset the measuring axes (Xe, Ye, Xa, Ya) of the interferometer system (26). After resetting, the positions of the first and second substrate stages can be managed using the measured values of the reset measuring axes.

According to the sixth aspect of the present invention, there is provided an exposure apparatus for exposing a sensitive substrates (W) by projecting a pattern on the sensitive substrate through a projection optical system (PL) comprising:

a first substrate stage (WS1), on which a reference mark is formed, for moving in a two-dimensional plane while holding a sensitive substrate (W);

a second substrate stage (WS2), on which a reference mark is formed, for moving in the same plane in which the first substrate stage (WS1) independently of the first substrate stage while holding a sensitive substrate (W);

a mark detecting system (WA) provided apart from the projection optical system (PL), for detecting the reference mark formed on the substrate stage or an alignment mark on the sensitive substrate held on the stage;

an interferometer system (26) for measuring the two-dimensional positions of the first substrate stage and the second substrate stage;

a moving device (201, 221) for moving each stage among three locations, i.e., a predetermined first position in a stage moving range during exposure during which the sensitive substrate (W) held on the stage is exposed through the projection optical system (PL), a predetermined second position in a stage moving range during alignment during which the mark on the stage or the mark on the sensitive substrate held on the stage is detected by the mark detecting system (WA), and a third position at which the sensitive substrate is passed on between the stage and an external substrate carrier mechanism; and controller (28) for controlling the first and second substrate stages (WS1, WS2) and the moving devices (201, 221) so that while the position of one of the first (WS1) and second (WS2) substrate stages is being managed by the interferometer system (26) and the sensitive substrate (W) held on the one stage is being exposed with the pattern through the projection optical system (PL), the replacement of the sensitive substrate (W), and an alignment action for measuring the positional relation between the alignment mark on the sensitive substrate (W) and a reference mark on the other stage based on the results of detection by the mark detecting system (WA) and the measured values by the interferometer system (26) are sequentially performed on the other of the first and second substrate stages; and for controlling the two stages and the moving device so that after the actions on the two stages are both completed, the actions to be performed on the two stages are interchanged.

According to the exposure apparatus, the controller controls the two substrate stages (WS1, WS2) and the moving device (201, 221) so that while the position of the one substrate stage is being managed by the interferometer system and the sensitive substrate held on the one substrate stage is being exposed with the pattern through the projection optical system , the replacement of the sensitive substrate (W), and an alignment action for measuring the positional relation between the alignment mark on the sensitive substrate (W) after replacement and the reference mark on the other stage based on the detection results of the mark detecting system (WA) and the measured values by the interferometer system (26) are sequentially performed on the other substrate stage. Since the exposure action on the one substrate stage side and the replacement of the sensitive substrate as well as the alignment action on the other stage side are thus performed in parallel, throughput can be further improved. In this case, the sensitive substrate is replaced at the third position different from the first or second position. Since this position of replacement is different from the positions of the mark detecting system(for example, an alignment system) and the projection optical system, the disadvantage that the mark detecting system and the projection optical system impede the replacement of the sensitive substrate does not occur.

The controller also controls the two stages and the moving device so that after the actions of the two stages are both completed, the actions to be performed on the two stages are interchanged. Thus, after completion of the actions on the two stages, the sensitive substrate held on the other stage is exposed successively, and during this exposure, the mark detecting action by the mark detecting system (WA) can be performed on the one stage in parallel.

In this case, an electronic lens barrel, for example, may be used as the projection optical system, and the pattern may be directly drawn on the sensitive substrate with an electron beam. However, a mask (R) with the pattern formed thereon may be further provided, and the pattern image formed on the mask (R) via the projection optical system (PL) may be projected onto the sensitive substrates (W) on the first substrate stage (WSI) and the second substrate stage (WS2).

In the exposure apparatus of the invention, it is desirable that the interferometer system (26) has a first measuring axis (Xe) and a second measuring axis (Ye) intersecting each other perpendicularly at the center of projection of the projection optical system (PL), and a third intersecting each other perpendicularly at the center of detection of the mark detecting system (WA), and the controller (28) resets the first and second measuring axes (Xe and Ye) of the interferometer system (26) in moving each of the two stages (WS1, WS2) to the first position, and resets the third and fourth measuring axes (Xa and Ya) of the interferometer system (26) in moving each of the two stages (WS1, WS2) to the second position.

By means of constituting the interferometer and the controller, since the interferometer system (26) has the first measuring axis (Xe) and the second measuring axis (Ye) intersecting each other perpendicularly at the center of projection of the projection optical system (PL), and the third measuring axis (Xa) and the fourth measuring axis (Ya) intersecting each other perpendicularly at the center of detection of the mark detecting system (WA), the position of the substrate stages (WS1, WS2) can be managed precisely without Abbe's error both during exposure of the sensitive substrate wire the pattern through the projection optical system and during detection of the position detecting mark by the mark detecting system. Furthermore, the controller (28) resets the first and second measuring axes (Xe and Ya) of the interferometer system (26) in moving each of the two stages (WS1, WS2) to the first position, and resets the third and fourth measuring axes (Xa and Ya) of the interferometer system (26) in moving each of the two stages (WS1, WS2) to the second position. Thus, prior to the start of exposure and the start of aligning measurement for each substrate stage, it is possible to reset the measuring axes that are required for the respective actions. Until then, the measuring axes of the interferometer system that has managed the positions of the respective substrate stages may be interrupted. After resetting, however, the positions of the two stages at the time of exposure and alignment can be managed using the measured values of the reset measuring axes.

In the exposure apparatus of the invention, it is desirable to further provide mark position detector (52A, 52B) for detecting the relative positional relation between the center of projection of the pattern image of the mask (R) formed by the projection optical system and the reference mark on the stage via the mask (R) and the projection optical system (PL). By so doing, the positional relation between the center of projection of the pattern image of the mask (R) and the reference mark on the substrate stage can be detected by the mark position detector (52A, 52B) via the mask (R) and the projection optical system (PL) when the substrate stages (WS1, WS2) are positioned at a position at which the positional relation between the predetermined reference mark on the substrate stage and the center of projection of the mask pattern image can be detected in the projection are a of the projection optical system (PL). In this case, it is desirable that the position at which the positional relation between the predetermined reference mark on the substrate stage and the center of projection of the mask pattern image can be detected in the projection area of the projection optical system (PL) be set as the first position, and the first and second measuring axes be reset at this position.

In the exposure apparatus, each of the substrate stages (WS1, WS2) may have a stage body (WS1*a*, WS2*a*), and a substrate holding member (WS1b, WS2b) detachably mounted on the body (WS1a, WS2a) for holding the substrate, a reflecting surface for an interferometer may be provided on the side surface of the substrate holding member (WS1b, WS2b), and a reference mark (WM, RM) may be formed on the upper surface of the surface holding member. When the exposure apparatus has such constitutions, the moving device (201, 221) may move the substrate holding member among the respective locations mentioned earlier instead of the substrate stage.

In the above cases, the moving device may be of any type which moves the substrate stage or the substrate holding member among the three locations, i.e., the first positions, the second position and the third position for between the first and second positions), without monitoring the measured values by the interferometer. For instance, the moving device may be composed of a robot arm (201, 221).

In the exposure apparatus, a fixed mirror serving as a reference for measurement by the interferometer may be located at any place. Fixed mirrors (14X, 14Y; 18X, 18Y) serving as a reference for measurement by the interferometer may be attached to the projection optical system (PL) and the mark detecting system (WA), respectively. In this case, compared with the fixed mirrors existing at other places, an error minimally occurs in the results of measurement under the influence of positional changes of the fixed mirrors over time or the influence of positional changes of the fixed mirrors associated with vibrations of the apparatus.

n the exposure apparatus, only two stages, the first substrate stage and the second substrate stage, are provided. However, at least one other substrate stage movable independently of the two substrate stages in the same plane as for these stages while holding a sensitive substrate may be further provided in addition to the first substrate stage (WS1) and the second substrate stage (WS2).

According to the seventh aspect of the present invention, there is provided a projection exposure apparatus for exposing a plurality of shot areas divided on a sensitive substrate (W1, W2) by projecting an image of a pattern formed on a mask (R) via a projection optical system (PL) onto each of the shot areas, characterized by comprising:

a first substrate stage (WS1) which is movable on a two dimensional plane while holding a sensitive substrate (W1;

a second substrate stage (WS2) which is movable independently from the first substrate stage (WS1) on the same plane as that for the first substrate stage (WS1 while holding a sensitive substrate (W2);

a positional information detecting system (for example, 24a, 130) for detecting the positional information of at least one shot area of the sensitive substrate (W1 or W2) held on the substrate stage (WS1 or WS2) provided apart from the projection optical system (PL);

substrate-driving system (LS) provided for the first substrate stage (WS1) and the second substrate stage (WS2) respectively, for adjusting surface positions of the sensitive substrate (W1 or W2) held on the stages (WS1 or WS2); and a controller (90) for controlling the two stages (WS1, WS2) so that a positional information detecting operation based on the use of the positional information detecting system (24a, 130) is performed for one stage (for example, WS1) of the first substrate stage (WS1) and the second substrate stage (WS2), during which an exposure operation based on the use of the projection optical system (PL) is performed for the other of the stages (for example WS2), thereafter controlling one of the stages (WS1) so that the exposure operation based on the use of the projection optical system (PL) is performed for the one of the stages (WS1), and controlling the substrate-driving system (LS1) for the one of the stages (WS1) to perform an alignment of the shot area in exposure, using information on a surface position of the shot area resulted from the positional information detection.

According to the exposure apparatus, the two stages are controlled by the controller so that the detection of positional information based on the use of the positional information detecting system is performed for one of the stages of the first substrate stage and the second substrate stage, during which the exposure operation is performed by using the projection optical system for the other of the stages. Accordingly, the mark-measuring operation for the one of the stages is processed concurrently in parallel to the exposure operation for the other of the stages. Thus, it is possible to contemplate improvement in throughput as compared with the conventional technique in which these operations have been sequentially performed. Further, after completion of the concurrent process of the mark-measuring operation for one of the stages and the exposure operation for the other stage, the controller controls the one of the stages so that the exposure operation based on the use of the projection optical system is performed for the one of the stages, and the controller controls the substrate-driving system for the one of the stages on the basis of the detection result obtained by using information of the surface position of the shot area during the detection of the positional information for the one of the stages. Accordingly, during the exposure operation for the one of the stages, the substrate-driving system for the one of the stages is controlled using the surface position (z-directional position) obtained during the detection of the positional information so that the surface position of the sensitive substrate can be quickly driven into a position near to the image formation plane of the projection optical system.

In the exposure apparatus, the positional information detection system may comprise at least one alignment system (24a) for measuring a mark on the sensitive substrate held on the substrate stage and a first detecting system (130) for detecting positional information of a surface of the sensitive substrate during measurement operation of the mark based on the use of the alignment system. Further, the positional information detecting system may be provided with a second detecting system (132) for detecting position information of a surface of the sensitive substrate during exposure operation based on the use of the projection optical system. The controller (90) may control the two stages so that the detection by using the positional information detecting system for one of the stages of the first substrate stage and the second substrate stage is performed, during which the exposure operation based on the use of the projection optical system is performed for the other of the stages. After that, the controller may control the one of the stages so that the exposure operation based on the use of the projection optical system is performed for the one of the stages. And also, the controller may control the substrate-driving system (LS) for the one stage on the basis of the detection result obtained by using the first detecting system during the mark-measuring operation for the one stage and the detection result obtained by using the second detecting system during the exposure operation for the one stage to perform an alignment in the exposure of the shot area. The substrate-driving system can be further adjusted finely on the basis of the detection result obtained by using the second detecting system so that the surface of the sensitive substrate coincides with the image formation plane. Therefore, it is possible to perform quick and highly accurate focus/leveling control.

It is desirable that the projection exposure apparatus is a scanning type projection exposure apparatus (for example, a step-and-scan type exposure apparatus) for exposing sensitive substrates with an image of a pattern formed on a mask (R) by moving the sensitive substrate in a scanning direction with respect to an exposure area (IF) which is conjugate to an illumination area (IA) illuminated with an illumination light beam, in synchronization with movement of the mask in the scanning direction with respect to the illumination area. In this case, the controller (90) controls the two stages so that the detection by using the positional information detecting system for one stage of the first substrate stage and the second substrate stage is performed, during which the exposure operation based on the use of the projection optical system is performed for the other of the stages. After that, when the one stage is controlled so that the exposure operation based on the use of the projection optical system is performed for the one stage, upon exposure for shot areas in the vicinity of outer circumference which are set to be subjected to scanning from the outside to the inside of the sensitive substrate with respect to the exposure area (IF), of a plurality of shot areas on the sensitive substrate held on the one of the stages, the controller may control the substrate-driving system (LS) on the basis of a detection result obtained by using the first detecting system (130) during detecting the positional information of the one stage (WS1) and a detection result obtained by using the second detecting system (132) during the exposure operation for the one stage. And, the controller may control the substrate-driving system (LS) for the one stage by using only the detection result obtained by using the second detecting system (132) upon exposure for the other shot areas than the shot areas in the vicinity of outer circumstance to perform an alignment in the exposure of the shot area. In this case, when the shot areas in the vicinity of the outer circumference, which are set to be subjected to scanning from the outside to the inside of the sensitive substrate, concerning the exposure area for which information on the surface position of the sensitive substrate during exposure for the previous shot is not obtained, are exposed during the exposure operation for the one stage, the substrate-driving system for the one stage can be controlled on the basis of the detection result obtained by using the first detecting system during the mark-measuring operation for the one stage to drive the surface position of the sensitive substrate into the position near to the image formation plane of the projection optical system. Further, the substrate-driving system can be further adjusted finely on the basis of the detection result obtained by using the second detecting system so that the surface of the sensitive substrate coincides with the image formation plane. On the contrary, upon exposure for shot areas other than the above, for which information on the surface position of the sensitive substrate during exposure for the previous shot is obtained, the substrate-driving system for the one stage is controlled on the basis of the information on the surface position of the sensitive substrate during exposure for the previous shot prior to the start of exposure for the exposure-objective shot area so that the surface position of the sensitive substrate is quickly driven into the position near to the image formation plane of the projection optical system, followed by performing the adjustment for the surface position ("focus/leveling" adjustment) of the sensitive substrate by using only the detection result obtained by using the second detecting system during exposure. Therefore, it is possible to perform quick and highly accurate focus/leveling control in any exposure of shot area.

According to the eighth aspect of the present invention, there is provided a projection exposure method for exposing sensitive substrates (W1 or W2) with an image of a pattern formed on a mask (R) via a projection optical system (PL), comprising the steps of:

preparing two substrate stages (WS1, WS2) which is movable independently on an identical two-dimensional plane while each holding a sensitive substrate (W1 or W2);

measuring positional information of at least one shot area on the sensitive substrate (for example, W1) held on one stage (for example, WS1) of the two stages (WS1, WS2);

exposing the sensitive substrate (W2) held on the other stage (WS2) of the two stages (WS1, WS2) with the image of the pattern formed on the mask (R) during the period in which the measuring operation for the positional information is performed for the one of the stages (WS1); and exposing the sensitive substrate held on the one of the stages (WS1), after completion of the exposure operation performed for the other of the stages (WS2), while adjusting a surface position of the sensitive substrate (W1) held on the one of the stages (WS1) on the basis of the measured positional information.

According to the exposing method, for example, in one stage, the mark-measuring operation for an alignment mark of sensitive substrate and detection of positional information such as the relative position with respect to the predetermined reference plane of the sensitive substrate are performed for one stage of the two stages, during which, in parallel thereto, the sensitive substrate held on the other stage of the two stages is exposed with the image of the pattern on the mask. Accordingly, owing to the concurrent and parallel process of the mark-measuring operation for the one stage and the exposure operation for the other stage, it is possible to contemplate improvement in throughput as compared with the conventional technique in which these operations have been performed in a sequential manner. After completion of the exposure operation for the other stage, namely after completion of the concurrent operations on the two stages, the sensitive substrate held on the one stage is subjected to exposure. During the exposure, the surface position of the sensitive substrate held on the one stage is adjusted using information on the surface position of the shot area of the sensitive substrate held on the one stage detected previously, with respect to the predetermined reference plane. Accordingly, during the exposure operation effected for the one stage, the surface position of the sensitive substrate held on the one stage can be quickly driven into a position near to the image formation plane of the projection optical system on the basis of the information on the surface position previously detected. Therefore, it is possible to perform quick and highly accurate focus/leveling control.

According to the ninth aspect of the present invention, there is provided a projection exposure apparatus for exposing a sensitive substrate (W1, W2) by projecting an image of a pattern formed on a mask (R) via a projection optical system (PL) onto the sensitive substrates, characterized by comprising:

a first substrate stage (WS1) on which a reference mark is formed, for moving in a two-dimensional plane while holding a sensitive substrate (W1);

a second substrate stage (WS2) on which a reference mark is formed, for moving in the same plane as for the first substrate stage (WS1) independently of the first substrate stage (WS1) while holding a sensitive substrate (W2);

at least one a mark detecting system (24a) provided apart from the projection optical system (PL), for detecting the reference mark on the substrate stage (WS1, WS2) or an alignment mark on the sensitive substrate (W1, W2), held on the substrate stage (WS1, WS2);

an interferometer system provided with a first length-measuring axis (BI1X) for measuring a position of the first substrate stage (WS1) in a direction of a first axis from one side in the direction of the first axis passing through a projection center of the projection optical system (PL) and a detection center of the mark detecting system (24a), a second length-measuring axis (BI2X) for measuring a position of the second substrate stage (WS2) in the direction of the first axis from the other side in the direction of the first axis, a third length-measuring axis (BI3Y) which perpendicularly intersects the first axis at the projection center of the projection optical system (PL), and a fourth length-measuring axis (BI4Y) which perpendicularly intersects the first axis at the detection center of the mark detecting system (24a), the interferometer system measuring two-dimensional positions of the first and second substrate stages (WS1 and WS2) respectively by using the length-measuring axes (BI1X to BI4Y).

According to the projection exposure apparatus, the sensitive substrates are held on the first and second substrate stages respectively to be independently movable on the two-dimensional plane. The mark detecting system such as an alignment system, which are provided apart from the projection optical system, are used to detect the reference mark on the substrate stage and/or the mark on the sensitive substrate held on the substrate stage. The two-dimensional positions of the first and second substrate stages are measured by using the first to fourth length-measuring axes of the interferometer system respectively. As for the length-measuring axes of the interferometer system, the first length-measuring axis and the second length-measuring axis are provided on one side and the other side of the first and second substrate stages respectively along the direction of the first axis passing through the projection center of the projection optical system and the detection center of the mark detecting system. The first length-measuring axis is used to measure the position of the first substrate stage in the direction of the first axis, and the second length-measuring axis is used to measure the position of the second substrate stage in the direction of the first axis. The third length-measuring axis is provided so that it perpendicularly intersects the first axis at the projection center of the projection optical system. The fourth length-measuring axis is provided so that it perpendicularly intersects the first axis at the detection center of the mark detecting system. Accordingly, the reference marks formed on the two substrate stages can be detected by using the mark detecting system. During the mark detection, the two-dimensional position of the first substrate stage is measured by using the interferometers having the first length-measuring axis and the fourth length-measuring axis which mutually intersect perpendicularly at the detection center of the mark detecting system, and the two-dimensional position of the second substrate stage is measured by using the interferometers having the second length-measuring axis and the fourth length-measuring axis which mutually intersect perpendicularly at the detection center of the mark detecting system. Therefore, the position of any of the stages is accurately measured without any Abbe error.

On the other hand, during the exposure for the mark pattern effected by the projection optical system, the two-dimensional position of the first substrate stage is measured by using the interferometers having the first length-measuring axis and the third length-measuring axis which mutually intersect perpendicularly at the projection center of the projection optical system, and the two-dimensional position of the second substrate stage is measured by using the interferometers having the second length-measuring axis and the third length-measuring axis which mutually intersect perpendicularly at the projection center. Therefore, the position of any of the stages is accurately measured without any Abbe error. Especially, the first length-measuring axis and the second length-measuring axis are arranged in the positional relationship as described above. Accordingly, the length-measuring axis is not intercepted during the period in which the first substrate stage and the second substrate stage are moved in the direction of the first axis. Therefore, the two substrate stages can be moved and reciprocated between the mark detecting system and the projection optical system on the basis of the measured values obtained by using the interferometers having these length-measuring axes. For example, the second substrate stage can be located under the projection optical system during the period in which the first substrate stage is disposed under the mark detecting system. Accordingly, it is possible to concurrently process the exposure operation effected by the projection optical system and the position-detecting operation effected by the mark detecting system for the marks on the respective substrate stages or the marks on the sensitive substrates in parallel to one another. As a result, it is possible to improve the throughput.

The projection exposure apparatus further may be provided with a controller (90) for controlling the first substrate stage and the second substrate stage (WS1, WS2), so that a position of one stage of the first substrate stage and the second substrate stage is managed based on the use of a measured value obtained by using the third length-measuring axis (BI3Y) of the interferometer system, while exposing the sensitive substrate on the one stage, during which a positional relationship between an alignment mark on the sensitive substrate held on the other stage and a reference mark (MK) on the other stage is obtained based on the use of a detection result obtained by using the mark detecting system and a measured value obtained by using the fourth length-measuring axis (BI4Y) of the interferometer system, and after exposing the one sensitive substrate, a position of the other stage is measured by using the third length-measuring axis (BI3Y), while a relative positional relationship between the reference mark on the other stage and a predetermined reference point within a projection area of the projection optical system is obtained.

The controller controls the operations of the two substrate stages as follows. That is, for example, the position of the first substrate stage is managed based on the use of the measured value obtained by using the third length-measuring axis of the interferometer system. During the period in which the sensitive substrate held on the first substrate stage is exposed, the positional relationship between the alignment mark on the sensitive substrate held on the second substrate stage and the reference mark on the second substrate stage is detected by using the detection result obtained by the mark detecting system and the measured value by using the fourth length-measuring axis of the interferometer system. Further, the controller measures the position of the second substrate stage based on the use of the measured value obtained by using the third length-measuring axis, while controlling the second substrate stage so that it moves to a position at which a positional relationship between a reference mark on the second substrate stage and a predetermined reference point within a projection area of the projection optical system such as the projection center to obtain the positional relationship thereof. That is, the controller is capable of controlling the operations of the two stages as follows. The position of the first stage is managed without any Abbe error with respect to the sensitive substrate held on the first stage, based on the use of the measured value obtained by using the third length-measuring axis at the projection center of the projection optical system, while the image of the pattern of the mask is projected through the projection optical system, during which the positional relationship between the alignment mark on the sensitive substrate held on the second stage and the reference mark on the second stage is accurately detected without any Abbe error based on the use of the detection result obtained by using the mark detecting system and the measured value obtained by using the fourth length-measuring axis at the detection center of the mark detecting system. Accordingly, it is possible to concurrently perform the exposure operation effected on the first stage and the alignment operation effected on the second stage as described above. Thus, it is possible to improve the throughput.

In addition, when the operations of the both stages are completed, the controller measures a position of the second substrate stage based on the use of the measured value obtained by using the third length-measuring axis, while moving the second substrate stage to the position at which the positional relationship between the predetermined reference point within a projection area of the projection optical system and the reference mark on the second substrate stage is detectable so as to manage the position of the second substrate stage on the base of the reference mark. Accordingly, as for the second substrate stage for which the positional relationship between the reference mark on the second stage and the alignment mark on the sensitive substrate has been measured (the alignment has been completed), its position can be managed based on the use of the measured value obtained by using the third length-measuring axis without any inconvenience, even when the fourth length-measuring axis used during the measurement of the alignment mark falls into an immeasurable state. Therefore, it is possible to detect the positional relationship between the reference mark on the second substrate stage and the predetermined reference point within the projection area of the projection optical system. Moreover, it is possible to perform the exposure while executing the positional adjustment for the projection area of the projection optical system and the sensitive substrate on the basis of the positional relationship, the measurement result of the alignment, and the measured value obtained by using the third length-measuring axis. That is, the position of the second substrate stage can be managed during the exposure by using the another length-measuring axis, even when the measurement is impossible by using the length-measuring axis which has been used to manage the position of the second stage during the alignment. Further, it becomes unnecessary that the alignment operation of the first or the second substrate stages, the movement operation from the alignment position to the exposure position and the exposure operation are subsequently observed. Therefore, it is possible to miniaturize the reflective surface of the stage for reflecting the interferometer beam for each of the length-measuring axes. Thus, it is possible to miniaturize the substrate stage.

In the projection exposure apparatus, the mark detecting system may be an alignment system. Also, it is desirable that the interferometer of the third length-measuring axes is reset when the other stage is moved to a position at which the relative positional relationship between the reference mark on the other stage and the predetermined reference point within the projection area of the projection optical system. By means of resetting the interferometer of the third length-measuring axes at this time, the reference mark position on the other stage on the basis of the reference point within the projection area of the projection optical system and the position of the alignment mark of the sensitive substrate on the other stage is managed more easily.

The projection exposure apparatus further comprises another mark detecting system (24b) having a detection center on the first axis, disposed on a side opposite to the mark detecting system (24a) with respect to the projection optical system (PL), wherein the interferometer system further provided with a fifth length-measuring axis (BI5Y) which perpendicularly intersects the first axis at a detection center of the another mark detecting system (24b); and the controller (90) may control the first and the second stage as follows. The controller manages the position of the one substrate stage based on the use of the measured value obtained by the third length-measuring axis (BI3Y) of the interferometer system, while exposing the sensitive substrate held on the one stage during which the positional relationship between the alignment mark on the sensitive substrate held on the other stage and the reference mark on the other stage is obtained based on the use of the detection result obtained by using the mark detecting system and the measured value obtained by using the fourth length-measuring axis (BI4Y) of the interferometer system, and, after exposing the one stage, moving the one stage so that, the reference mark on the one stage is positioned within the another mark detecting system while the position of the one stage is measured based on the use of the measured value obtained by using the fifth length-measuring axis (BI5Y).

The controller is capable of controlling the operations of the two stages as follows. That is, the position of the first substrate stage is managed without any Abbe error with respect to the sensitive substrate held on the first substrate stage, based on the use of the measured value obtained by using the third length-measuring axis which perpendicularly intersects the length-measuring axes (the first length-measuring axis and the second length-measuring axis) in the first axis direction at the projection center of the projection optical system, while the image of the pattern formed on the mask is subjected to exposure through the projection optical system, during which the positional relationship between the alignment mark on the sensitive substrate held on the second substrate stage and the reference mark on the second substrate stage is accurately detected without any Abbe error based on the use of the detection result obtained by using the mark detecting system and the measured value obtained by using the fourth length-measuring axis which perpendicularly intersects the length-measuring axes (the first length-measuring axis and the second length-measuring axis) in the first axis direction at the detection center of the mark detecting system. Accordingly, it is possible to concurrently perform the exposure operation effected on the one substrate stage and the alignment operation effected on the second substrate stage as described above.

Then, the controller controls the operation of the first substrate stage as follows. That is, when the above-mentioned operations of the both stages are completed, the position of the first substrate stage is measured by the measured value obtained by using the fifth length-measuring axis, while obtaining the relative position between the detection center of another mark detecting system and the reference mark on the first substrate stage. Accordingly, as for the first substrate stage for which the exposure for the sensitive substrate has been completed, the position of the first substrate stage can be managed without any Abbe error, based on the use of the reference mark on the first substrate stage and the measured value obtained by using the fifth length-measuring axis. Further, there is no inconvenience, even when the third length-measuring axis used during the exposure falls into an immeasurable state. Therefore, the exposure operation effected on the first stage and the exposure operation effected on the second stage can be easily changed by sifting the two substrate stages in the first axis direction, thereby, the measurement of the position of the second substrate stage, for which the alignment operation has been completed, is enabled based on the use of the measured value obtained by the third length-measuring axis, and the measurement of the position of the first substrate stage, for which the exposure operation has been completed, is enabled based on the use of the measured value obtained by the fifth length-measuring axis.

In this aspect, the projection exposure apparatus may further comprises a transport system (180 to 200) for receiving and transmitting the sensitive substrate (W1, W2) between the first substrate stage (WS1) and the second substrate stage (WS2), and it is desirable that the controller controls the one stage so as to position the reference mark thereon within the detection area of the another mark detecting system (24b), and at the position, the substrate is received and transmitted between the one stage and the transport system (180 to 200). In this constitution, in addition to the change between the exposure operation and the alignment operation described above, the controller allows the substrate to be received and transmitted between the first substrate stage and the transport system in the state in which the reference mark on the one stage is positioned within the detection area of the another mark detecting system using the fifth length-measuring axis of the interferometer system. Accordingly, the measurement of the position of the reference mark as the operation to start the alignment and the change of the sensitive substrate can be performed in a stationary state of the substrate stage. In addition to the fact that the movement time required for the substrate stage to move from the wafer exchange position to the alignment start position is zero, it is possible to perform the operations concerning the time T1, the time T2, and the time T3, for example on the side of the first substrate stage, while it is possible to perform the operation concerning the time T4 on the side of the second substrate stage. Therefore, it is possible to further improve the throughput.

In the projection exposure apparatus of the invention, the predetermined reference point within the projection area of the projection optical system (PL) may be the projection center for the image of the pattern formed on the mask (R); and the projection exposure apparatus further may comprise a mark position-detector (142, 144) for detecting a relative positional relationship between the projection center for the image of the pattern formed on the mask (R) and reference marks (MK1, MK2, MK3) on the stage, via the mask (R) and the projection optical system. The mark position-detector may be a detector detecting the marks through the projection optical system, such as a reticle alignment microscope.

In the projection exposure apparatus, as for the mark detecting system, at least one or more mark detecting systems may be provided apart from the projection optical system. However, it is also preferable that the two mark detecting systems (24a, 24b) are disposed on one side and the other side (each side) of the projection optical system (PL) in the direction of the first axis. When the mark detecting systems are arranged in the positional relationship as described above, then the sensitive substrate on the one substrate stage may be exposed by using the projection optical system located at the center (exposure operation), during which the sensitive substrate on the other substrate stage may be subjected to the mark detection by using any of the mark detecting systems (alignment operation). When the exposure operation is changed to the alignment operation, then the substrate stage for which the alignment operation has been completed can be moved to the position under the projection optical system and the other substrate stage can be moved to the position of the mark detecting system, only by deviating the two substrate stages in the direction of the first axis.

In the projection exposure, it is also preferable that the projection exposure apparatus further comprises a controller (90) for independently controlling movement of the first and second substrate stages on the basis of a result of measurement performed by the interferometer system (for example the length-measuring axes BI1X to BI4Y) so that each of the first and second substrate stages (WS1 and WS2) is capable of performing an exposure operation effected by the projection optical system (PL) and a mark-detecting operation effected by the mark detecting system (for example, 24a). The controller independently controls the movement of the first and second substrate stages on the basis of the result of measurement performed by the interferometer system (for example, the length-measuring axes BI1X to BI4Y) so that each of the first and second substrate stages is capable of performing the exposure operation effected by the projection optical system (PL) and the mark-detecting operation effected by the mark detecting system (for example, 24a), and hence the exposure operation effected by the projection optical system and the mark-detecting operation effected by the mark detecting system can be reliably performed for the sensitive substrate disposed on any of the substrate stages.

In this arrangement, if the spacing distance between the length-measuring axes BI3Y and BI4Y is too large, the length-measuring axes BI3Y, BI4Y are deviated from the substrate stage when the first substrate stage and the second substrate stage are moved. On the other hand, if such a situation is avoided, the interference between the both stages might occur. Therefore, in order to present such inconveniences, it is desirable that the controller (90) changes the third length-measuring axis (BI3Y) and the fourth length-measuring axis (BI4Y) of the interferometer system (for example, the length-measuring axes BI1X to BI4Y) between detection of the mark effected by the mark detecting system (for example, 24a) and exposure effected by the projection optical system (PL) for the first and second substrate stages (WS1 and WS2) respectively so that no inconvenience occurs even when the substrate stage is deviated from the length-measuring axis. In the constitution as described above, the spacing distance between the third length-measuring axis (BI3Y) and the fourth length-measuring axis (BI4Y) can be widened to avoid the interference between the both stages. Further, when the length-measuring axis BI3Y, BI4Y is deviated from the substrate stages during the movement of the first substrate stage and the second substrate stage, the controler can be used to change the length-measuring axis so that the two-dimensional position of each of the substrate stages is accurately measured at each of the processing positions by using the interferometer system.

According to the tenth aspect of the present invention, there is provided a method for exposing sensitive substrates by projecting an image of a pattern on a mask (R) via a projection optical system onto the sensitive substrates, characterized by:

using two substrate stages (WS1, WS2) each of which is movable independently on an identical plane while each holding a sensitive substrate (W1, W2);

measuring a position of one stage of the two stages by using a first interferometer, while exposing the sensitive substrate (W1, W2) held on the one stage, measuring the position of the other stage by using a second interferometer during exposure for the substrate held on the one stage, while measuring a positional relationship between an alignment mark on the substrate held on the other stage and a reference mark on the other stage, moving the other stage to a position at which a positional relationship between the reference mark on the other stage and a predetermined reference point within a projection area of the projection optical system is obtained, after completion of the exposure for the substrate on the one stage; and performing alignment for the sensitive substrate held on the other stage and the image of the pattern on the mask, by using the first interferometer, on the basis of the relationship between the alignment mark on the substrate held on the other stage and the reference mark on the other stage, and a relationship between the reference mark on the other stage and the predetermined reference point within the projection area of the projection optical system.

According to the projection exposure method, for example, the exposure operation for the sensitive substrate held on the first substrate stage, and the measurement of the positional relationship (alignment operation) between the positional alignment mark of the sensitive substrate held on the second substrate stage and the reference mark on the stage are performed concurrently in parallel to one another. During this process, the position of the first substrate stage is managed by the aid of the first interferometer, and the position of the second stage is managed by the aid of the second interferometer. When the exposure operation effected on the side of the first substrate stage is completed, the position of the second stage is measurable by using the first interferometer which has been used to manage the position of the first substrate stage, and also, the second substrate stage is moved to the position at which the relative position between the predetermined reference point within the projection area of the projection optical system and the reference mark on the second substrate stage is detectable. Subsequently, the positional adjustment is performed for the sensitive substrate held on the second stage and the image of the pattern formed on the mask by using the first interferometer, on the basis of the positional relationship between the reference mark on the second substrate and the positional alignment mark on the sensitive substrate held on the second stage measured previously. Thus, the sensitive substrate is exposed by projection with the image of the pattern formed on the mask.

That is, the exposure operation for the sensitive substrate held on the one substrate stage, and the alignment operation for the sensitive substrate held on the second stage are concurrently performed in parallel to one another. After that, the first substrate stage is retracted to a predetermined substrate exchange position, concurrently with which the second substrate stage is moved toward the position on which the position of the reference mark of the second substrate stage is detectable with respect to the predetermined reference point (for example, the projection center of the image of the pattern formed on the mask) within the projection area of the projection optical system, and then the positional relationship between the both is detected. Further, the alignment is performed for the sensitive substrate held on the second substrate stage and the image of the pattern formed on the mask on the basis of the obtained detection result and the positional relationship between the alignment mark and the reference mark on the stage previously measured during the alignment operation, while the position of the second stage is managed by using the first interferometer.

Therefore, it is possible to improve the throughput by concurrently perform the exposure operation for the sensitive substrate on the first substrate stage and the alignment operation for the sensitive substrate on the second substrate stage. Even when the second interferometer, which has been used to manage the position of the other stage during the alignment, cannot be used for the measurement, the measurement based on the use of the first interferometer makes it possible to manage the position of the second substrate stage during the exposure. Thus, it becomes unnecessary that the stage position is observed continuously by means of one measuring axis or one interferometer through the alignment operation, the movement operation from the alignment position to the exposure position and exposure operation. Therefore, it is possible to miniaturize the reflective surface of the stage for reflecting the interferometer beam of each of the interferometers, and thereby it is possible to miniaturize the substrate stage.

According to the eleventh aspect of the present invention, there is provided a projection exposure apparatus for exposing a sensitive substrate (W1, W2) by projecting an image of a pattern formed on a mask (R) via a projection optical system (PL) onto the sensitive substrates, characterized by comprising:

a first substrate stage (WS1) which is movable on a two-dimensional plane while holding a sensitive substrate (W1);

a second substrate stage (WS2) which is movable independently from the first substrate stage (WS1) on the same plane as that for the first substrate stage (WS1) while holding a sensitive substrate (W2);

a transport system (180 to 200) for delivering the sensitive substrate with respect to the first and second substrate stages (WS1, WS2); and a controller (90) for controlling operations of the both stages so that one stage of the first (WS1) and second (WS2) substrate stages performs delivery of the sensitive substrate with respect to the transport system (180 to 200), during which the other stage performs an exposure operation.

According to the projection exposure apparatus, the controller controls the operations of the both stages so that one stage of the first substrate stage and the second substrate stage performs the delivery of the sensitive substrate with respect to the transport system, during which the other stage performs the exposure operation. Therefore, the operation corresponding to the time T1 explained above can be processed concurrently with the operation corresponding to the time T4. Thus, it is possible to improve the throughput as compared with the conventional sequential process which requires the time (T1+T2+T3+T4).

It is sufficient for any of the projection exposure apparatus that the exposure is performed by using one sheet of mask. However, it is also preferable that the projection exposure apparatus further comprises a mask stage (RST) which is capable of simultaneously carrying a plurality of masks (R); and a driving system (30) for driving the mask stage (RST) so that any of the masks (R) is selectively set at an exposure position. According to this embodiment, for example, in order to improve the resolving power, even when the so-called double exposure method is used to change the two masks so that overlay exposure is performed under an exposure condition appropriate for each exposure area, then the double exposure can be performed in a continuous manner by using the two masks on the side of the one substrate stage, during which another operation such as alignment can be performed on the side of the other substrate stage concurrently therewith, only by allowing the two masks to be carried on the mask stage beforehand, and changing the masks and setting the mask stage at the exposure position by using the driving system. Thus, the low throughput, which would be otherwise resulted from the double exposure method, can be greatly improved.

As compared with the stationary type projection exposure apparatus such as the stepper for exposing the sensitive substrate by projection with the pattern formed on the mask via the projection optical system in a state in which the mask and the sensitive substrate are allowed to stand still, any of the above-mentioned projection exposure apparatus is more effective when the projection exposure apparatus is constructed as a scanning type projection exposure apparatus in which the mask (R) is carried on the mask stage (RST) which is movable in a predetermined direction, wherein the projection exposure apparatus further comprises a stage controller (38) for exposing the sensitive substrate (WS1, WS2) by projection with the pattern formed on the mask, while synchronously moving the mask stage (RST) with respect to any one of the first and second substrate stages (WS1 and WS2), because of the following reason. That is, it is possible to realize highly accurate exposure owing to the averaging effect on the image of the mask pattern in the projection area formed by the projection optical system, and it is possible to make exposure for a larger area by using the smaller projection optical system as compared with those used for the stationary type projection exposure apparatus.

According to the twelfth aspect of the present invention, there is provided a projection exposure apparatus for exposing sensitive substrates (W1, W2) by projecting an image of a pattern formed on a mask (R) via a projection optical system (PL) onto the sensitive substrates, characterized by having:

- a first substrate stage (WS1) which is movable on a two-dimensional plane while holding a sensitive substrate (W1);
- a second substrate stage (WS2) which is movable independently from the first substrate stage (WS1) on the same plane as that for the first substrate stage (WS1) while holding a sensitive substrate (W2);
- an interferometer system (for example, a length-measuring axes BI1X to BI4Y) for measuring two-dimensional positions of the first substrate stage and the second substrate stage (WS1, WS2) respectively;
- a storing device (91) which stores an interference condition for the interferometer system (for example, the length-measuring axes (BI1X to BI4Y) to be used when the first substrate stage and the second substrate stage cause interference with each other; and
- a controller (90) for controlling movement of the both stages (WS1, WS2) to cause no interference with each other while monitoring a measured value obtained by the interferometer system (for example, the length-measuring axes BI1X to BI4Y) on the basis of the interference condition stored in the storing device (91).

According to the projection exposure apparatus, the interferometer system is used to measure the two-dimensional positions of the first substrate stage and the second substrate stage which are independently movable on the two-dimensional plane while holding the sensitive substrates respectively, and the movement of the both stages is controlled by the controller to cause no interference while monitoring the measured value obtained by using the interferometer system, on the basis of the interference condition stored in the storing apparatus under which the first substrate stage and the second substrate stage cause interference with each other. Therefore, even when the two stages are independently moved to concurrently process the two operations in parallel to one another, it is possible to prevent the two stages from contact (interference).

The projection exposure apparatus may further comprises an alignment system provided apart from the projection optical system (PL), for detecting a reference mark on the substrate stage (WS1, WS2) or a mark on the sensitive substrate (W1, W2) held on the substrate stage (WS1, WS2); and a transport system (180 to 200) for delivering the sensitive substrate (W1, W2) with respect to the first substrate stage and the second substrate stage (WS1, WS2). The controller (90) may control the two substrate stages (WS1, WS2) so that one stage of the substrate stages (WS1 or WS2) performs at least one operation of a mark-detecting operation performed by the alignment system and a sensitive substrate (W1, W2)-delivering operation with respect to the transport system (180 to 200), while a measured value obtained by using the interferometer system (for example, length-measuring axes BI1X to BI4Y) is monitored, on the basis of the interference condition, during which the other stage (WS2 or WS1) is subjected to an exposure operation performed by using the projection optical system (PL), and when the controller (90) may control such that when the both stages (WS1, WS2) come to positions to cause interference with each other, the stage (WS1 or WS2) of the both stages (WS1, WS2), which takes a longer time until completion of the operation, is preferentially moved until the both stages (WS1, WS2) are in a positional relationship of no interference, during which the stage (WS2 or WS1), which takes a shorter time until completion of the operation, is allowed to wait.

According to this constitution, the controller controls the both substrate stages so that the one stage of the substrate stages performs at least one of the operations of the sensitive substrate-delivering operation and the mark-detecting operation, while monitoring the measured value obtained by using the interferometer system, on the basis of the interference condition, during which the other substrate stage is subjected to the exposure operation, while the controller performs control such that when the both stages come to the positions to cause interference with each other, the stage, which takes a longer time until completion of the operation concerning the both stages, is preferentially moved until both stages are in the positional relationship of no interference, during which the stage, which takes a shorter time until completion of the operation, is allowed to wait. Therefore, even when a situation of interference occurs during the concurrent process for the two operations while independently moving the two stages, the interference of the two stages can be avoided without decreasing the throughput by comparing the time until completion of the operation for the both stages, preferentially moving the one stage, and allowing the other stage to wait.

According to the thirteenth aspect of the present invention, there is provided a projection exposure apparatus for exposing sensitive substrates (W1, W2) by projecting an image of a pattern formed on a mask (R) via a projection optical system (PL) onto the sensitive substrates, characterized by comprising:

a first substrate stage (WS1), on which a reference mark is formed, moving on a two-dimensional plane while holding a sensitive substrate (W1);

a second substrate stage (WS2), on which a reference mark is formed, for moving independently from the first substrate stage (WS1) on the same plane as that for the first substrate stage (WS1) while holding a sensitive substrate (W2);

an alignment system (for example, 24a) provided apart from the projection optical system (PL), for detecting the reference mark on the substrate stage (WS1 or WS2) or a mark on the sensitive substrate (W1 or W2) held on the substrate stage (WS1 or WS2); and a controller (90) for controlling the two stages (WS1, WS2) so that a mark-detecting operation is performed by the alignment system (for example, 24a) for the sensitive substrate held on one stage (WS1 or WS2) of the first substrate stage (WS1) and the second substrate stage (WS2), concurrently with which an exposure operation is performed for the sensitive substrate held on the other stage (WS2 or WS1), while an operation, which is included in the mark-detecting operation to be performed on the one stage (WS1 or WS2) and which affects the other stage (WS2 or WS1), is performed in synchronization with an operation which is included in the exposure operation to be performed on the other stage (WS2 or WS1) and which affects the one stage (WS1 or WS2), and for controlling the operations of the two substrate stages (WS1, WS2) so that operations, which are included in the respective operations to be performed on the first substrate stage (WS1) and the second substrate stage (WS2) and which make no influence with each other, are performed in synchronization with each other.

In the projection exposure apparatus, the controller controls the two stages so that the operation, which is included in the mark-detecting operation operated on the one stage and which affects the other stage (disturbance factor), is performed in synchronization with the operation which is included in the exposure operation operated on the other stage and which affects the one stage (disturbance factor). Accordingly, the operations, which make influence with each other, are synchronized. Therefore, no trouble occurs in the operations performed on the respective stages. Further, the controller controls so that the operations, which are included in the respective operations to be performed by the both stages and which make no influence with each other (non-disturbance factor), are performed in a synchronized manner. Therefore, no trouble occurs also in this case in the operations performed on the respective stages. Therefore, the position-detecting operation performed by the alignment system for the marks on the respective substrate stages or on the sensitive substrates can be concurrently processed in parallel to the exposure operation performed by the projection optical system. Consequently, it is possible to improved the throughput. Further, it is possible to concurrently process the two operations in an appropriate manner, because the operations performed on the two substrate stages make no influence with each other.

In this aspect, various combinations may be conceived for the operations which make no influence with each other. However, it is preferable that the one stage (WS1 or WS2) is stationarily rested to measure the mark on the one stage (WS1 or WS2) or the mark on the sensitive substrate (W1 or W2) held on the one stage (WS1 or WS2) during a period for exposing, by projection, the sensitive substrate (W2 or W2) held on the other substrate stage (WS2 or WS1) with the image of the pattern formed on the mask (R). These operations do not make any influence with each other. Accordingly, it is possible to concurrently process, without any trouble, the highly accurate mark-detecting operation and the exposure operation.

On the other hand, various combinations may be conceived for the operations which make influence with each other. However, it is preferable that the one substrate stage (WS1 or WS2) is moved for detecting the next mark in synchronization with movement of the other substrate stage (WS2 or WS1) for the next exposure.

In this embodiment, it is preferable that the projection exposure apparatus further comprises a mask stage (RST) which is movable in a predetermined direction while carrying the mask (R), and a scanning system (for example, 38) for synchronously scanning the mask stage (RST) and the first substrate stage (WS1) or the second substrate stage (WS2) with respect to the projection optical system (PL), wherein the controller (90) stationarily rests the one stage (WS1 or WS2) to measure the mark on the one stage (WS1 or WS2) or the mark on the sensitive substrate (W1 or W2) held on the one stage (WS1 or WS2) during movement of the other substrate stage (WS2 or WS1) at a constant velocity in synchronization with the mask stage (RST). Accordingly, the scanning system is operated to move the mask stage and the other substrate stage at the constant velocity in a synchronized manner during the exposure. Therefore, the one stage is not affected thereby, for which the measurement of the mark is performed. The mark is measured in a stationary state which does not affect the other stage during the exposure, on the one stage for which the mark measurement is performed, during the movement of the other stage at the constant velocity (during the exposure). Accordingly, even during the process of the scanning exposure, the exposure operation and the mark-detecting operation can be concurrently dealt with in parallel to one another without any trouble by using the two stages.

In this embodiment, it is more desirable that the projection exposure apparatus further comprises a transport system (180 to 200) for delivering the sensitive substrate (W1 or W2) with respect to the first substrate stage and the second substrate stage (WS1, WS2) respectively, wherein the controller (90) controls operations of the two substrate stages (WS1, WS2) so that the one substrate stage (WS1 or WS2) performs at least one of the mark-detecting operation and a sensitive substrate (W1 or W2)-delivering operation with respect to the transport system (180 to 200), concurrently with which the exposure operation is performed for the sensitive substrate (WS2 or WS1) held on the other stage, while an operation, which is included in the delivering operation and the mark-detecting operation to be performed on the one substrate stage (WS1 or WS2) and which affects the other stage (WS2 or WS1), is performed in synchronization with the operation which is included in the exposure operation to be performed on the other stage (WS2 or WS1) and which affects the one stage (WS1 or WS2), and the controller (90) controls the operations of the two substrate stages (WS1, WS2) so that the operations, which are included in the respective operations to be performed on the first substrate stage and the second substrate stage (WS1, WS2) and which make no influence with each other, are performed in synchronization with each other. According to this embodiment, the operations corresponding to the time T1, the time T2, and the time T3 explained above can be performed on the side of the one stage, while the operation corresponding to the time T4 can be performed on the side of the other stage. Therefore, the throughput is further improved, and it is possible to concurrently process the operations on the two stages respectively without any trouble.

In the projection exposure apparatus, the alignment system may be provided separately from the projecting optical system. However, when the apparatus comprises, for example, two alignment systems separately from the projection optical system, it is preferable that the alignment systems (24a, 24b) are arranged on both sides of the projection optical system (PL) in a predetermined direction; and the controller (90) changes the operations of the both stages (WS1, WS2) when the operations of the both of the first substrate stage and the second substrate stage (WS1, WS2) are completed.

In the case of the above constitution, the projection optical system disposed at the central position is used to expose the sensitive substrate held on the one substrate stage (exposure operation), while the one alignment system is used to detect the mark for the sensitive substrate held on the other substrate stage (alignment operation). When the exposure operation is changed to the alignment operation, only the movement of the two substrate stages toward the other alignment system along the predetermined direction makes it possible to move the one substrate stage having been located under the projection optical system to the position for the other alignment system, and move the other substrate stage having been located at the position for the one alignment system to the position under the projection optical system with ease. Thus, the two alignment systems can be alternately used as described above without any trouble.

According to the fourteenth aspect of the present invention, there is provided a projection exposure method for exposing sensitive substrates (W1, W2) by projecting an image of a pattern formed on a mask (R) via a projection optical system (PL) onto the sensitive substrates, characterized by comprising:

preparing two substrate stages, each of which moves independently on a two-dimensional plane while holding a sensitive substrate (W1, W2), each stage having a reference mark formed thereon; and exposing, by projection, the sensitive substrate (W1 or W2) held on one of the stages (WS1 or WS2) with the image of the pattern formed on the mask, while stationarily resting the other stage (WS2 or WS1) to detect the reference mark on the other stage (WS2 or WS1) or a mark on the sensitive substrate (W1 or W2) held on the other stage (WS2 or WS1).

According to the projection exposure apparatus, the other stage is stationarily rested during the projection exposure with the image of the pattern formed on the mask for the sensitive substrate held on the one stage of the two substrate stages to detect the reference mark on the other stage or the alignment mark on the sensitive substrate held on the other stage. Therefore, the two stages are used such that the projection exposure operation is performed on the one stage, during which the mark-detecting operation is performed on the other stage in the stationary state. Therefore, the highly accurate exposure operation and the mark-detecting operation are concurrently dealt with in parallel to one another without being affected by the operation performed on the one stage or the other stage with each other. Thus, it is possible to improve the throughput.

According to the fifteenth aspect of the present invention, there is provided a projection exposure method for exposing sensitive substrates (W1, W2) by projecting an image of a pattern formed on a mask (R) via a projection optical system (PL) onto the sensitive substrates, characterized by comprising:

preparing two substrate stages, each of which moves independently on a two-dimensional plane while holding a sensitive substrate (W1, W2), each stage having a reference mark formed thereon; and successively exposing, by projection, a plurality of portions on the sensitive substrate (W1, W2) held on one stage (WS1 or WS2) of the two substrate stages (WS1, WS2) with the image of the pattern formed on the mask (R), and successively detecting a plurality of marks on the sensitive substrate (W1, W2) held on the other stage (WS2 or WS1) concurrently therewith, while determining an order of the detection of the marks on the sensitive substrate (W1, W2) held on the other stage (WS2 or WS1) so that the two substrate stages (WS1, WS2) cause no interference with each other.

According to the present invention, the projection exposure is successively performed with the image of the pattern formed on the mask for the plurality of portions on the sensitive substrate held on the one stage of the two substrate stages which are independently movable on the two dimensional plane while holding the sensitive substrates respectively, concurrently with which the plurality of marks on the sensitive substrate held on the other stage are successively detected. During this process, the order of the detection of the marks on the sensitive substrate held on the other stage is determined so that the two substrate stages cause no interference with each other. Therefore, the order of the detection of the marks is determined in conformity with the movement of the stage which is subjected to the successive projection exposure process. Accordingly, the two stages are prevented from interference with each other, and the throughput can be improved by concurrently processing the operations.

According to the sixteenth aspect of the present invention, there is provided a scanning type projection exposure apparatus for exposing a sensitive substrate (W) with an image of a pattern formed on a mask (R) by moving the sensitive substrate (W) in a scanning direction with respect to an exposure area (IF) which is conjugate to an illumination area (IA) illuminated with an illumination light beam (EL), in synchronization with movement of the mask (R) in the scanning direction with respect to the illumination area (IA), the projection exposure apparatus comprising:

a substrate stage (WS) which is movable on a two-dimensional plane while holding the sensitive substrate (W);

a position-detecting system (151, 161) including detecting areas having a width, in a non-scanning direction perpendicular to a scanning direction, which is wider than that of an exposure area (IF), on one side and the other side in the scanning direction with respect to the exposure area (IF), for detecting a relative position of a surface of the sensitive substrate (W) with respect to a predetermined reference plane at least at one of a plurality of detecting points (for example, FA1 to FA9) set in the respective detecting areas along the non-scanning direction;

a substrate-driving system (LS) provided on the substrate stage (WS), which adjusts a surface position of the sensitive substrate (W) held on the stage (WS); and a controller (90) which controls the substrate-driving system (LS) on the basis of detection result obtained by using the position-detecting system (151, 161), upon exposure for the sensitive substrate (W) held on the substrate stage (WS).

According to the projection exposure apparatus, the position-detecting system is arranged on each side in the scanning direction with respect to the exposure area, in the non-scanning direction perpendicular to the scanning direction respectively, having the detecting area with the width in the non-scanning direction wider than the exposure area. The relative position of the surface of the sensitive substrate with respect to the predetermined reference plane is detected at least at one of the plurality of detecting points set in the respective detecting areas along the non-scanning direction. The controller controls the substrate-driving system on the basis of the detection results obtained by using the position-detecting systems, upon exposure for the sensitive substrate held on the substrate stage. Accordingly, for example, unlike the conventional pre-measurement sensor merely including the detecting area having the same width as the exposure area in which it has been difficult to perform pre-measurement control in the area in the vicinity of the outer circumference of the sensitive substrate when the scanning is performed from the outside to the inside of the sensitive substrate, it is possible to detect the relative position of the surface of the adjacent portion of the sensitive substrate with respect to the predetermined reference plane, owing to the detecting points of the part of the detecting area protruding to the outside of the exposure area even in such a case. It is possible to adjust the surface position of the sensitive substrate by controlling the substrate-driving system on the basis of the detection data. Therefore, it is possible to avoid decrease in throughput which would be otherwise caused by the change in scanning direction for the sensitive substrate. It is possible to drive the focus control by utilizing the detection data.

Alternatively, during the exposure for a certain shot area existing at the outer circumference portion of the substrate, the information on the surface position of a shot area adjacent thereto is detected by using the detecting points at the portions of the detecting area disposed on one side and the other side in the scanning direction protruding over the outside of the exposure area, and an obtained result is stored. By doing so, when the adjacent shot area is exposed, even if the adjacent shot is a shot area for which it is difficult to perform pre-measurement control by using the conventional pre-measurement sensor described above, it is possible to quickly drive the focus on the basis of the stored information on the surface position.

In this aspect, it is preferable that the controller (90) controls the substrate-driving system (LS) on the basis of at least one detection result for the plurality of detecting points (for example, FA1 to FA9) in the detecting area set on a front side of the exposure area in relation to the scanning direction for the sensitive substrate, of the detection results obtained by using the position-detecting systems. That is, the position-detecting system may be used as only a pre-measurement sensor.

Alternatively, various opportunities can be considered as timings to start control of the substrate-driving system in order to adjust the surface position of the sensitive substrate. However, it is preferable that when shot areas (212) in the vicinity of outer circumference of the sensitive substrate (W) are subjected scanning exposure from the outside to the inside of the sensitive substrate (W), the controller (90) starts control for the substrate-driving system (LS) for adjusting the surface position of the sensitive substrate (W) on the basis of a detection result for a detecting point (FAA1 to FA9) which overlaps the sensitive substrate (W), from a point of time at which at least one of the plurality of detecting points (for example, FA1 to FA9) overlaps an effective area on the sensitive substrate (W), because of the following reason. That is, it is possible to quickly move the surface into a desired position (focus onto the surface) by starting the control of the substrate-driving system from the state in which at least one of the detecting points overlaps the effective area.

Alternatively, when one detecting point overlaps the shot area, the surface position (including the inclination) of the sensitive substrate is adjusted as follows by the aid of the substrate-driving system. That is, it is preferable that when shot areas (212) in the vicinity of outer circumference of the sensitive substrate (W) are subjected scanning exposure, if only one detecting point (for example, FA3 to FA7) overlaps the shot area (212), then the controller (90) adjusts an inclination of the sensitive substrate (W) by the aid of the substrate-driving system (LS) on the basis of a predetermined fixed value. The predetermined fixed value is exemplified by an inclination of zero. In this case, the surface of the sensitive substrate is set on a horizontal plane including the surface position in the direction perpendicular to the reference plane detected by using the detecting points. Therefore, even when only one detecting point is used, it is possible to perform the leveling control in addition to the focus control.

Alternatively, it is preferable that when shot areas (212) in the vicinity of outer circumference of the sensitive substrate (W) are subjected scanning exposure, if only one detecting point (for example, FA3 to FA7) overlaps the shot area (212), then the controller (90) adjusts an inclination of the sensitive substrate (W) by the aid of the substrate-driving system (LS) on the basis of a detection result for the only one detecting point and a detection result for another detecting point (for example, FA1, FA2, FA8, FA9) which overlaps a shot area adjacent to the shot area (212) overlapped by the one detecting point. As described above, even when one detecting point in the exposure shot area is used, it is possible to perform the focus/leveling control with relative accuracy, by using the detection result for the adjacent shot area and the detection result for the one point. Further, it may be previously determined that a detection result of what detecting point included in the plurality of detecting points (for example, FA1 to FA9) is used for each of the plurality of shot areas (212) on the sensitive substrate (W), and when a certain shot area (212) on the sensitive substrate (W) is subjected to scanning exposure, the controller (90) adjusts the surface position of the sensitive substrate (W) by the aid of the substrate-driving system (LS) by using only the detection result for the detecting point determined for the shot area (212). As described above, the detecting point, which is suitable to detect the surface position corresponding to each of the shot areas, is previously determined, and thus it is possible to adjust the surface position (perform the focus/leveling control) with good efficiency and with less error.

It is desirable that the effective area on the sensitive substrate is disposed inside a prohibition zone (pattern prohibition zone) defined over an entire surface of the sensitive substrate (W) or at a circumferential edge portion of the sensitive substrate (W). In this embodiment, from the point of time at which at least one of the detecting points overlaps the inside of the sensitive substrate or the prohibition zone defined at the circumferential edge portion of the sensitive substrate, the control of the substrate-driving system is started in order to adjust the surface position of the sensitive substrate. Especially, the use of the inside of the prohibition zone defined at the circumferential edge portion of the sensitive substrate makes it difficult to be affected by dust and camber existing in the vicinity of the outer circumference of the sensitive substrate. Therefore, it is possible to detect the surface position of the sensitive substrate more accurately.

Various judgement standards are conceived to make judgement whether or not the area is the effective area. However, it is preferable that the controller (90) judges whether or not any detecting point (FA1 to FA9) for the position-detecting system (151, 161) overlaps the effective area on the sensitive substrate (W), on the basis of positional information on outer circumference of the sensitive substrate (W), positional information on the respective detecting points (for example, FA1 to FA9) for the position-detecting system (151, 161), and positional information on the shot area (212) to be subjected to exposure. Accordingly, it is possible to accurately judge whether or not any of the detecting points for the position-detecting system overlaps the effective area on the sensitive substrate. Thus, it is possible to accurately start the control of the adjustment of the surface position of the sensitive substrate effected by the substrate-driving system.

As another judgement standard to make judgement whether or not the area is the effective area, for example, it is preferable that the controller (90) judges whether or not any of the detecting points (FA1 to FA9) for the position-detecting system (151, 161) overlaps the effective area on the sensitive substrate (W) by comparing a predetermined allowable value with the detection results for the plurality of detecting points (for example, FA1 to FA9) for the position-detecting system (151, 161) in this embodiment, the effective area is judged in accordance with whether or not the detection value is included in the range of the predetermined allowable value. Even in the case of those included in the effective range, if any error factor exists due to any influence of dust or camber of the sensitive substrate, such a factor can be removed provided that it is excluded from the range of the allowable value. Therefore, this embodiment is advantageous in that an unexpected situation can be dealt with.

As for the timing to start adjustment for the inclination of the sensitive substrate by the aid of the substrate-driving system by using the control system, for example, the following procedure is available. That is, it is preferable that when the shot area (212) in the vicinity of the outer circumference of the sensitive substrate (W) is subjected scanning exposure, the controller (90) starts, from a point of time at which a plurality of detecting points (for example, FA1 to FA9) overlap the shot area (212), adjustment for the inclination of the sensitive substrate (W) on the basis of only the detection results for the detecting points (FA1 to FA9) which overlap the shot area (212), by the aid of the substrate-driving system (LS). Accordingly, when the plurality of detecting points overlap the shot area, the inclination of the surface of the shot area can be known. Thus, it is possible to perform the leveling control accurately.

Various judgement standards are conceived to judge whether or not any detecting point for the position-detecting system overlaps any shot area. However, it is preferable that the controller (90) judges whether or not any detecting point for the position-detecting system (151, 161) overlaps the shot area (212), on the basis of positional information on outer circumference of the sensitive substrate (W), positional information on the respective detecting points (for example, FA1 to FA9) for the position-detecting system (151, 161), and positional information on the shot area (212) to be subjected to exposure. Accordingly, it is possible to accurately judge whether or not any of the detecting points for the position-detecting system overlaps any shot area on the sensitive substrate. Thus, .in the inventions, it is possible to accurately judge the number of detecting points overlapping the shot area. Alternatively, it is preferable that when the shot area (212) in the vicinity of the outer circumference of the sensitive substrate (W) is subjected to scanning exposure, if only one detecting point (for example, FA1 to FA9) overlaps the shot area (212), then the controller (90) starts adjustment for the inclination of the sensitive substrate (W) by the aid of the substrate-driving system (LS) on the basis of detection results for a predetermined number of detecting points (FA1 to FA9) including the only one detecting point (one point included in (FA1 to FA9) and at least one detecting point (adjoining point included in (FA1 to FA9) adjacent thereto, and then the detecting point (FA1 to FA9) to be used for the adjustment for the inclination is successively shifted toward the inside of the shot area (212). Even when only one detecting point overlaps the shot area, the adjustment for the inclination of the sensitive substrate is started on the basis of the detection results for the detecting points including at least one detecting point adjacent to the one detecting point, and the detecting point to be used for the inclination adjustment is successively shifted toward the inside of the shot area, in accordance with the increase in the number of detecting points disposed at the inside of the shot area. Thus, it is possible to perform the adjustment for the inclination more accurately.

According to the seventeenth aspect of the present invention, there is provided a scanning exposure method for exposing a sensitive substrate (W) with an image of a pattern formed on a mask (R) by moving the sensitive substrate (W) in a scanning direction with respect to an exposure area (IF) which is conjugate to an illumination area (IA) illuminated with an illumination light beam (EL), in synchronization with movement of the mask (R) in the scanning direction with respect to the illumination area (IA), the scanning exposure method comprising the steps of:

projecting a plurality of slit images onto a surface of the sensitive substrate (W) in a direction inclined by a predetermined angle so that the plurality of slit images are arranged along a non-scanning direction in detecting areas (ABE, AFE) having a width in the non-scanning direction perpendicular to the scanning direction wider than that of an exposure area (IF) and disposed on one side and the other side in the scanning direction with respect to the exposure area (IF), during scanning exposure for the sensitive substrate (W);

receiving reflected light beams of the respective slit images coming from the sensitive substrate (W) to calculate, on the basis of photoelectrically converted signals thereof, relative positions on the surface of the sensitive substrate (W) with respect to a predetermined reference plane at respective detecting points (for example, AF1 to AR9) onto which the slit images are projected respectively; and adjusting a surface position of the sensitive substrate (W) in the exposure area (IF) on the basis of a result of the calculation.

According to the scanning exposure method, the plurality of slit images are projected onto the surface of the sensitive substrate in the direction inclined by the predetermined angle so that the plurality of slit images are arranged along the non-scanning direction in the detecting areas having a width, in the non-scanning direction perpendicular to the scanning direction, wider than that of the exposure area, and disposed on one side and the other side in the scanning direction with respect to the exposure area, during scanning exposure for the sensitive substrate. The reflected light beams of the respective slit images coming from the sensitive substrate are received to obtain the photoelectrically converted signals on the basis of which the relative positions of the surface of the sensitive substrate with respect to the predetermined reference plane are calculated respectively at the respective detecting points onto which the slit images are projected. Further, the surface position of the sensitive substrate in the exposure area is adjusted on the basis of the result of the calculation. Accordingly, for example, when the scanning is performed from the outside to the inside of the sensitive substrate upon exposure for the area in the vicinity of the outer circumference of the sensitive substrate, it is possible to calculate the relative position of the surface of the sensitive substrate with respect to the predetermined reference plane at the detecting point on the basis of the photoelectrically converted signal of the reflected light beam of the slit image at the detecting point protruding over the outside of the exposure area. As a result, it is possible to calculate the relative position of the surface of the sensitive substrate at the adjacent portion with respect to the predetermined reference plane by using the detecting point protruding over the outside of the exposure area. It is possible to adjust the surface position of the sensitive substrate on the basis of the result of the calculation. Therefore, it is possible to avoid the decrease in throughput which would by otherwise caused by the change in scanning direction for the sensitive substrate, and it is possible to perform the focus control more accurately by utilizing the calculated data.

According to the eighteenth aspect of the present invention, there is provided a projection exposure method for exposing a plurality of shot areas (210) on a sensitive substrate (W1 or w2) respectively with an image of a pattern formed on a mask (R) via a projection optical system (PL) by moving the sensitive substrate (W1 or W2) in a scanning direction with respect to an exposure area (IF) which is conjugate to an illumination area (IA) illuminated with an illumination light beam (EL), in synchronization with movement of the mask (R) in the scanning direction with respect to the illumination area (IA), the projection exposure method characterized by comprising the steps of:

selecting some of the plurality of shot areas (210) as sample shot areas so as to include shot areas (210) in the vicinity of outer circumference which are set to be subjected to scanning from the outside to the inside of the sensitive substrate (W1 or W2) with respect to the exposure area (IF);

measuring coordinate positions of the sample shot areas, respectively;

detecting a relative position of the sensitive substrate (W1 or W2) with respect to a predetermined reference plane for each of the sample shot areas when the coordinate positions of the sample shot areas are measured;

determining an arrangement of the plurality of shot areas (210) on the sensitive substrate (W1 or W2) on the basis of the measured coordinate positions of the sample shot areas;

performing positional adjustment of the respective shot areas with respect to the image of the pattern on the mask (R) on the basis of the determined arrangement of the shot areas (210) while adjusting a surface position of the sensitive substrate (W1 or W2) on the basis of the relative position detected by measuring the coordinate positions, when exposure are performed for the respective shot areas (210) in the vicinity of the outer circumference which are set to be subjected to scanning from the outside to the inside of the sensitive substrate (W1 or W2) with respect to the exposure area (IF).

According to the projection exposure apparatus, some of the plurality of shot areas are selected as the sample shot areas so as to include the shot areas in the vicinity of the outer circumference which are set to be subjected to scanning from the outside to the inside of the sensitive substrate with respect to the exposure area, of the plurality of shot areas on the sensitive substrate. The coordinate positions of the some of sample shot areas are measured respectively. The relative position of the sensitive substrate with respect to the predetermined reference plane for each of the some of sample shot areas is detected when the coordinate positions of the some of sample shot areas are measured. After that, the arrangement of the plurality of shot areas on the sensitive substrate is determined on the basis of the measured coordinate positions of the sample shot areas.

The positional adjustment with respect to the image of the pattern on the mask is performed for the shot area on the basis of the determined arrangement of the shot areas as described above when exposure is performed for the respective shot areas in the vicinity of the outer circumference which are set to be subjected to scanning from the outside to the inside of the sensitive substrate with respect to the exposure area, and the surface position of the sensitive substrate is adjusted on the basis of the detected relative position by measuring the coordinate positions.

Accordingly, even in the case of exposure for the respective shot areas in the vicinity of the outer circumference which are sat to be subjected to scanning from the outside to the inside of the sensitive substrate with respect to the exposure area, it is possible to adjust the surface position of the sensitive substrate on the basis of the relative position detected when the coordinate position is measured. Therefore, it is possible to avoid an inconvenience that the scanning direction is changed from the inside to the outside upon exposure for such shot areas, and the throughput is sacrificed.

In this aspect, it is not necessarily indispensable that the sensitive substrate is moved in the same direction as that during the exposure to detect the relative position of the sensitive substrate with respect to the predetermined reference plane, when the coordinate position of the sample shot area in the vicinity of the outer circumference is measured. However, it is desirable that the relative position of the sensitive, substrate (W1 or W2) with respect to the predetermined reference plane is detected while moving the sensitive substrate (W1 or W2) in the same direction as that used during exposure upon the measurement of the coordinate positions of the shot areas (210) in the vicinity of the outer circumference which are set to be subjected to scanning from the outside to the inside of the sensitive substrate (W1 or W2) with respect to the exposure area (IF) of the sample shot areas, because of the following reason. That is, by doing so, it is possible to perform focus control in which, for example, the offset, which depends on the movement direction of the sensitive substrate (W1 or W2), is removed.

The exposure apparatus, the projection exposure apparatus and the exposure method of those aspects described above are extremely effective for the step and scan type projection exposure, especially suitable for performing the double exposure in which high resolution is required in exposure.

BRIEF DESCRIPTION OF THE DRAWINGS

FIG. 19A illustrates the operation for detecting the reference mark on the fiducial mark plate based on the use of the alignment system, which shows a situation in which the reference mark MK2 on the fiducial mark plate FM1 is positioned just under the alignment system 24a;

FIG. 19B shows an example of the shape of the reference mark MK2 and a situation of image pick-up for detecting the same by using the sensor of the FIA system of the alignment system 24a.

BEST MODE FOR CARRYING OUT THE INVENTION

First Embodiment

A first embodiment of the present invention will be explained below with reference to FIGS. 1 to 18.

Figure 1:
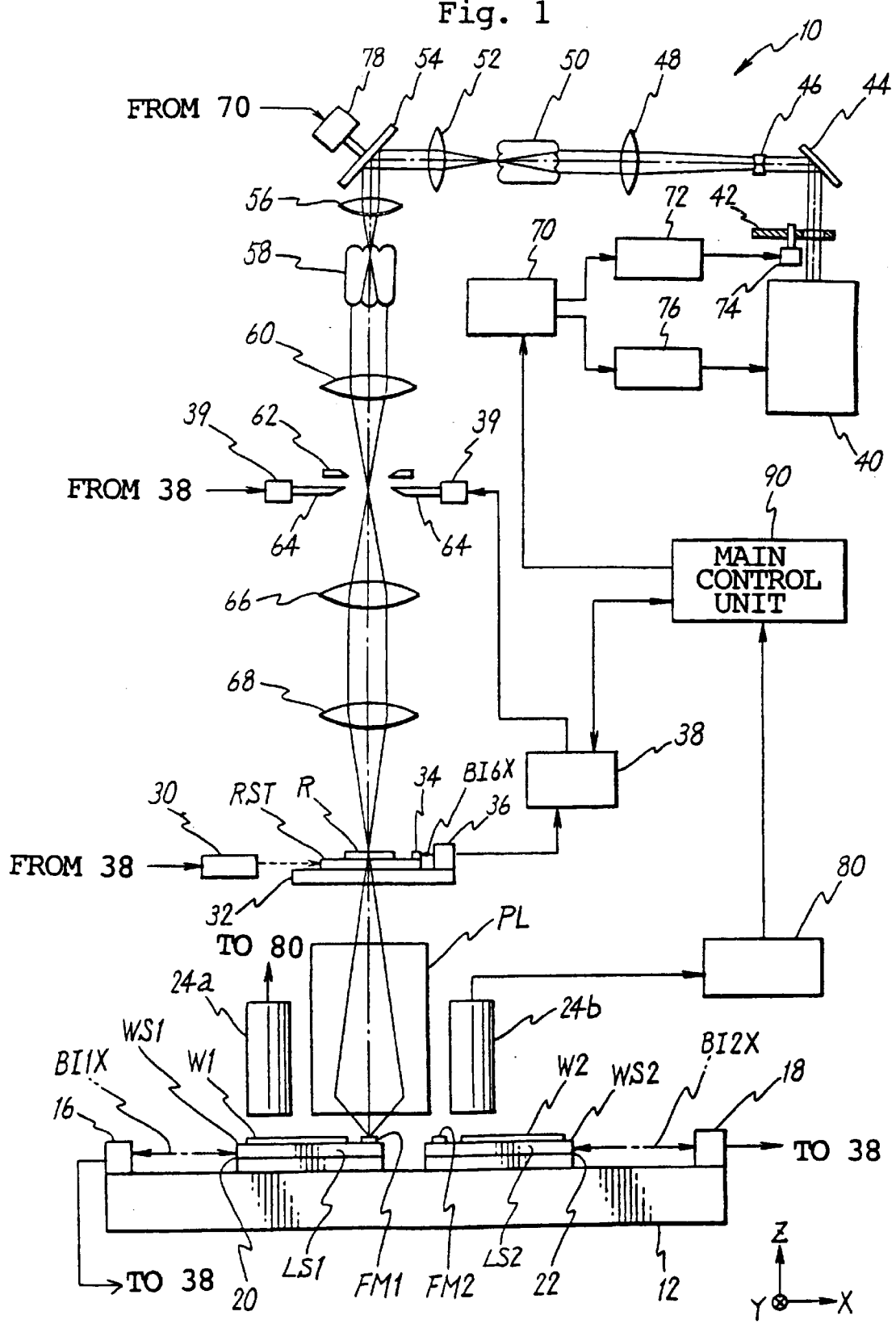
FIG. 1 shows a schematic arrangement of the projection exposure apparatus according to the first embodiment of the present invention.

FIG. 1 shows a schematic arrangement of a projection exposure apparatus 10 according to the first embodiment. The projection exposure apparatus 10 is a projection exposure apparatus of the scanning exposure type based on the so-called step-and-scan system. A structure and a controlling method of the step-and-scan system projection exposure apparatus are disclosed in U.S. Pat. Nos. 5,646,413 and 5,448,332, the disclosures of which are herein incorporated by reference.

The projection exposure apparatus 10 comprises, for example, a stage apparatus provided with wafer stages WS1, WS2 as first and second substrate stages which are independently movable in the two-dimensional direction on a base pedestal 12 while holding wafers W1, W2 as sensitive substrates, a projection optical system PL disposed over the stage apparatus, a reticle-driving mechanism disposed over the projection optical system PL, for driving a reticle R as a mask in a predetermined direction, i.e., in the Y axis direction in this embodiment (direction perpendicular to the plane of the paper in FIG. 1), an illumination system for illuminating the reticle R from a position thereover, and a control system for controlling the respective components.

Figure 2:
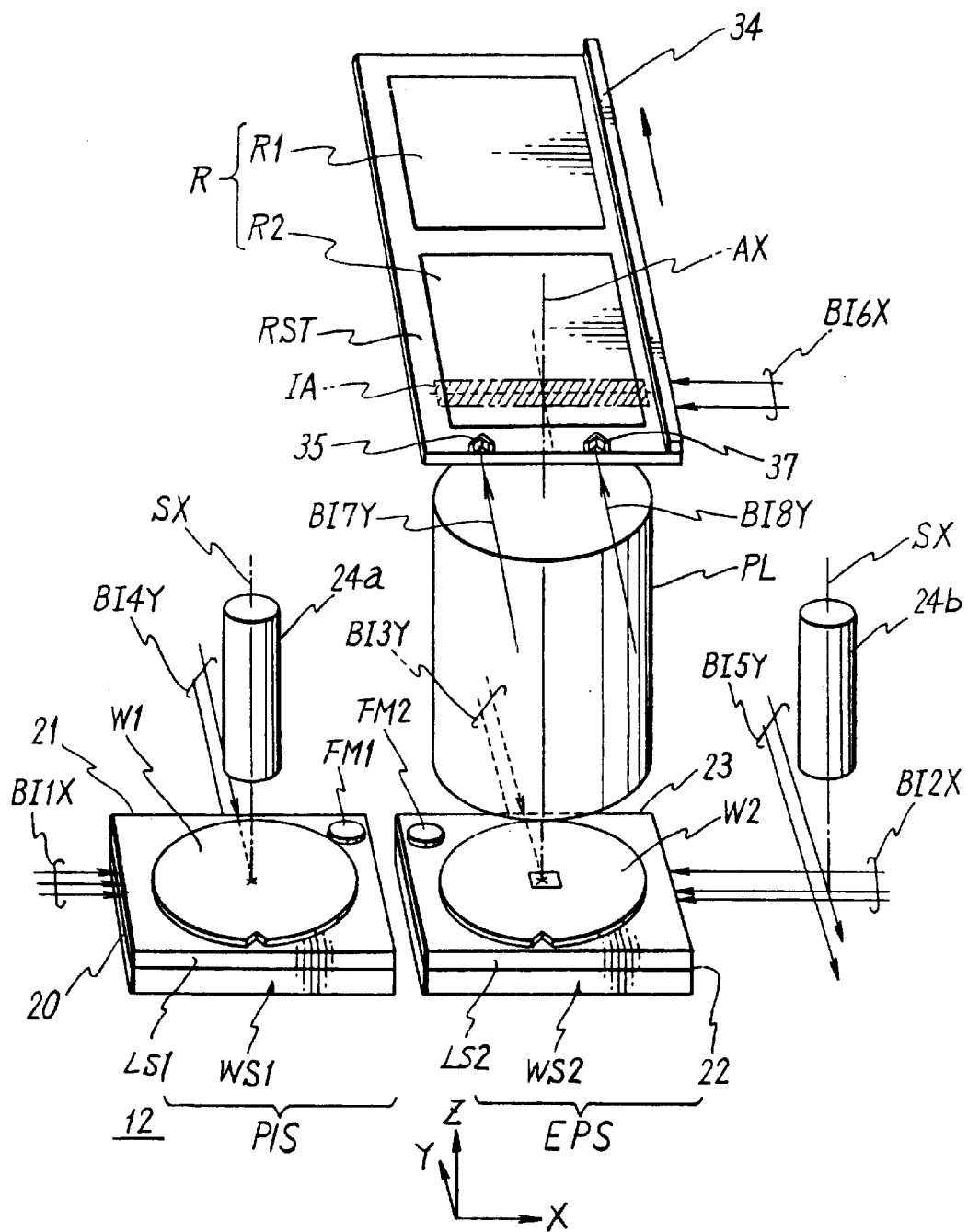
FIG. 2 is a perspective view illustrating the positional relationship among the two wafer stages, the reticle stage, the projection optical system, and the alignment systems, showing that the wafer stage WS1 exists in a position information measuring section and the wafer stage WS2 exists in an exposure section.

The stage apparatus is supported over the base pedestal 12 in a floating manner by the aid of an unillustrated air bearing. The stage apparatus comprises the two wafer stages WS1, WS2 which are independently movable two-dimensionally in the X axis direction (lateral direction along the plane of the paper shown in FIG. 1) and in the Y axis direction (direction perpendicular to the plane of the paper shown in FIG. 1), a stage-driving system for driving the wafer stages WS1, WS2, and an interferometer system for measuring the positions of the wafer stages WS1, WS2. As shown in FIG. 2, the wafer stage WS1, exists in the positional information measuring section (PIS), and the wafer stage WS2 exists in the exposure section(EPS), both stages WS1, WS2 can move between PIS and EPS, respectively.

The arrangement will be further described below. Unillustrated air pads (for example, vacuum-pre-loadable air bearings) are provided at a plurality of positions on bottom surfaces of the wafer stages WS1, WS2. The wafer stages WS1, WS2 are supported over the base pedestal 12 in a floating manner in a state in which a spacing distance of, for example, several microns is maintained in accordance with the balance between the vacuum-pre-loaded force and the air-ejecting force effected by the air pads.

Figure 3:
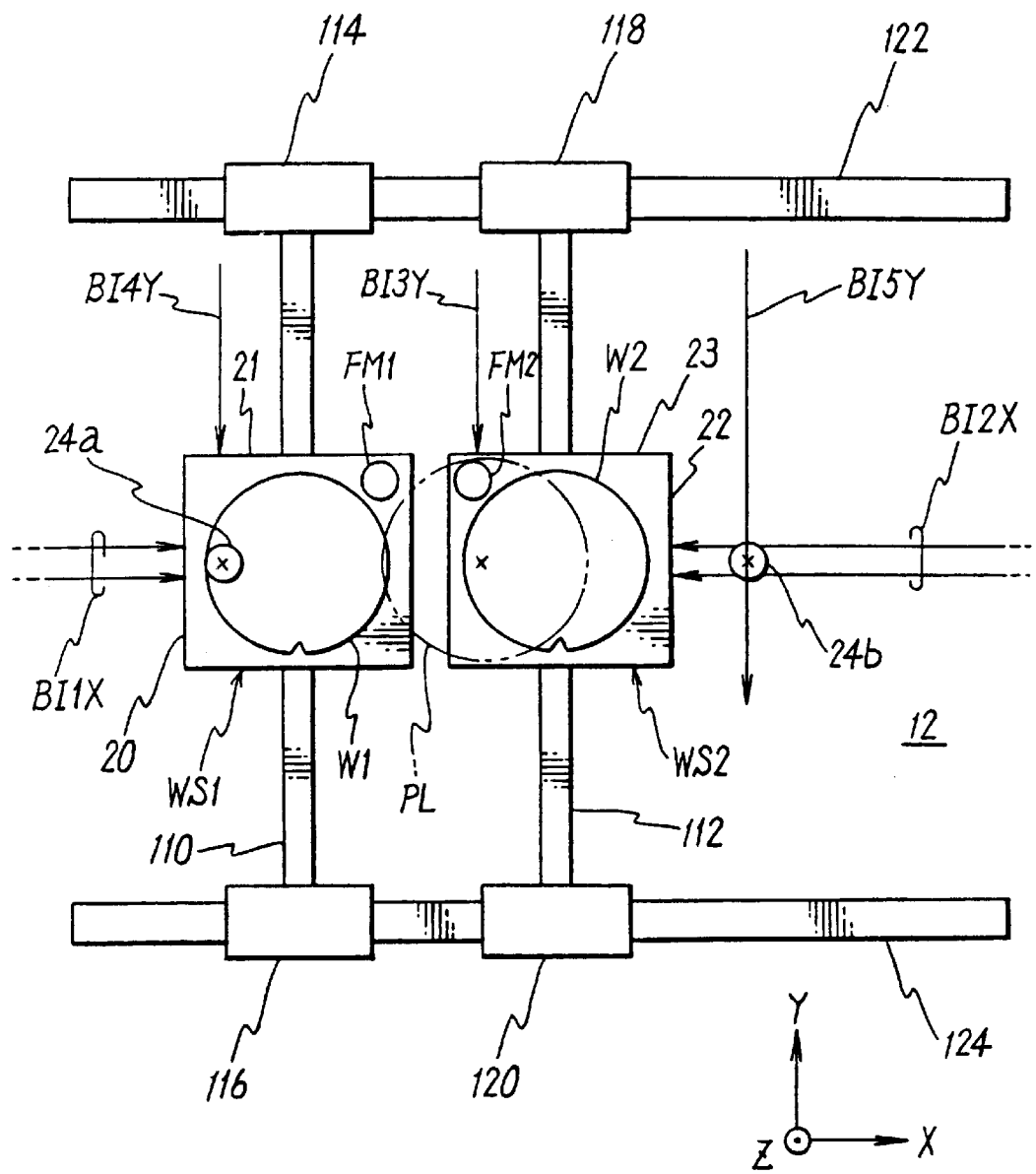
FIG. 3 shows a plan view illustrating the arrangement of the driving mechanism for the wafer stages.

As shown in a plan view in FIG. 3, two X axis linear guides (for example, fixed magnets of a linear motor of the so-called moving coil type) 122, 124, which extend in the X axis direction, are provided in parallel on the base pedestal 12. Two movable members 114, 118, 116, 120, which are movable along the X axis linear guides respectively, are attached to the X axis linear guides 122, 124 respectively. Unillustrated driving coils are attached to bottom portions of the four movable members 114, 118, 116, 120 respectively so that the X axis linear guides 122, 124 are surrounded thereby at upper and lateral sides. The moving coil type linear motors for driving the respective movable members 114, 116, 118, 120 in the X axis direction are constructed by the driving coils and the X axis linear guides 122, 124 respectively. However, in the following description, the movable members 114, 116, 118, 120 are referred to as "X axis linear motor" for convenience.

Among them, the two X axis linear motors 114, 116 are provided at both ends of a Y axis linear guide 110 extending in the Y axis direction (for example, a fixed coil of a linear motor of the moving magnet type) respectively. The other two X axis linear motors 118, 120 are secured to both ends of a similar Y axis linear guide 112 extending in the Y axis direction. Therefore, the Y axis linear guide 110 is driven along the X axis linear guides 122, 124 by means of the X axis linear motors 114, 116, while the Y axis linear guide 112 is driven along the X axis linear guides 122, 124 by means of the X axis linear motors 118, 120.

On the other hand, an unillustrated magnet, which surrounds one of the Y axis linear guides 110 at upper and lateral sides, is provided on the bottom of the wafer stage WS1. A moving magnet type linear motor for driving the wafer stage WS1 in the Y axis direction is constructed by the magnet and the Y axis linear guide 110. Further, an unillustrated magnet, which surrounds the other Y axis linear guide 112 at upper and lateral sides, is provided on the bottom of the wafer stage WS2. A moving magnet type linear motor for driving the wafer stage WS2 in the Y axis direction is constructed by the magnet and the Y axis linear guide 112.

That is, in the first embodiment of the present invention, the stage-driving system for two-dimensionally driving the wafer stages WS1, WS2 independently in the XY direction is constructed, for example, by the X axis linear guides 122, 124, the X axis linear motors 114, 116, 118, 120, the Y axis linear guides 110, 112, and the unillustrated magnets disposed on the bottoms of the wafer stages WS1, WS2. The stage-driving system is controlled by a stage control unit 38 shown in FIG. 1.

Minute yawing can be generated on the wafer stage WS1, or minute yawing can be removed therefrom, by slightly varying the torque of the pair of X axis linear motors 114, 116 provided at the both ends of the Y axis linear guide 110. Similarly, minute yawing can be generated on the wafer stage WS2, or minute yawing can be removed therefrom, by slightly varying the torque of the pair of X axis linear motors 118, 120 provided at the both ends of the Y axis linear guide 112.

Wafers W1, W2 are fixed on the wafer stages WS1, WS2 by means of, for example, vacuum suction by the aid of unillustrated wafer holders. Each of the wafer holders is finely driven in the Z axis direction perpendicular to the XY plane and in the θ direction (rotational direction about the Z axis) by means of an unillustrated Z·θ driving mechanism. Fiducial mark plates FM1, FM2, on which various fiducial marks are formed, are placed on upper surfaces of the wafer stages WS1, WS2 to be at the substantially same height as that of the wafers W1, W2 respectively. The fiducial mark plates FM1, FM2 are used, for example, when the reference position of each of the wafer stages is detected.

One side surface (left side surface in FIG. 1) 20 of the wafer stage WS1 in the X axis direction, and one side surface (back side surface as viewed in the plane of the paper in FIG. 1) 21 thereof in the Y axis direction are mirror-finished reflective surfaces. Similarly, the other side surface (right side surface in FIG. 1) 22 of the wafer stage WS22 in the X axis direction, and one side surface 23 thereof is the Y axis direction are mirror-finished reflective surfaces. Interferometer beams for respective length-measuring axes (for example, BI1X, BI2X) for constructing an interferometer system as described later on are projected onto the reflective surfaces. Reflected light beams therefrom are received by respective interferometers so as to measure displacements of the respective reflective surfaces from the reference position (in general, a fixed mirror is disposed on a side surface of the projection optical system or on a side surface of the alignment optical system, and such a position is used as the reference surface). Thus, the two-dimensional positions of the wafer stages WS1, WS2 are measured respectively. The construction of the length-measuring axes of the interferometer system will be described in detail later on.

A refractive optical system, which comprises a plurality of lens elements having a common optical axis in the Z axis direction and which is telecentric on both sides having a predetermined reduction magnification, for example, ⅕, is used as the projection optical system PL. Therefore, the velocity of movement of the wafer stage in the scanning direction during scanning exposure based on the step-and-scan system is ⅕ of the velocity of movement of the reticle stage.

As shown in FIG. 1, alignment systems 24a, 24b having the same function based on the off-axis system are installed on both sides in the X axis direction of the projection optical system PL at positions separated from the center of the optical axis of the projection optical system PL (coincident with the projection center of the image of the reticle pattern) by an identical distance respectively. The alignment systems 24a, 24b have three types of alignment sensors based on the LSA (Laser Step Alignment) system, the FIA (Field Image Alignment) system, and LIA (Laser Interferometric Alignment) system. The alignment systems 24a, 24b make it possible to perform measurement of the position in the X, Y two-dimensional direction of the reference mark on the fiducial mark plate and the alignment mark on the wafer. The LSA and LIA are disclosed in U.S. Pat. No. 5,151,750 and the FIA is disclosed in U.S. Pat. No. 5,493,403, the disclosures of which are herein incorporated by reference.

The LSA system resides in a general-purpose sensor most widely used to measure the mark position by irradiating the mark with a laser beam and utilizing a diffracted and scattered light beam. The LSA system has been hitherto widely used for process wafers. The FIA system resides in a sensor to measure the mark position by illuminating the mark with a broad band (wide zone) light beam such as a halogen lamp, and performing image processing for an obtained mark image. The FIA system is effectively used for asymmetric marks on aluminum layers and wafer surfaces. The LIA system resides in a sensor to detect positional information of the mark from a phase measured by irradiating a diffraction grating-shaped mark with laser beams having slightly different frequencies in two directions, and interfering two generated diffracted light beams. The LIA system is effectively used for wafers having small differences in level and wafers having rough surfaces.

In the first embodiment of the present invention, the three types of the alignment sensors are appropriately used depending on the purpose so that, for example, so-called search alignment is performed for measuring the approximate position of the wafer by detecting three points of one-dimensional marks on the wafer, and fine alignment is performed for measuring the accurate position of each of shot areas on the wafer.

In this embodiment, the alignment system 24a is used, for example, to measure positions of the alignment marks on the wafer W1 held on the wafer stage WS1 and the reference marks formed on the fiducial mark plate FM1. The alignment system 24b is used, for example, to measure positions of the alignment marks on the wafer W2 held on the wafer stage WS2 and the reference marks formed on the fiducial mark plate FM2.

The information, which is obtained and supplied from the respective alignment sensors for constructing the alignment systems 24a, 24b, is subjected to A/D conversion by the aid of an alignment control unit 80 to obtain a digital waveform signal which is computed and processed to detect the mark position. An obtained result is supplied to a main control unit 90 which serves as the controller. The main control unit 90 instructs the stage control unit to perform, for example, correction for the synchronization position during the exposure depending on the obtained result.

Figure 5:
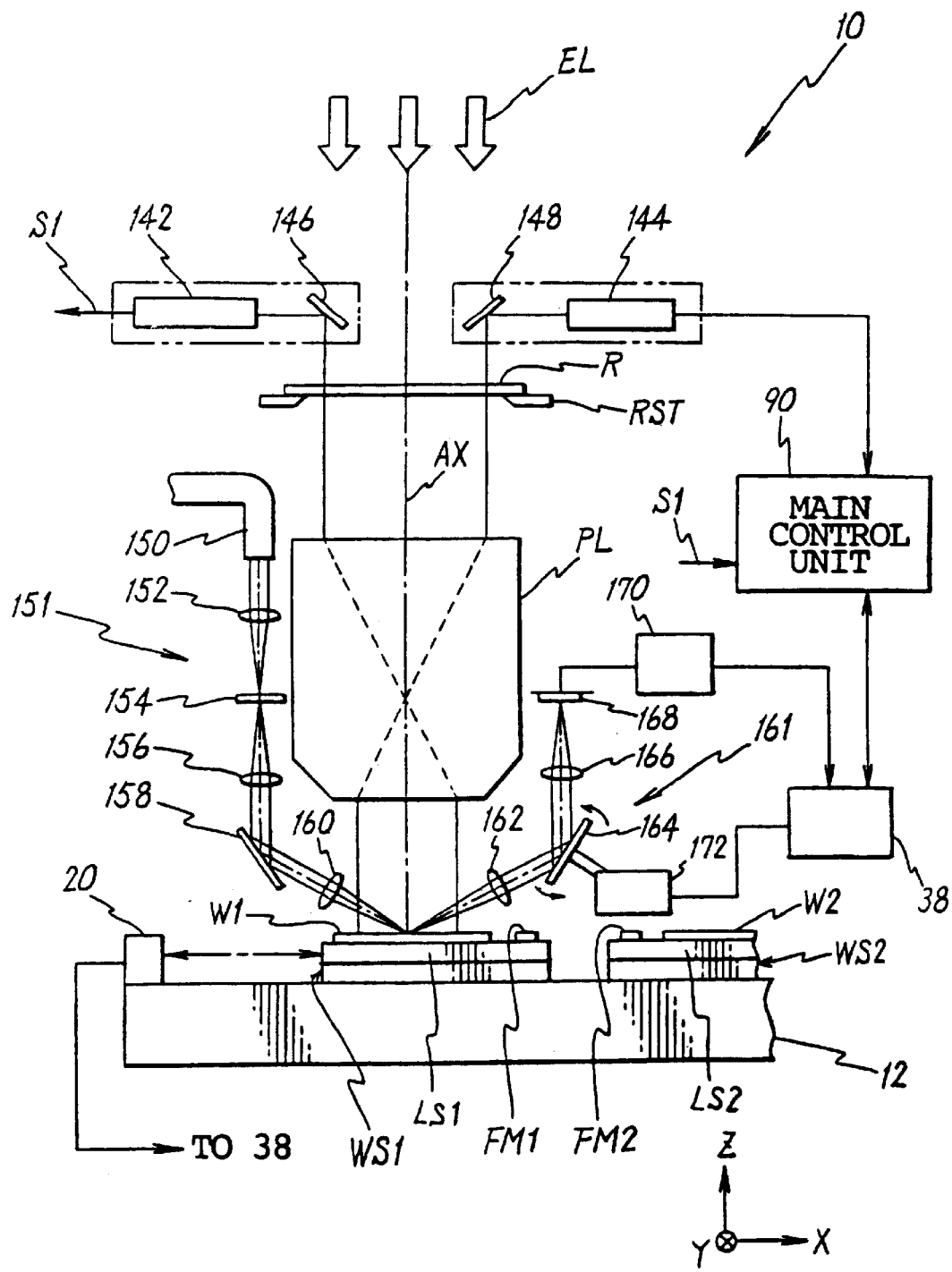
FIG. 5 shows a schematic arrangement of the projection exposure apparatus illustrating the layout of the AF/AL system and the TTR alignment system.

Further, in the exposure apparatus 10 according to the first embodiment of the present invention, although not shown in FIG. 1, a pair of reticle alignment microscopes 142, 144 are provided over the reticle R as shown in FIG. 5. Each of the reticle alignment microscopes 142, 144 comprises a TTR (Through The Reticle) alignment optical system based on the use of an exposure wavelength for simultaneously observing the reticle mark (not shown) on the reticle R and the marks on the fiducial mark plates FM1, Fm2 via the projection optical system PL. Detection signals obtained by using the reticle alignment microscopes 142, 144 are supplied to the main control unit 90. In this embodiment, polarizing mirrors 146, 148 for introducing detected light beams from the reticle R into the reticle alignment microscopes 142, 144 respectively are movably arranged. When the exposure sequence is started, the polarizing mirrors 146, 148 are retracted by means of unillustrated mirror-driving units in accordance with the command supplied from the main control unit 90 respectively. A system equivalent to the reticle alignment microscopes 142, 144 is disclosed, for example, in Japanese Laid-Open Patent Publication No. 7-176468 corresponding to U.S. Pat. No. 5,646,413 of which detailed explanation will be omitted herein.

Figure 4:
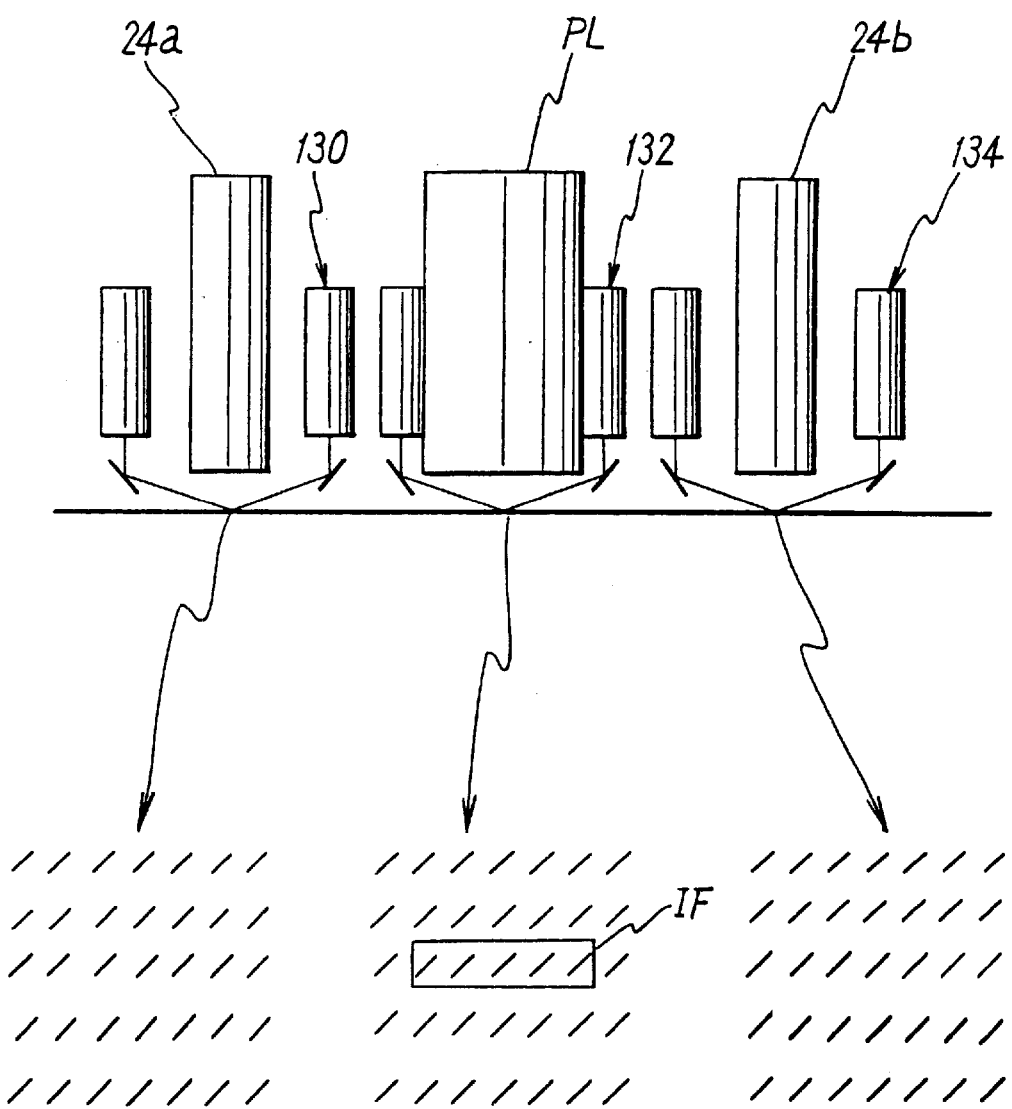
FIG. 4 shows the AF/AL systems provided for the projection optical system and the alignment systems respectively.

Although not shown in FIG. 1, autofocus/autoleveling measuring mechanisms (hereinafter referred to as "AF/AL system") 130, 132, 134 for investigating the focusing position are provided for the projection optical system PL and the alignment systems 24a, 24b respectively as shown in FIG. 4. Among them, the AF/AL system 132 as a second detecting system is provided to detect whether or not the exposure surface of the wafer W coincides with (focuses with) the image plane of the projection optical system PL within a range of the depth of focus, because it is necessary that the pattern formation plane on the reticle R is conjugate to the exposure surface of the wafer W in relation to the projection optical system PL in order to accurately transfer the pattern on the reticle R onto the wafer (W1 or W2) by means of scanning exposure. In the first embodiment of the present invention, a so-called multi-point AF system is used as the AF/AL system 132. The AF/AL system is disclosed in U.S. Pat. No. 5,502,311, the disclosure of which is herein incorporated by reference.

Now, detailed arrangement of the multi-point AF system for constructing the AF/AL system 132 will be explained with reference to FIGS. 5 and 6.

As shown in FIG. 5, the AF/AL system (multi-point AF system) 132 comprises an irradiating optical system 151 including a bundle of optical fibers 150, a light-collecting lens 152, a pattern formation plate 154, a lens 156, a mirror 158, and an irradiating objective lens 160; and a light-collecting optical system 161 including a light-collecting objective lens 162, a rotary directional vibration plate 164, an image-forming lens 166, and a light receiving unit 168.

The respective constitutive components of the AF/AL system (multi-point AF system) 132 will be now explained together with their functions.

An illumination light beam having a wavelength which is different from that of the exposure light beam EL and at which the photoresist on the wafer W1 (or W2) is not photosensitive is introduced from an unillustrated illumination light source via the optical fiber bundle 150. The illumination light beam radiated from the optical fiber bundle 150 passes through the light-collecting lens 152, and the pattern formation plate 154 is illuminated therewith. The illumination light beam transmitted through the pattern formation plate 154 passes through the lens 156, the mirror 158, and the irradiating objective lens 160, and the illumination light beam is projected onto the exposure surface of the wafer W. The image of the pattern on the pattern formation plate 154 is projected obliquely with respect to the optical axis AX, and the image is formed on the exposure surface of the wafer W1 (or W2). The illumination light beam is reflected by the wafer W1, and it is projected onto the light-receiving surface of the light receiving unit 168 via the light-collecting objective lens 162, the rotary directional vibration plate 164, and the image-forming lens 166. The image of the pattern on the pattern formation plate 154 is formed again on the light receiving surface of the light receiving unit 168. The main control unit 90 is now operated to give predetermined vibration to the rotary directional vibration plate 164 by the aid of a vibrating unit 172. Further, the main control unit 90 is operated to supply, to a signal-processing unit 170, detection signals from a large number of (specifically, the same number as that of slit patterns of the pattern formation plate 154) light-receiving elements of the light-receiving unit 168. The signal-processing unit 170 performs synchronized detection for the respective detection signals by using the driving signal of the vibrating unit 172 to obtain a large number of focus signals which are supplied to the main control unit 90 via the stage control unit 38.

Figure 6:
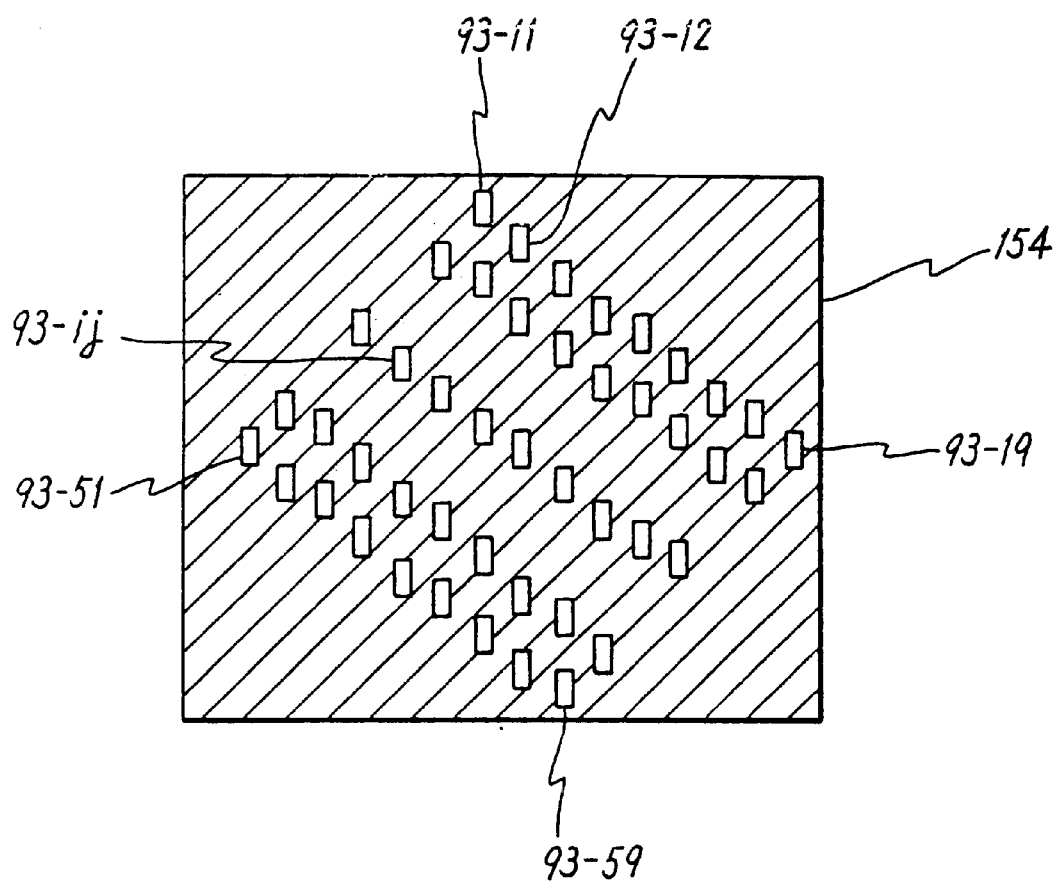
FIG. 6 shows the shape of the pattern formation plate shown in FIG. 5.

In this embodiment, as shown in FIG. 6, a slit-shaped aperture pattern 93-11 to 93-59, which comprises, for example, 5×9=45 individuals, is formed vertically on the pattern formation plate 154. The image of the slit-shaped aperture pattern is projected obliquely (at 45°) with respect to the X axis and the Y axis, onto the exposure surface of the wafer W. As a result, as shown in FIG. 4, the slit images are formed, which are arranged in matrix, and inclined by 45° with respect to the X axis and the Y axis. Reference symbol IF in FIG. 4 indicates an illumination field on the wafer conjugate to the illumination area on the reticle illuminated by the illumination system. As also clarified from FIG. 4, the detecting beam is radiated onto an area which is two-dimensionally sufficiently larger than the illumination field IF under the projection optical system PL.

The AF/AL systems 130, 134 as first detecting systems are constructed in the same manner as the AF/AL system 132. That is, the first embodiment of the present invention is constructed such that approximately the same area as that for the AF/AL system 132 used to detect the focus during exposure can be also irradiated with the detecting beam by using the AF/AL mechanisms 130, 134 used when the alignment mark is measured. Accordingly, highly accurate alignment measurement can be performed by measuring the position of the alignment mark while executing the autofocus/autoleveling based on the use of the measurement and control of the AF/AL system similar to those performed during exposure, upon measurement by using the alignment sensors based on the use of the alignment systems 24a, 24b. In other words, no offset (error) occurs due to the posture of the stage, between the process of exposure and the process of alignment.

Next, the reticle-driving mechanism will be explained with reference to FIGS. 1 and 2. The reticle-driving mechanism comprises a reticle stage RST which is movable in the XY two-dimensional direction over a reticle base plate 32 while holding the reticle R, an unillustrated linear motor for driving the reticle stage RST, and a reticle interferometer system for managing the position of the reticle stage RST.

The arrangement of the reticle-driving mechanism will be described in further detail below. As shown in FIG. 2, the reticle stage RST is constructed such that two sheets of reticles R1, R2 are placed in series in the scanning direction (Y axis direction). The reticle stage RST is supported in a floating manner over the reticle base plate 32 by the aid of, for example, an unillustrated air bearing. The reticle stage RST is subjected to fine driving in the X axis direction, minute rotation in the θ direction, and scanning driving in the Y axis direction by the aid of a driving mechanism 30 (see FIG. 1) comprising, for example, an unillustrated linear motor. The driving mechanism 30 is a mechanism which uses a linear motor as a driving source similar to the stage apparatus described above. However, the driving mechanism 30 is indicated as a simple block in FIG. 1 for illustrative and explanatory purposes. Accordingly, the reticles R1, R2 on the reticle stage RST are selectively used, for example, upon double exposure, in which each of the reticles can be subjected to scanning in synchronization with the wafer.

A parallel flat plate movement mirror 34, which is composed of the same material (for example, a ceramic) as that of the reticle stage RST, is provided at an end on one side in the X axis direction on the reticle stage RST to extend in the Y axis direction. A refractive surface, which is formed by means of mirror-finish processing, is formed on one side surface of the movement mirror 34 in the X axis direction. An interferometer beam is radiated onto the reflective surface of the movement mirror 34 from the interferometer indicated by the length-measuring axis BI6X for constructing the interferometer system 36 shown in FIG. 1. The reflected light beam is received by the interferometer to measure the relative displacement with respect to the reference plane in the same manner as performed for the wafer stage. Thus, the position of the reticle stage RST is measured. In this embodiment, the interferometer having the length-measuring axis BI6X actually has two interferometer optical axes capable of performing measurement independently, making it possible to measure the position of the reticle stage in the X axis direction and measure the yawing amount. The interferometer having the length-measuring axis BI6X is used to perform synchronization control in the X direction and rotational control of the reticle stage RST in the direction to cancel the relative rotation (rotational error) between the reticle and the wafer on the basis of the information on the X position and the information on the yawing of the wafer stages WS1, WS2 supplied from the interferometers 16, 18 having length-measuring axes BI1X, BI2X disposed on the wafer stage side as described later on.

On the other hand, a pair of corner cube mirrors 35, 37 are installed on the other side (front side in the plane of the paper in FIG. 1) of the reticle stage RST in the Y axis direction as the scanning direction. Interferometer beams, which are represented by length-measuring axes BI7Y, BI8Y in FIG. 2, are radiated from a pair of unillustrated double-path interferometers to the corner cube mirrors 35, 37. The beams are returned to the reflective surface of the reticle base plate 32 by the corner cube mirrors 35, 37. The respective reflected light beams reflected thereby return via the same optical paths, and they are received by the respective double-path interferometers. Thus, the relative displacements of the respective corner cube mirrors 35, 37 are measured with respect to the reference position (the reflective surface on the reticle base plate 32 as the reference position). Measured values obtained by the double-path interferometers are supplied to the stage control unit 38 shown in FIG. 1 to obtain an average value thereof on the basis of which the position of the reticle stage RST in the Y axis direction is measured. The information on the position in the Y axis direction is used for calculation of the relative position between the reticle stage RST and the wafer stage WS1 or WS2 on the basis of the measured value obtained by the interferometer disposed on the wafer side and having the length-measuring axis BI3Y. Further, the information is used for synchronization control between the reticle and the wafer in the scanning direction (Y axis direction) during the scanning exposure based thereon.

That is, in the first embodiment of the present invention, the reticle interferometer system is constructed by the interferometer 36 and the pair of double-path interferometers represented by the length-measuring axes BI7Y, BI8Y.

Next, an interferometer system for managing the positions of the wafer stages WST1, WST2 will be explained with reference to FIGS. 1 to 3.

As shown in FIGS. 1 to 3, the interferometer beam, which is represented by the first length-measuring axis BI1X from the interferometer 16 shown in FIG. 1, is radiated onto the surface of the wafer stage WS1 on one side in the X axis direction along the first axis (X axis) passing through the projection center of the projection optical system PL and the respective detection centers of the alignment systems 24a, 24b. Similarly, the interferometer beam, which is represented by the second length-measuring axis BI2X from the interferometer 18 shown in FIG. 1, is radiated onto the surface of the wafer stage WS2 on the other side in the X axis direction along the first axis. Reflected light beams therefrom are received by the interferometers 16, 18 so as to measure the relative displacements of the respective reflective surfaces from the reference position and measure the positions of the wafer stages WS1, WS2 in the X axis direction. In this embodiment, as shown in FIG. 2, each of the interferometers 16, 18 is a three-axis interferometer having three optical axes, making it possible to perform tilt measurement and θ measurement, in addition to the measurement for the wafer stages WS1, WS2 in the X axis direction. Output values for the respective optical axes can be independently measured. In this embodiment, unillustrated θ stages for performing θ rotation for the wafer stages WS1, WS2, and Z-leveling stages RS1, RS2 as substrate-driving systems for performing minute driving and driving for inclination in the Z axis direction are actually disposed under the reflective surfaces (20–23). Accordingly, all of the driving amounts concerning tilt control of the wafer stages can be monitored by using the interferometers 16, 18 (substrate-driving system).

The respective interferometer beams represented by the first length-measuring axis BI1X and the second length-measuring axis BI2X always hit the wafer stages WS1, WS2 in the all regions of the movement range of the wafer stages WS1, WS2. Therefore, as for the X axis direction, the positions of the wafer stages WS1, WS2 are managed on the basis of measured values obtained by using the first length-measuring axis BI1X and the second length-measuring axis BI2X at any time of, for example, the exposure based on the use of the projection optical system PL and the use of the alignment systems 24a, 24b.

As shown in FIGS. 2 and 3, the projection exposure apparatus is provided with an interferometer having a third length-measuring axis BI3Y perpendicularly intersecting the first axis (X axis) at the projection center of the projection optical system PL, and interferometers having length-measuring axes BI4Y, BI5Y respectively as fourth length-measuring axes perpendicularly intersecting the first axis (X axis) at the respective detection centers of the alignment systems 24a, 24b. However, only the length-measuring axes are shown in the drawings.

In the case of the first embodiment of the present invention, the measured values obtained by using the interferometer having the length-measuring axis BI3Y passing through the projection center of the projection optical system, i.e., the optical axis AX are used to measure the positions of the wafer stages WS1, WS2 in the Y direction during the exposure based on the use of the projection optical system PL. The measured value obtained by using the length-measuring axis BI4Y passing through the detection center of the alignment system 24a, i.e., the optical axis SX is used to measure the position of the wafer stage WS1 in the Y direction during the use of the alignment system 24a. The measured value obtained by using the length-measuring axis BI5Y passing through the detection center of the alignment system 24b, i.e., the optical axis SX is used to measure the position of the wafer stage WS2 in the Y direction during the use of the alignment system 24b.

Therefore, the length-measuring axis of the interferometer in the Y direction is deviated from the reflective surface of the wafer stage WS1, WS2 depending on the respective conditions of use. However, at least one of the length-measuring axes, i.e., the length-measuring axes BI1X, BI2X are not deviated from the reflective surfaces of the respective wafer stages WS1, WS2. Accordingly, it is possible to reset the interferometer on the Y side at an appropriate position at which the optical axis of the interferometer to be used enters the reflective surface. The method for resetting the interferometer will be described in detail later on.

The respective interferometers having the length-measuring axes BI3Y, BI4Y, BI5Y for Y measurement are two-axis interferometers each having two optical axes. They are capable of performing tilt measurement in addition to the measurement in the Y axis direction for the wafer stages WS1, WS2. Output values concerning the respective optical axes can be measured independently.

In the first embodiment of the present invention, the interferometer system for managing the two-dimensional coordinate positions of the wafer stages WS1, WS2 is constructed by the five interferometers in total including the interferometers 16, 18 and the three interferometers having the length-measuring axes BI3Y, BI4Y, BI5Y.

In the first embodiment of the present invention, the exposure sequence is executed on one of the wafer stages WS1, WS2, while the wafer exchange/wafer alignment sequence is executed on the other of the wafer stages WS1, WS2 as described later on. During this process, in order not to cause any interference between the both stages, the movement of the wafer stages WS1, WS2 is managed by the stage control unit 38 in accordance with the command given by the main control unit 90 on the basis of the output values obtained by the respective interferometers.

Further, the main control unit 90 shown in FIG. 1 is provided with a memory 91 as a storing device in which, for example, a conditional expression (for example, for interference condition) is stored for managing the movement of the wafer stages WS1, WS2.

Next, the illumination system will be explained with reference to FIG. 1. As shown in FIG. 1, the illumination system comprises, for example, an exposure light source 40, a shutter 42, a mirror 44, beam expanders 46, 48, a first fly's eye lens 50, a lens 52, a vibration mirror 54, a lens 56, a second fly's eye lens 58, a lens 60, a fixed blind 62, a movable blind 64, and relay lenses 66, 68.

The respective components of the illumination system will now be explained together with their functions. A laser beam is radiated from the light source unit 40 composed of a KrF excimer laser as a light source and a light-reducing system (for example, a light-reducing plate, an aperture diaphragm). The laser beam passes through the shutter 42, and then it is polarized by the mirror 44, followed by being shaped to have an appropriate beam diameter by means of the beam expanders 46, 48. The laser beam comes into the first fly's eye lens 50. The light beam coming into the first fly's eye lens 50 is divided into a plurality of light beams by elements of the fly's eye lens arranged two-dimensionally. The respective light beams come into the second fly's eye lens 58 again at different angles respectively by the aid of the lens 52, the vibration mirror 54, and the lens 56. The light beam outgoing from the second fly's eye lens 58 passes through the lens 60, and it arrives at the fixed blind 62 installed at a position conjugate to the reticle R. At this position, the light beam is defined to have a predetermined cross-sectional configuration, and it passes through the movable blind 64 disposed at a position slightly de-focused from the conjugate plane of the reticle R. The light beams passes through the relay lenses 66, 68, and it is used as a uniform illumination light beam to illuminate a predetermined shape, i.e., a rectangular slit-shaped illumination area IA (see FIG. 2) on the reticle R defined by the fixed blind 62.

Next, the control system will be explained with reference to FIG. 1. The control system centers the main control unit 90, as a controller, for controlling and supervising the entire apparatus, and it comprises, for example, the exposure amount control unit 70 and the stage control unit 38 which are under the control of the main control unit 90.

Explanation will now be made mainly for the operations of the respective constitutive components of the control system as well as the operation of the projection exposure apparatus 10 according to the first embodiment of the present invention during the exposure.

Prior to the start of the synchronized scanning for the reticle R and the wafer (W1 or W2), the exposure amount control unit 70 instructs a shutter-driving unit 72 to drive a shutter-driving unit 74 so that the shutter 42 is opened.

After that, the stage control unit 38 starts synchronized scanning (scan control) for the reticle R and the wafer (W1 or W2), i.e., the reticle stage RST and the wafer stage (WS1 or WS2) in accordance with the instruction given by the main control unit 90. The synchronized scanning is performed by controlling the respective linear motors for constructing the reticle-driving unit 30 and the driving system for the wafer stages by using the stage control unit 38 while monitoring the measured values obtained by the length-measuring axis BI3Y and the length-measuring axis BI1X or BI2X of the interferometer system and the length-measuring axes BI7Y, BI8Y and the length-measuring axis BI6X or the reticle interferometer system.

At the point of time at which the both stages have been subjected to constant velocity control within a predetermined allowable range, the exposure amount control unit 70 instructs a laser control unit 76 to start pulse light emission. Accordingly, the rectangular illumination area IA on the reticle R, on which a pattern is chromium vapor-deposited on its lower surface, is illuminated with the illumination light beam emitted from the illumination system. The image of the pattern in the illumination area is reduced 1/5-fold by the aid of the projection optical system PL, and it is projected for exposure onto the wafer (W1 or W2) applied with a photoresist on its surface. In this embodiment, as also clarified from FIG. 2, the slit width of the illumination area IA in the scanning direction is narrow as compared with the pattern area on the reticle. The image of the entire surface of the pattern is successively formed on the shot area on the wafer by performing synchronized scanning for the reticle R and the wafer (W1 or W2) as described above.

Simultaneously with the start of the pulse light emission described above, the exposure amount control unit 70 instructs a mirror-driving unit 78 to vibrate the vibration mirror 54 so that the vibration of the vibration mirror is continuously performed until the pattern area on the reticle R completely passes over the illumination area IA (see FIG. 2), i.e., until the image on the entire surface of the pattern is formed on the shot area on the wafer. Thus, the non-uniformity of interference fringe is reduced, which would be otherwise produced on account of the two fly's eye lenses 50, 58. The structure and the controlling method of the vibration mirror are disclosed in U.S. Pat. No. 5,534,970, the disclosure of which is herein incorporated by reference.

The movable blind 64 is driven and controlled by the blind control unit 39 in synchronization with the scanning for the reticle R and the wafer W so that the illumination light does not leak out to the outside of the shielding area on the reticle at the shot edge portion during the scanning exposure. The series of synchronized operations are managed by the stage control unit 38.

In relation to the pulse light emission effected by the laser control unit 76 described above, it is necessary to emit light n times (n is a positive integer) during a period in which an arbitrary point on the wafer W1, W2 passes over the width (w) of the illumination field. Therefore, it is necessary to satisfy the following expression (1) provided that the oscillation frequency is f, and the wafer scanning velocity is V. The control of the pulse light emission is disclosed in U.S. Pat. No. 5,591,958, the disclosure of which is herein incorporated by reference.

$$f/n = V/w \qquad (1)$$

Further, it is necessary to satisfy the following expression (2) provided that the radiation energy of one pulse radiated onto the wafer is P, and the resist sensitivity is E.

$$nP = E \qquad (2)$$

As described above, the exposure amount control unit 70 is constructed such that computing operation is performed for all variable quantities of the radiation energy P and the oscillation frequency f to give a command to the laser control unit 76 so that the light-reducing system provided in the exposure system source 40 is controlled. Thus, the radiation energy P and the oscillation frequency f are varied, and the shutter-driving unit 72 and the mirror-driving unit 78 are controlled.

Further, for example, when correction is made for the movement start positions (synchronization positions) of the reticle stage and the wafer stage to be subjected to the synchronized scanning during the scanning exposure, the main control unit 90 instructs the stage control unit 38 which controls the movement of the respective stages to make correction for the stage position corresponding to an amount of correction.

The projection exposure apparatus according to the first embodiment of the present invention further comprises a first transport system for performing wafer exchange between itself and the wafer stage WS1, and a second transport system for performing wafer exchange between itself and the wafer stage WS2.

Figure 7:
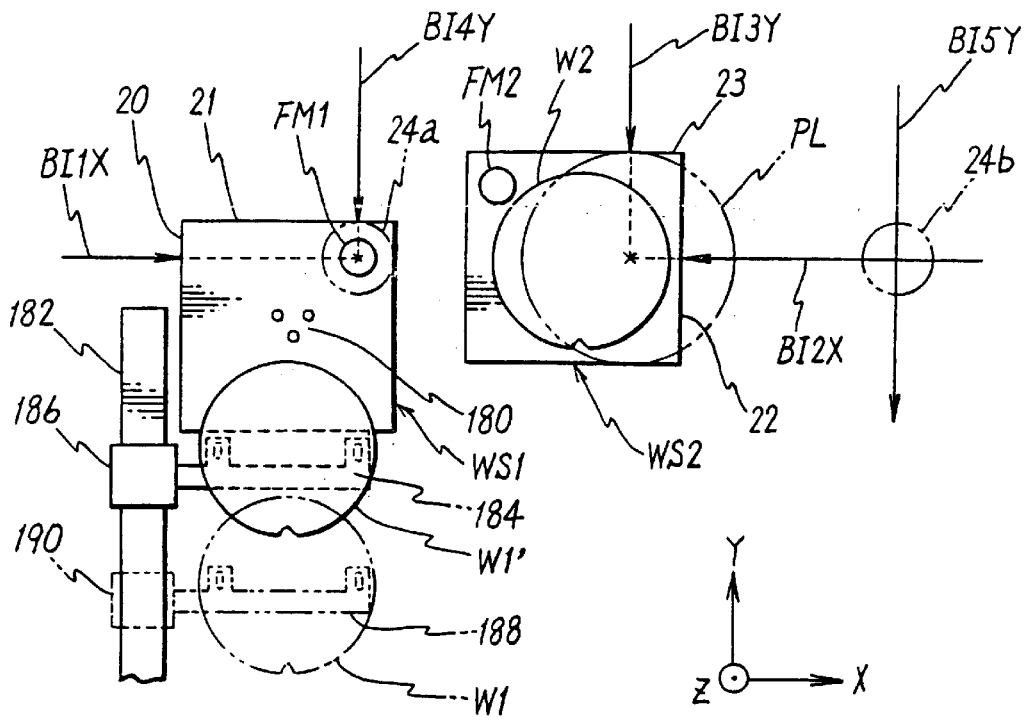
FIG. 7 shows a plan view illustrating the state in which the wafer exchange/alignment sequence and the exposure sequence are executed by using the two wafer stages.

As shown in FIG. 7, the first transport system performs wafer exchange as described later on between itself and the wafer stage WS1 disposed at a wafer loading position on the left side. The side transport system comprises a first wafer loader including, for example, a first loading guide 182 which extends in the Y axis direction, first and second sliders 186, 190 which are movable along the loading guide 182, a first unload arm 184 which is attached to the first slider 186, and a first load arm 188 which is attached to the second slider 190, and a first center-up 180 including three vertically movable members provided on the wafer stage WS1.

The operation of wafer exchange effected by the first transport system will now be briefly explained. As shown in FIG. 7, explanation will be made for a case in which the wafer W1' placed on the wafer stage WS1 disposed at the wafer loading position on the left side is exchanged with the wafer W1 transported by the first wafer loader.

At first, the main control unit 90 is operated to turn-off vacuum attraction effected by the unillustrated wafer holder on the wafer stage WS1 by the aid of an unillustrated switch so that attraction for the wafer W1' is de-energized.

Next, the main control unit 90 is operated to drive and raise the center-up 180 by a predetermined amount by the aid of an unillustrated center-up-driving system. Accordingly, the wafer W1' is lifted up to a predetermined position. In this state, the main control unit 90 instructs an unillustrated wafer loader control unit to move the first unload arm 184. Accordingly, the first slider 186 is driven and controlled by the wafer loader control unit. The first unload arm 184 is moved to a position over the wafer stage WS1 along the loading guide 182, and it is located at the position just under the wafer W1'.

In this state, the main control unit 90 is operated to downwardly drive the center-up 180 to a predetermined position. During the downward movement of the center-up 180, the wafer W1' is transmitted to and received by the first unload arm 184. Therefore, the main control unit 90 instructs the wafer loader control unit to start vacuum attraction for the first unload arm 184. Accordingly, the wafer W1' is attracted and held by the first unload arm 184.

Next, the main control unit 90 instructs the wafer loader control unit to start retraction of the first unload arm 184 and movement of the first load arm 188. Accordingly, the first unload arm 184 starts movement in the −Y direction in FIG. 7 integrally with the first slider 186, simultaneously with which the second slider 190 starts movement in the +Y direction integrally with the first load arm 188 which holds the wafer W1. When the first load arm 188 arrives at a position over the wafer stage WS1, the wafer loader control unit stops movement of the second slider 190, and the vacuum attraction for the first load arm 188 is de-energized.

In this state, the main control unit 90 is operated to upwardly drive the center-up 180. Thus, the underlying center-up 180 is allowed to lift up the wafer W1. Next, the main control unit 90 instructs the wafer loader control unit to retract the load arm. Accordingly, the second slider 190 starts movement in the −Y direction integrally with the first load arm 188, and the first load arm 188 is retracted. Simultaneously with the start of retraction of the first load arm 188, the main control unit 90 starts downward driving for the center-up 180. Thus, the wafer W1 is placed on the unillustrated wafer holder on the wafer stage WS1, and vacuum attraction effected by the wafer holder is turned on. Accordingly, a series of sequence for wafer exchange is completed.

Figure 8:
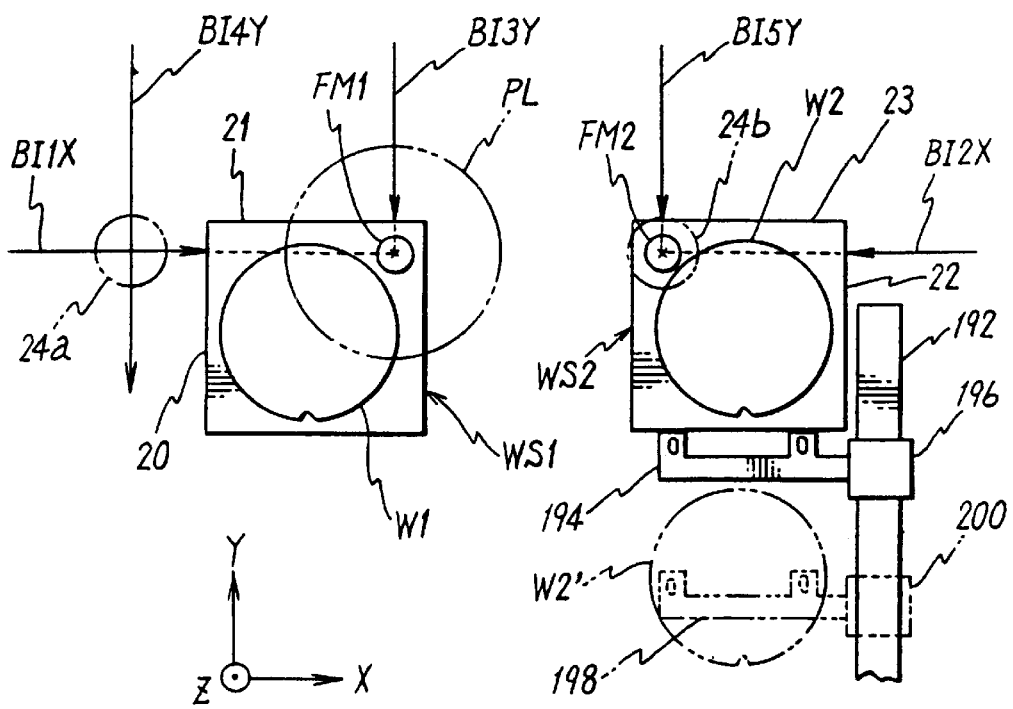
FIG. 8 shows the state obtained after the change between the wafer exchange/alignment sequence and the exposure sequence shown in FIG. 7.

Similarly, as shown in FIG. 8, a second transport system performs wafer exchange in the same manner as described above between itself and the wafer stage WS2 disposed at a wafer loading position on the right side. The second transport system comprises a second wafer loader including, for example, a second loading guide 192 which extends in the Y axis direction, third and fourth sliders 196, 200 which are movable along the second loading guide 192, a second unload arm 194 which is attached to the third slider 196, and a second load arm 198 which is attached to the fourth slider 200, and an unillustrated second center-up provided on the wafer stage WS2.

Next, explanation will be made with reference to FIGS. 7 and 8 for the concurrent or parallel process based on the use of the two wafer stages, which is the feature of the first embodiment of the present invention.

FIG. 7 shows a plan view of a state in which the wafer is exchanged between the wafer stage WS1 and the first transport system as described above at the left loading position, during the period in which the exposure operation is performed for the wafer W2 on the wafer stage WS2 by the aid of the projection optical system PL. In this process, after performing the wafer exchange, the alignment operation is continuously performed on the wafer stage WS1 as described later on. In FIG. 7, the position of the wafer stage WS2 during the exposure operation is controlled on the basis of measured values obtained by using the length-measuring axes BI2X, BI3Y of the interferometer system. The position of the wafer stage WS1, on which the wafer exchange and the alignment operation are performed, is controlled on the basis of measured values obtained by using the length-measuring axes BI1X, BI4Y of the interferometer system.

Figure 19A:
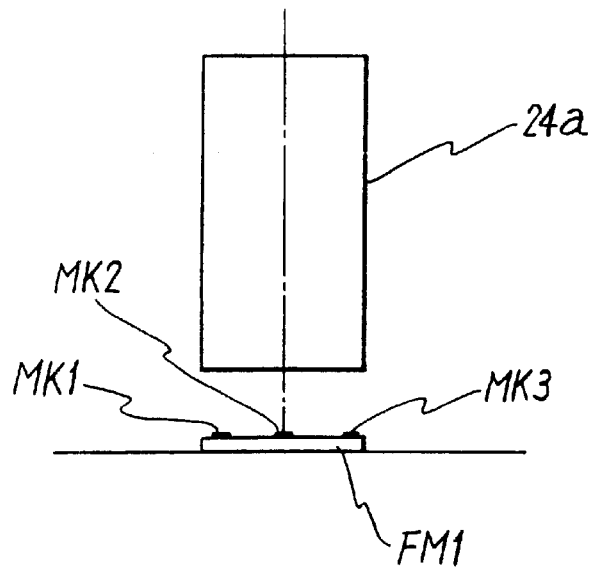

At the left loading position shown in FIG. 7, the arrangement is made such that the reference mark on the fiducial mark plate FM1 of the wafer stage WS1 is disposed just under the alignment system 24a (See FIG. 19A). Accordingly, the main control unit 90 carries out reset for the interferometer having the length-measuring axis BI4Y of the interferometer system prior to the measurement of the reference mark on the fiducial mark plate FM1, performed by using the alignment system 24a.

Figure 19B:
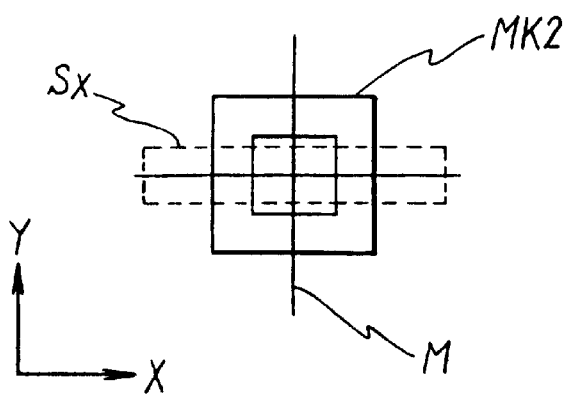

FIG. 19B shows an example of the reference mark MK2 and a situation of image pick-up for detecting the reference mark MK2 by using the sensor of the FIA system of the alignment system 24a. In FIG. 19B, a symbol Sx indicates an image pick-up range for CCD. A cross-shaped mark indicated by a symbol M indicates an index included in the sensor of the FIA system. In this drawing, only the image pick-up range in the X axis direction is depicted. However, actually, it is a matter of course that a similar image pick-up procedure is also executed in the Y direction.

Figure 19C:
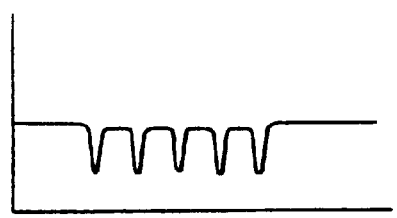
FIG. 19C shows a waveform signal obtained by the image processing system when the image of the mark MK2 is picked up by using the sensor of the FIA system.

FIG. 19C shows a waveform signal obtained by using an image processing system included in the alignment control unit 80 when the image of the mark MK2 shown in FIG. 19B is picked up by using the sensor of the FIA system. The alignment control unit 80 analyzes the waveform signal to detect the position of the mark MK2 on the basis of the index center. The main control unit 90 calculates the coordinate position of the mark MK2 on the fiducial mark plate FM in a coordinate system (hereinafter referred to as "first stage coordinate system", if necessary) based on the use of the length-measuring axes BI1X, BI4Y, on the basis of the position of the mark MK2 and the result of measurement effected by using the length-measuring axes BI1X, BI4Y.

Search alignment is performed continuously after the wafer exchange and the reset for the interferometer described above. The search alignment, which is performed after the wafer exchange, is pre-alignment performed again on the wafer stage WS1, because the positional error is large if pre-alignment is performed during only the period of transport of the wafer W1. Specifically, positions of three search alignment marks (not shown), which are formed on the wafer W1 placed on the stage WS1, are measured by using, for example, the sensor of the LSA system of the alignment system 24a. Positional adjustment is performed for the wafer W1 in the X, Y θ directions on the basis of obtained results of the measurement. During the search alignment, the operations of the respective components are controlled by the main control unit 90.

After completion of the search alignment, fine alignment is performed to determine the arrangement of the respective shot areas on the wafer W1 by using EGA in this embodiment. The method of EGA is disclosed in U.S. Pat. No. 4,780,617, the disclosure of which is incorporated herein by reference. Specifically, positions of the alignment marks of predetermined sample shots on the wafer W1 are measured by using, for example, the sensor of the FIA system of the alignment system 24a while successively moving the wafer stage WS1 on the basis of designed shot array data (data on alignment mark positions), while managing the position of the wafer stage WS1 by using the interferometer system (length-measuring axes BI1X, BI4Y). All shot array data are computed in accordance with statistical operation based on the least square method on the basis of obtained results of the measurement and the designed coordinate data on the shot array. During the process of EGA, the operations of the respective components are controlled by the main control unit 90. The computing operation described above is performed by the main control unit 90. The main control unit 90 calculates the relative positional relationship for the respective shots with respect to the mark MK2 by subtracting the coordinate position of the reference mark MK2 from the coordinate positions of the respective shots.

As described above, in the case of the first embodiment of the present invention, the position of the alignment mark is measured while executing autofocus/autoleveling based on the measurement and control effected by the AF/AL system 132 (see FIG. 4) in the same manner as performed during the exposure, during the measurement performed by the alignment system 24a. Thus, it is possible to avoid occurrence of any offset (error) which would be otherwise caused between the process of alignment and the process of exposure, due to the posture of the stage.

Figure 9:
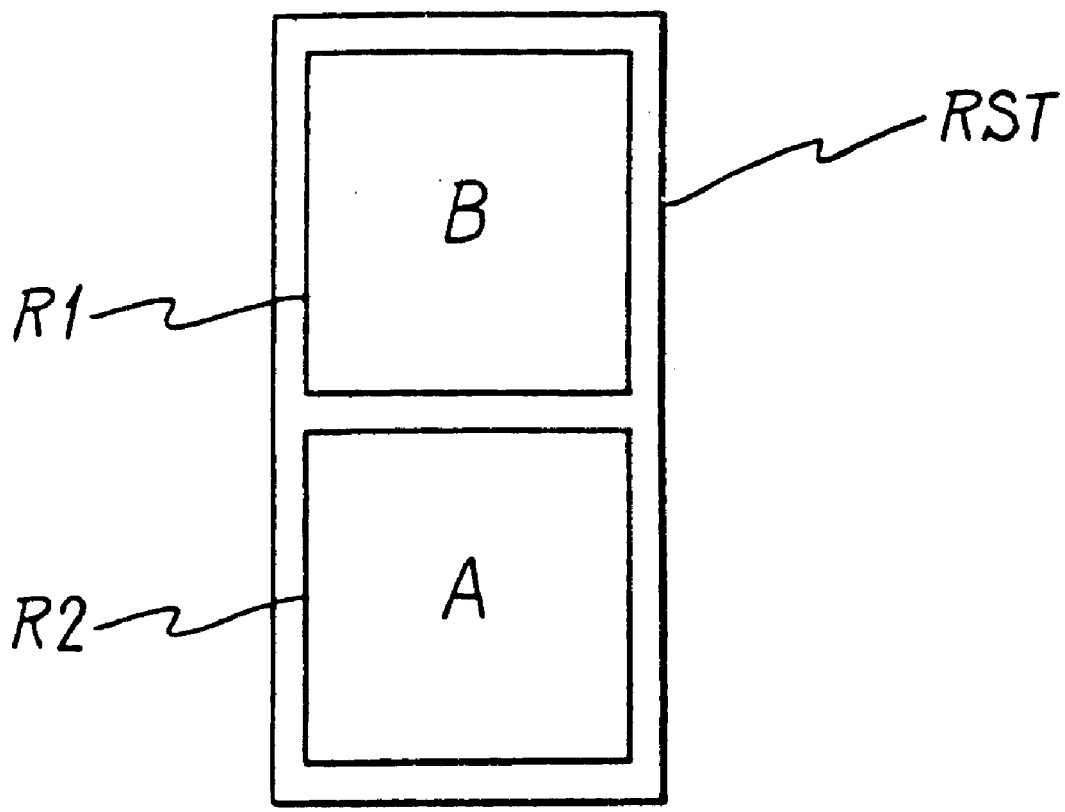
FIG. 9 shows the reticle stage for the double exposure for holding the two reticles.

During the period in which the wafer exchange and the alignment operation are performed for the wafer stage WS1 as described above, double exposure is performed for the wafer stage WS2 in a continuous manner in accordance with the step-and-scan system while changing the exposure condition by using two reticles R1, R2 as shown in FIG. 9.

Specifically, the relative positional relationship for the respective shots with respect to the mark MK2 has been previously calculated in the same manner as performed for the wafer W1. The shot areas on the wafer W2 are successively positioned under the optical axis of the projection optical system PL, on the basis of obtained results of the calculation and results of detection of relative positions of the marks MK1, MK3 on the fiducial mark plate FM1 and projected images on the wafer surface, of the marks RMK1, RMK3 on the reticle corresponding thereto based on the use of the reticle alignment microscopes 144, 142 (this process will be described in detail later on), while the reticle stage RST and the wafer stage WS2 are subjected to synchronized scanning in the scanning direction very time when each of the shot areas is subjected to exposure. Thus, the scanning exposure is carried out.

Figure 10A:
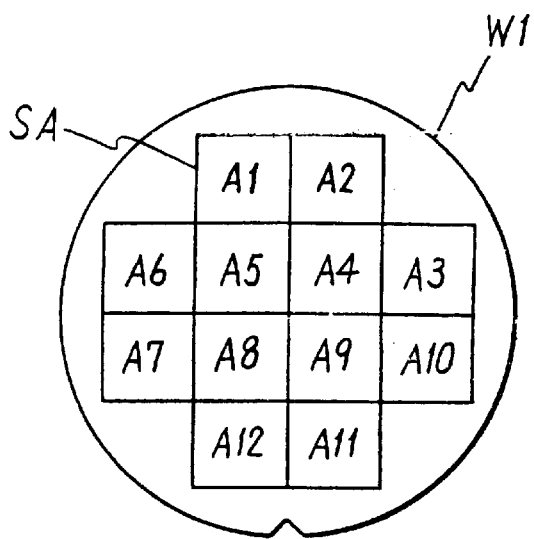
FIG. 10A shows the state in which the wafer is exposed by using the reticle having the pattern A shown in FIG. 9.
Figure 10B:
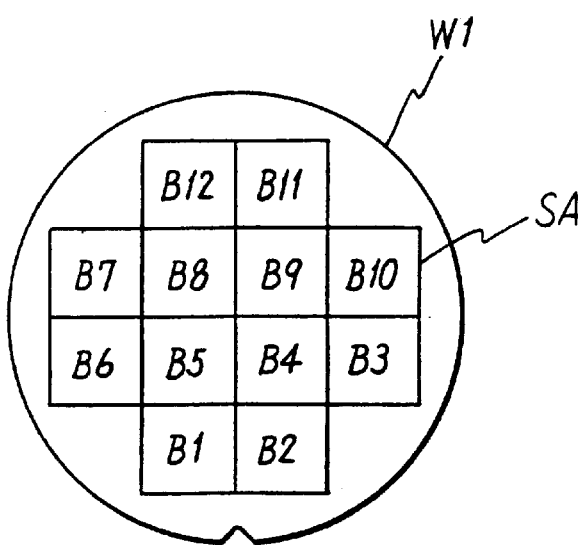
FIG. 10B shows the state in which the wafer is exposed by using the reticle having the pattern a shown in FIG. 9.

The exposure for all of the shot areas on the wafer W2 as described above is also continuously performed after the reticle exchange. Specifically, the exposure procedure of the double exposure proceeds in the following order as shown in FIG. 10A. That is, the respective shot areas on the wafer W1 are successively subjected to scanning exposure from A1 to A12 by using the reticle R2 (pattern A). After that, the reticle stage RST is moved in a predetermined amount in the scanning direction by using the driving system 30 to set the reticle R1 (pattern B) at the exposure position. Thereafter, scanning exposure is performed in an order from B1 to B12 as shown in FIG. 10B. In this procedure, the exposure condition (AF/AL, exposure amount) and the transmittance differ between the reticle R2 and the reticle R1. Therefore, it is necessary that the respective conditions are measured during the reticle alignment, and the conditions are changed depending on obtained results. The operations of the respective components during the double exposure for the wafer W2 are also controlled by the main control unit 90.

The exposure sequence and the wafer exchange/alignment sequence are concurrently performed in parallel on the two wafer stages WS1, WS2 shown in FIG. 7 described above. In this process, the wafer stage of the two wafer stages WS1, WS2, on which the operation has been firstly completed, takes a waiting state. At the point of time at which the operations for the both have been completed, the wafer stages WS1, WS2 are controlled and moved to the positions shown in FIG. 8 respectively. The wafer W2 on the wafer stage WS2, for which the exposure sequence has been completed, is subjected to wafer exchange at the right loading position. The wafer W1 on the wafer stage WS1, for which the alignment sequence has been completed, is subjected to the exposure sequence under the projection optical system PL.

At the right loading position shown in FIG. 8, the reference mark MK2 on the fiducial mark plate FM2 is positioned under the alignment system 24b in the same manner as operated for the left loading position. The wafer exchange operation and the alignment sequence are executed as described above. Of course, the reset operation for the interferometer having the length-measuring axis BI5Y of the interferometer system has been executed prior to the detection of the mark MK2 on the fiducial mark plate FM2 effected by the alignment system 24b.

Next, explanation will be made for the reset operation for the interferometer, performed by the main control unit 90 during the change from the state shown in FIG. 7 to the state shown in FIG. 8.

After the alignment is performed at the left loading position, the wafer stage WS1 is moved to the position at which the reference mark (See FIG. 20A) on the fiducial plate FM1 comes just under the center (projection center) of the optical axis AX of the projection optical system PL shown in FIG. 8. During this movement, the interferometer beam for the length-measuring axis BI4Y does not comes into the reflective surface 21 of the wafer stage WS1. Therefore, it is difficult to move the wafer stage to the position shown in FIG. 8 immediately after completion of the alignment. For this reason, in the first embodiment of the present invention, the following artifice is conceived.

That is, as explained above, the first embodiment of the present invention lies in the setting in which the fiducial mark plate FM1 comes just under the alignment system 24a when the wafer stage WS1 is disposed at the left loading position. The interferometer having the length-measuring axis BI4Y is reset at this position. Therefore, the wafer stage WS1 is once returned to this position. The wafer stage WS1 is moved from the position rightwardly in the X axis direction by a distance BL while monitoring the measured value obtained by using the interferometer 16 having the length-measuring axis BI1X for which the interferometer beam is not intercepted, on the basis of the previously known distance (conveniently referred to as "BL") between the detection center of the alignment system 24a and the center (projection center) of the optical axis of the projection optical system PL. Accordingly, the wafer stage WS1 is moved to the position shown in FIG. 8.

Figure 20A:
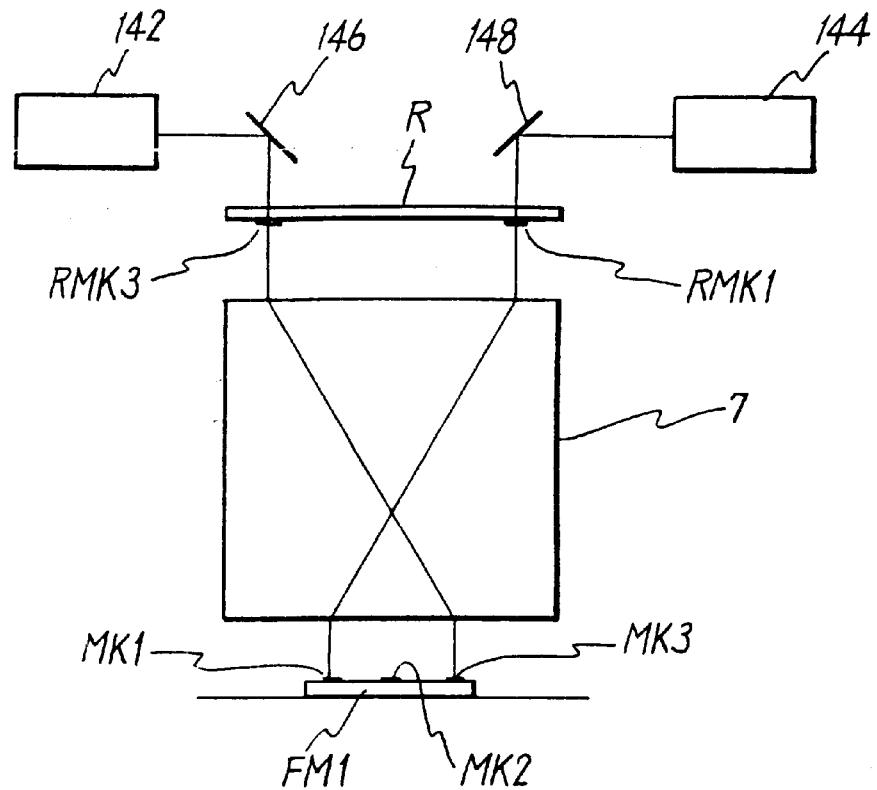
FIG. 20A explains the operation for measuring the mark on the fiducial mark plate based on the use of the reticle alignment microscope, wherein a situation in which the reticle alignment microscope is used with the exposure light beam to detect the relative positions of the marks MK1, MK3 on the fiducial mark plate FM1 and the projected images on the wafer surface, of the marks RMK1, RMK3 on the reticle corresponding thereto.

As shown in FIG. 20A, the main control unit 90 is operated to detect the relative positions of the marks MK1, MK3 on the fiducial mark plate FM1 and projected images on the wafer surface, of the marks RMK1, RMK3 on the reticle corresponding thereto, based on the use of the exposure light beam by using the reticle alignment microscopes 144, 142.

As mentioned above, the Reticle Mark RMK1 and RMK3 might generally correspond to or are positioned adjacent to MK1 and MK3, as shown in FIG. 20A, because the wafer stage was moved using the known value BL.

Figure 20B:
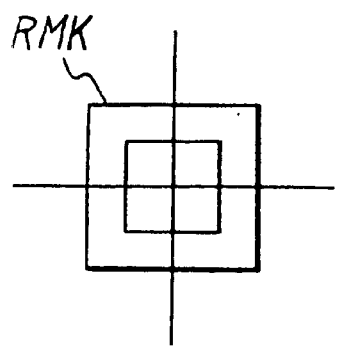
FIG. 20B shows the projected image on the wafer, of the mark RMK on the reticle R.
Figure 20C:
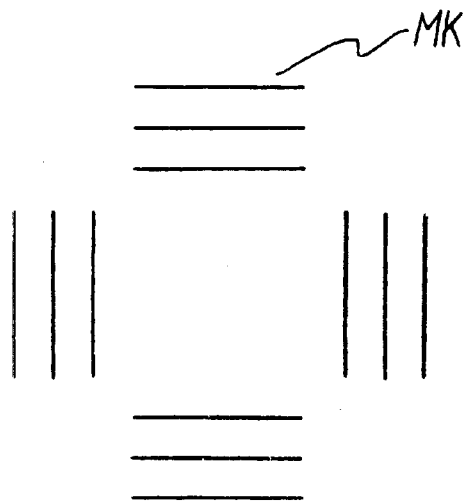
FIG. 20C shows the mark MK on the fiducial mark plate.
Figure 20D:
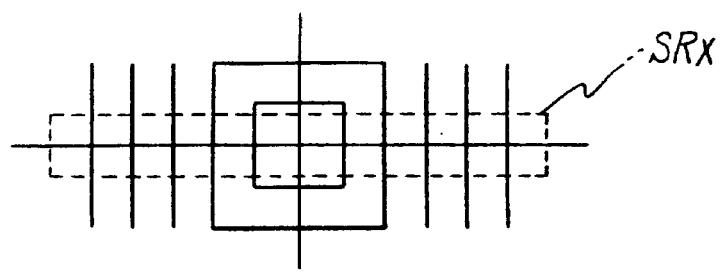
FIG. 20D shows a situation of image pick-up performed in the system shown in FIG. 20A.
Figure 20E:
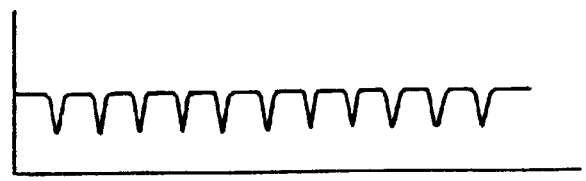
FIG. 20E shows the waveform signal obtained by processing the picked up image.

FIG. 20B shows the projected image on the wafer surface, of the mark RMK (RMK1, RMK2) on the reticle R. FIG. 20C shows the mark MK (MK1, MK3) on the fiducial mark plate. FIG. 20D shows a situation of image pick-up for simultaneously detecting the projected image on the wafer surface, of the mark RMK (RMK1, RMK2) on the reticle R and the mark MK (MK1, MK3) on the fiducial mark plate, by using the reticle alignment microscope 144, 142, in the state shown in FIG. 20A. In FIG. 20D, a symbol SRx indicates an image pick-up range for CCD which constructs the reticle alignment microscope. FIG. 20E shows a waveform signal obtained by processing the image picked up as described above by the aid of an unillustrated image processing system.

Figure 21:
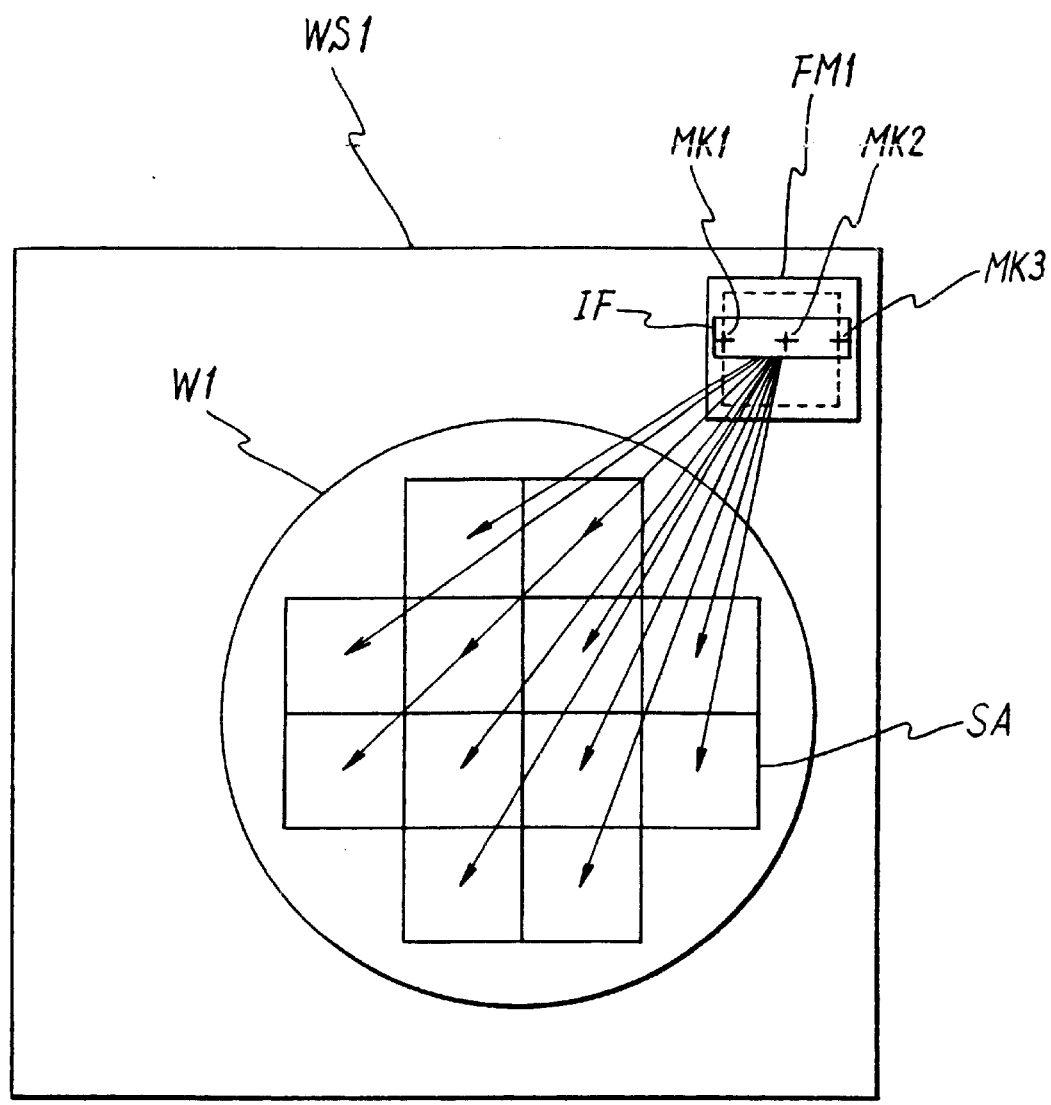
FIG. 21 shows the concept of a state in which each shot on the wafer is subjected to exposure in accordance with the relative positional relationship between each shot and the exposure position finally calculated.

The shapes of the reticle mark RMK shown in FIG. 20B and the mark MK shown in FIG. 20C are only examples and they may be in any shape. As shown in FIG. 21, MK2 is arranged so as to be positioned in the mid of MK1 and MK3 on the fiducial plate FM, and a distance between MK1 and MK3 is adjusted so as to correspond to a distance between the mark RMK1 and the mark RMK2 when these marks are observed by the reticle alignment microscope. FIG. 20D shows a state in which the reticle alignment mark RMK is just positioned in the center of the mark MK of the fiducial plate.

The main control unit 90 resets the interferometer having the length-measuring axis BI3Y prior to the pick-up of the waveform signal. The reset operation can be executed at the point of time at which the length-measuring axis to be used next is available to radiate the side surface of the wafer stage.

Accordingly, the coordinate positions of the marks MK1, MK3 on the fiducial mark plate FM1, and the coordinate positions of the marks RMK on the reticle R projected on the wafer surface are detected in the coordinate system (second stage coordinate system) based on the use of the length-measuring axes BI1X, BI3Y.

For example, when the mark MK1 (and the mark MK3) are observed by the alignment microscope, the measured value of the wafer stage WS1 in the second stage coordinate system is (X1, Y1), and the relative position of mark MK1 to the position of the reticle alignment mark RMK1 and the relative position of mark MK1 to a projected position of reticle alignment mark RMK3 are detected by the alignment microscope. Here, the center position of the two images obtained by projecting the mark RMK1 and RMK3 on the reticle R means the exposure position of the reticle pattern, i.e. the projection center of the projection optical system.

Further, MK2 is positioned in the middle of the mark MK1 and MK3. Therefore, relative positions of the exposure position of the reticle pattern and the mark MK2 of the substrate plate FM can be determined by calculation, when the wafer stage WS1 is on (X1, Y1).

The main control unit 90 finally calculates the relative positional relationship between the exposure position and each of the shots in accordance with the previously determined relative positional relationship of each of the shots with respect to the mark MK2 on the fiducial mark plate FM1, and the relative relationship between the exposure position and the coordinate position of the mark MK1, MK3 on the fiducial mark plate FM1. Depending on an obtained result, the respective shots on the wafer W1 are subjected to the exposure as shown in FIG. 21.

The reason why the highly accurate alignment can be performed even when the reset operation is performed for the interferometer as described above is as follows. That is, the spacing distance between the reference mark and the imaginary position calculated in accordance with the measurement of the wafer mark is calculated by using the identical sensor by measuring the reference mark on the fiducial mark plate FM1 by means of the alignment system 24a, and then measuring the alignment mark on each of the shot areas on the wafer W1. At this point of time, the relative distance between the reference mark and the position to be subjected to exposure is determined. Accordingly, if the correspondence between the exposure position and the reference mark position is established before the exposure by using the reticle alignment microscopes 142, 144, it is possible to perform the highly accurate exposure operation by adding the relative distance to the obtained value, even when the interferometer beam for the interferometer in the Y axis direction is intercepted during the movement of the wafer stage, and the reset is performed again.

The reference marks MK1 to MK3 always exist on the identical fiducial plate. Therefore, if the drawing error is determined beforehand, only the management for the offset is required, and there is no variable factor. There is a possibility that the RMK1, RMK2 also involve any offset due to any drawing error of the reticle. However, such a situation may be also dealt with by means of only the offset management, if the drawing error is reduced by using a plurality of marks during the reticle alignment, or if the drawing error of the reticle mark is measured beforehand, as disclosed, for example, in Japanese Laid-Open Patent Publication No. 5-67271.

When the length-measuring axis BI4Y is not intercepted during the period of movement of the wafer stage WS1 from the alignment completion position to the position shown in FIG. 8, it is a matter of course that the wafer stage may be linearly moved to the position shown in FIG. 8 immediately after completion of the alignment while monitoring the measured values obtained by using the length-measuring axes BI1X, BI4Y. In this case, it is preferable to perform the reset operation for the interferometer at any point of time at or after the point of time at which the length-measuring axis BI3Y passing through the optical axis AX of the projection optical system PL overlaps the reflective surface 21 of the wafer stage WS1 perpendicular to the Y axis, and before the detection of the relative positions of the marks MK1, MK3 on the fiducial mark plate FM1 and the projected images on the wafer, of the marks RMK1, RMK3 on the reticle corresponding thereto based on the use of the reticle alignment microscopes 144, 142.

The wafer stage WS2 may be moved from the exposure completion position to the right loading position shown in FIG. 8 in the same manner as described above to perform the reset operation for the interferometer having the length-measuring axis BI5Y.

Figure 11:
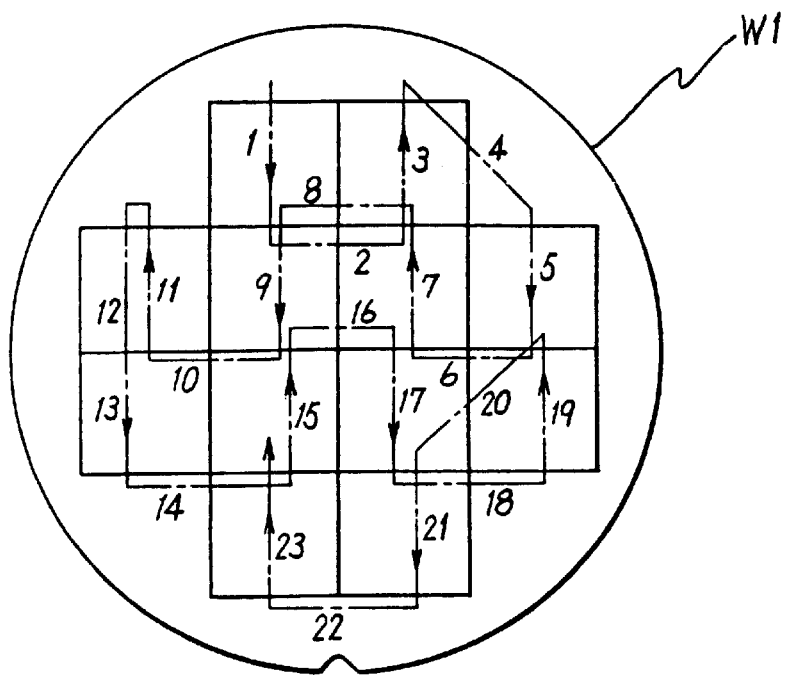
FIG. 11 shows the order of exposure for each of the respective shot areas on the wafer held on one of the two wafer stages.
Figure 12:
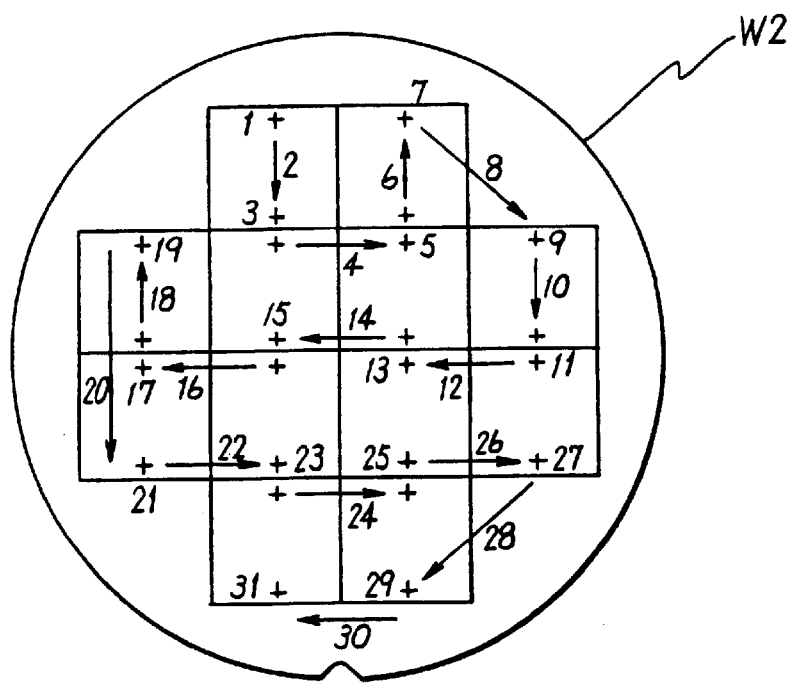
FIG. 12 shows the order of mark detection for each of the respective shot areas on the wafer held on the other of the two wafer stages.

Alternatively, FIG. 11 shows an example of the timing of the exposure sequence for successively exposing the respective shot areas on the wafer W1 held on the wafer stage WS1. FIG. 12 shows the timing of the alignment sequence for the wafer W2 held on the wafer stage WS2, performed concurrently in parallel thereto. In the first embodiment of the present invention, the exposure sequence and the wafer exchange/alignment sequence are concurrently performed in parallel to one another for the wafers W1, W2 held on the respective wafer stages while independently moving the two wafer stages WS1, WS2 in the two-dimensional direction so that the throughput is improved.

However, when the two operations are dealt with concurrently in parallel to one another by using the two wafer stages, the operation performed on one of the stages affects, as a disturbance factor, the operation performed on the other wafer stage in some cases. On the contrary, some of the operations performed on one of the wafer stages do not affect the operations performed on the other wafer stage. Thus, in the first embodiment of the present invention, the operations performed concurrently in parallel are divided into the operations which correspond to the disturbance factor, and the operations which do not correspond to the disturbance factor. Further, the timings of the respective operations are adjusted so that the operations which correspond to the disturbance factor are mutually performed simultaneously, or the operations which do not correspond to the disturbance factor are mutually performed simultaneously.

For example, during the scanning exposure, the synchronized scanning for the wafer W1 and the reticle R is performed at constant velocities, in which no disturbance factor is included. Further, it is necessary to exclude any external disturbance factor as less as possible. Therefore, during the scanning exposure performed on one of the wafer stages WS1, the timing is adjusted to give a stationary state in the alignment sequence effected for the wafer W2 on the other wafer stage WS2. That is, the measurement of the mark in the alignment sequence is performed in a state in which the wafer stage WS2 is allowed to stand still at the mark position. Therefore, the measurement of the mark is not the disturbance factor for the scanning exposure. Thus, it is possible to perform the measurement of the mark concurrently with the scanning exposure in parallel. In this context, with reference to FIGS. 11 and 12, it is understood that the scanning exposure effected for the wafer W1 indicated by the operation numbers of "1, 3, 5, 7, 9, 11, 13, 15, 17, 19, 21, 23" shown in FIG. 11 is performed in a mutually synchronized manner with respect to the mark measurement operation effected at the respective alignment mark positions for the wafer W2 indicated by the operation numbers of "1, 3, 5, 7, 9, 11, 13, 15, 17, 19, 21, 23" shown in FIG. 12. On the other hand, in the case of the alignment sequence, the constant velocity movement is also performed during the scanning exposure. Therefore, no disturbance occurs, and it is possible to perform the measurement highly accurately.

The same situation as that described above is also considered for the wafer exchange. Especially, for example, any vibration, which is generated when the wafer is transmitted from the load arm to the center-up, may serve as a disturbance factor. Therefore, the wafer may be transmitted in conformity with acceleration or deceleration (which may serve as a disturbance factor) before or after the synchronized scanning is performed at a constant velocity. The timing adjustment described above is performed by using the main control unit 90.

Next, explanation will be made for the method for performing the focus/leveling control during the exposure. In the projection exposure apparatus 10 according to the first embodiment of the present invention, AF measurement is performed for the wafer during the alignment by using the AF/AL system 130 provided for the alignment system 24a, or by using the AF/AL system 134 provided for the alignment system 24b. The focus/leveling control is performed during the exposure on the basis of obtained results of the measurement described above and results of AF measurement for the wafer by using the AF/AL system 132 provided for the projection optical system PL.

As described above, the order of exposure for the respective shot areas on the wafer W is determined, for example, by respective parameters of (1) to (4), i.e., (1) acceleration and deceleration times during scanning, (2) adjustment time, (3) exposure time, and (4) stepping time to adjacent shot. However, in general, the acceleration and the deceleration give the rate-determining condition. Therefore, it is most efficient that scanning is performed in an alternate manner for the wafer in the ±Y direction (the adjacent shots are successively subjected to scanning exposure in the X direction shown in FIG. 13), when the two-shot stepping effected by the vertical stepping (stepping in the Y direction shown in FIG. 13) is not performed.

Figure 13:
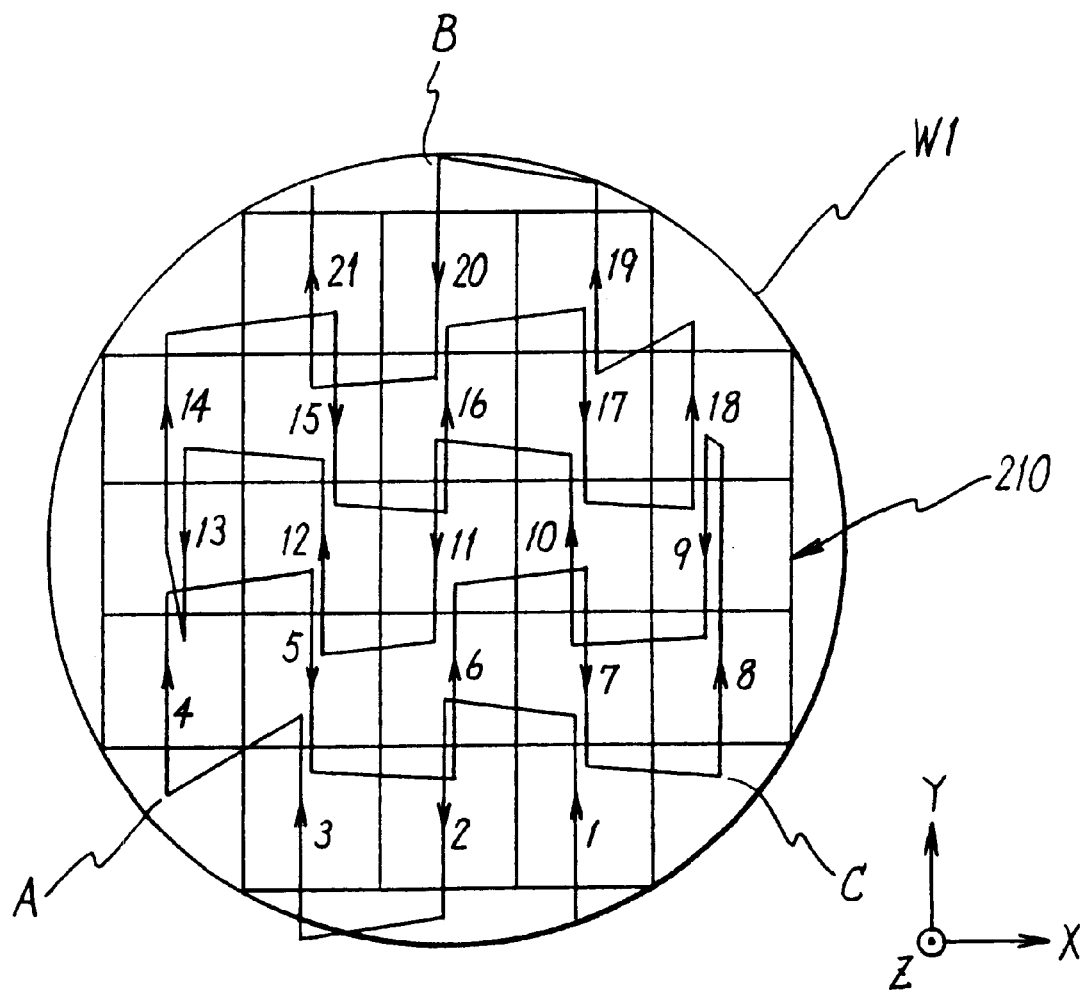
FIG. 13 shows a plan view of the wafer illustrating the older of exposure for the scanning type projection exposure apparatus, used when all shot arrays are included in the wafer.

FIG. 13 shows the order of exposure for the shot area 210 on the wafer W1, determined as described above. FIG. 13 represents an example in which all shot arrays are included in the wafer W1.

The complete pre-measurement control as described in Japanese Laid-Open Patent Publication No. 6-283403 corresponding to U.S. Pat. No. 5,448,332 is also performed in the embodiment of the present invention prior to the exposure for the respective shot areas. However, when it is intended to perform the exposure in the most efficient exposure order as shown in FIG. 13, AF detecting points appear in some parts, at which it is impossible to perform the measurement (detection) for the surface of the wafer W1, because the AF detecting points for pre-measurement overlap the outer circumference of the wafer W1 at respective positions indicated by symbols A, B, C in FIG. 13. In such a case, it is impossible to perform the complete pre-measurement control described above.

Figure 14A:
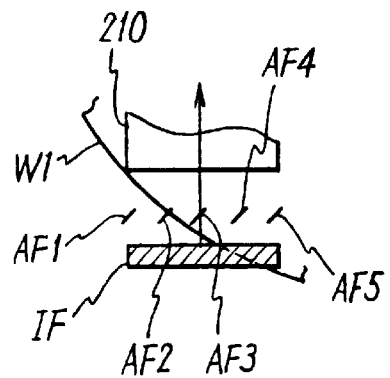
FIG. 14A shows a magnified plan view concerning the AF measurement for pre-measurement performed at the position A shown in FIG. 13.

This situation will be described in further detail below. FIGS. 14A, B, C show magnified plan views respectively illustrating cases in which the AF measurement for pre-measurement is performed at the respective positions shown by the symbols A, B, C in FIG. 13. Actually, for example, the AF detecting points AF1 to AF5 and the exposure area IF conjugate to the illumination area IA on the reticle are fixed, with respect to which the wafer W1 is scanned. However, for convenience, FIG. 14A, B, C are illustrated such that the exposure area IF and the AF detecting points are scanned with respect to the wafer surface. Therefore, in the following description, explanation will be made assuming that the direction opposite to the actual scanning direction for the wafer W1 is the scanning direction.

In this embodiment, it is assumed that the AF detecting points AF1 to AF5 as the second detecting system are arranged in the non-scanning direction (lateral direction in the plane of the paper) on one side of the exposure area IF in the scanning direction (vertical direction in the plane of the paper) (see FIG. 14A. Further, it is assumed that the AF detecting points AB1 to AB5 as the second detecting system are arranged in the non-scanning direction on the other side of the exposure area IF in the scanning direction (see FIG. 14B).

Figure 14B:
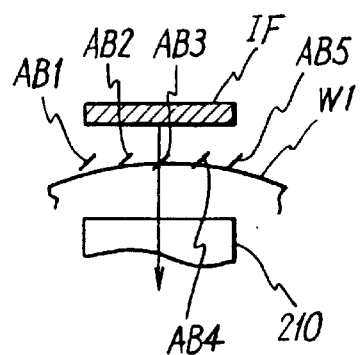
FIG. 14B shows a magnified plan view concerning the AF measurement for pre-measurement performed at the position B shown in FIG. 13.
Figure 14C:
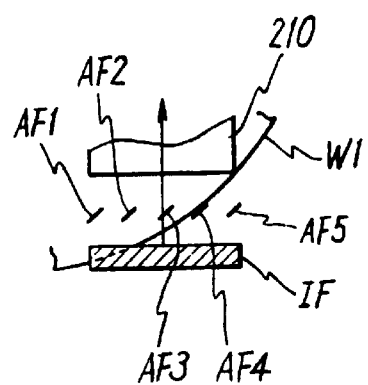
FIG. 14C shows a magnified plan view concerning the AF measurement for pre-measurement performed at the position C shown in FIG. 13.

In FIG. 14A, when the AF measurement is performed while-conducting scanning in the +Y direction, the pre-measurement control cannot be performed, because the detecting points AF1 and AF2 are deviated from the surface of the wafer W1. In the case of FIGS. 14B and C, the pre-measurement control cannot be also performed, because the detecting points (AB1 to AB5, AF4 and AF5) are deviated from the surface of the wafer W1.

In such a situation, the scanning direction has been hitherto inverted so that the scanning (referred to as "internal scanning") is performed from the inside to the outside of the wafer W1 in order that the detecting points are not deviated from the surface of the wafer W1 at the positions of A, B, C described above. However, if the scanning direction is inverted, an inconvenience arises in that the exposure order determined as described above is changed, and consequently the throughput is decreased.

Figure 15:
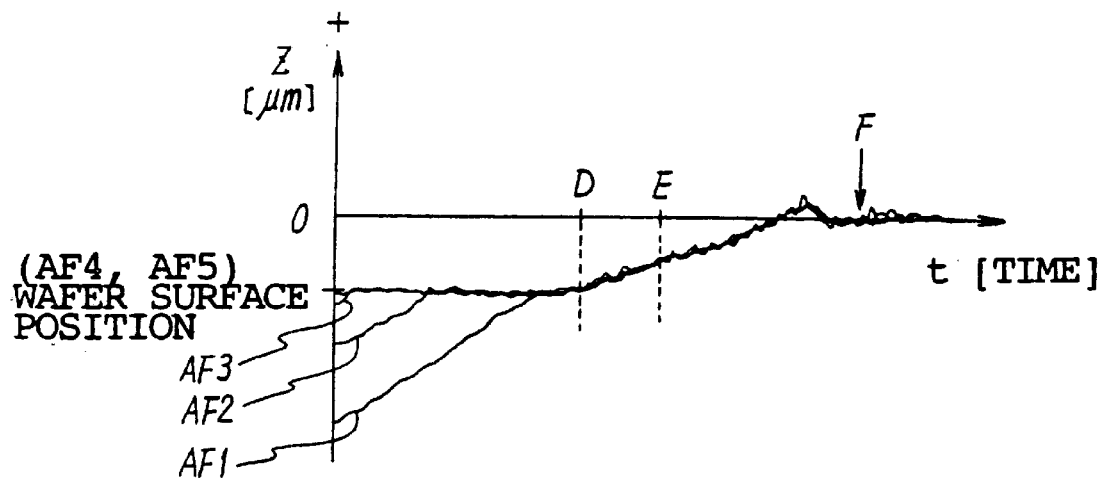
FIG. 15 shows a diagram illustrating the result of pre-measurement control concerning Comparative Example, performed for the shot area located in the vicinity of the outer circumference of the wafer.

Now, an example of output results (as Z directional position on the surface of the wafer) of an AF system in the state in which the outer edge of the wafer being moved by means of the wafer stage WS is within the detecting portion of the AF system is shown. As shown in FIG. 15 (Comparative example), in order to avoid the decrease in throughput as described above, it is assumed that a method is adopted, in which the AF measurement is started at a point of time D at which the measurement can be performed while all of the AF detecting points (for example AF1 to AF5) for pre-measurement are located on the surface of the wafer, so that the autofocus/autoleveling control (hereinafter referred to as "AF/AL control") is carried out. However, in the case of this method, an error occurs in a region between Point E and Point F which represent the completion of follow-up control, due to delay in phase of AF/AL follow-up. Point E in FIG. 15 indicates the position of completion of follow-up obtained when normal pre-measurement control is performed. As clarified from FIG. 15, it is understood that such AF measurement deteriorates the AF/AL control accuracy.

In consideration of the fact described above, in the first embodiment of the present invention, the AF measurement for the wafer W1 is performed during the alignment prior to the pre-measurement during the wafer exposure, under the same condition as that used in the exposure, by using the AF/AL system 130 provided for the alignment system 24a or by using the AF/AL system 134 provided for the alignment system 24b. Thus, it is intended to avoid deterioration of the AF/AL control accuracy as the error caused by the delay in phase of follow-up control of AF/AL described above. The AF/AL system 130 or the AF/AL system 134 is provided with the AF detecting points (corresponding to AF1 to AF5, see FIG. 14A) and the AF detecting points (corresponding to AB1 to AB5, see FIG. 14B) as the first detecting system capable of executing the AF/AL measurement for the surface of the wafer W1 under the same condition as that provided for the projection optical system PL described above.

Figure 16:
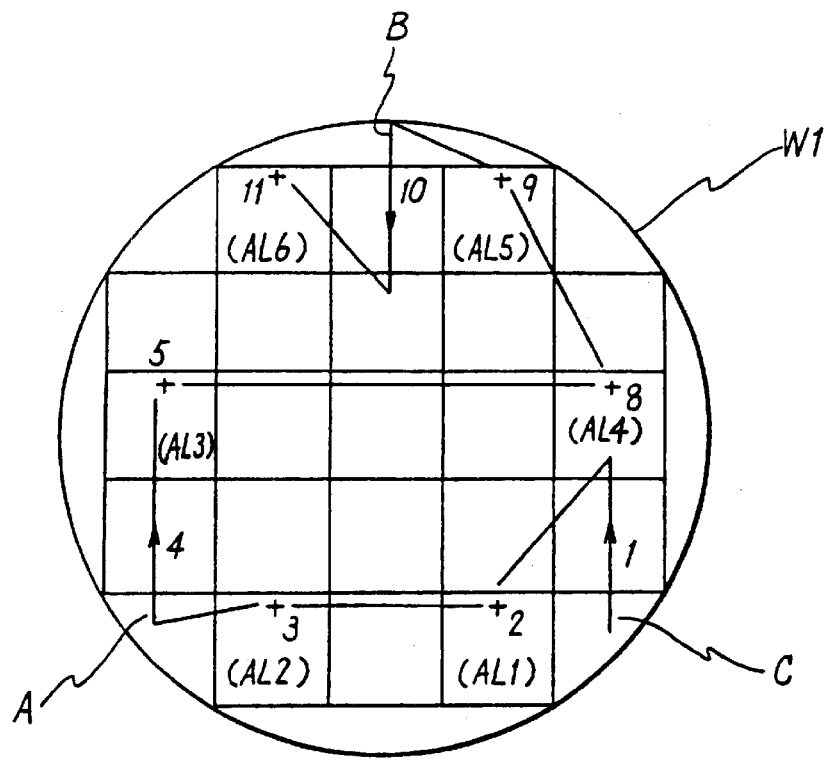
FIG. 16 shows a plan view of the wafer illustrating the order of alignment for the scanning type projection exposure apparatus, used when all shot arrays are included in the wafer.

That is, as shown in FIG. 16, the wafer W1, which is subjected to the alignment, includes a number of measuring points for EGA, i.e., AL1 to AL6 (six points). In this range, the AF measurement is performed at the measuring points C, A, B in the same direction as that for the exposure sequence. Also in this case, in order to avoid any mutual influence on the operations of the two substrate stages, the stepping operations (operations corresponding to the disturbance factor) are synchronized with each other, or the exposure operation and the alignment operation (operations not corresponding to the disturbance factor) as synchronized with each other, and the stages are moved in an order sot hat they cause no mutual interference. In this procedure, it is assumed that there is given "exposure time>alignment time+ pre-measurement time".

Figure 17:
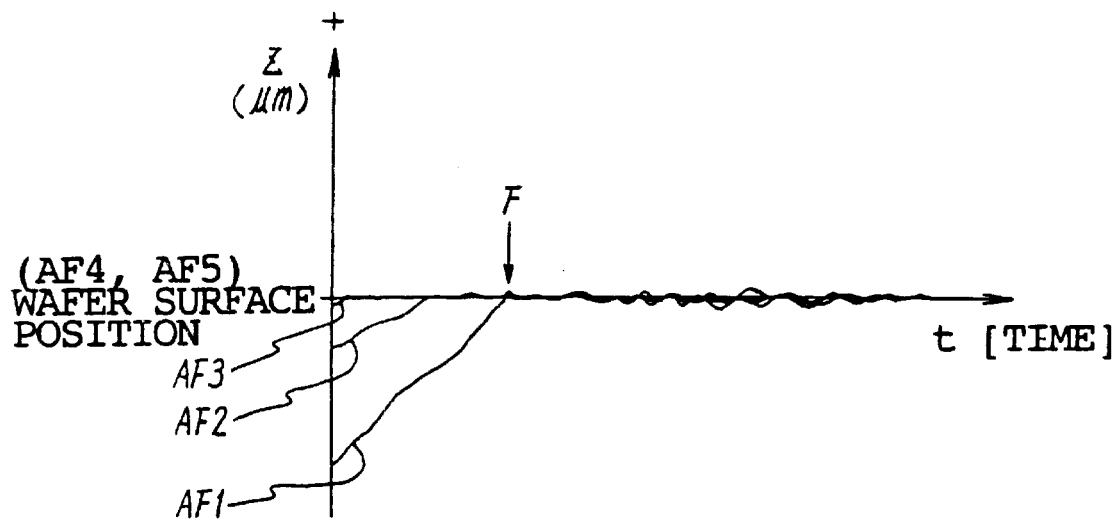
FIG. 17 shows a diagram illustrating the result of pre-measurement control, obtained in the first embodiment.

FIG. 17 shows results of measurement at Point A in FIG. 16 for the detecting points AF1 to AF5, obtained by the AF measurement during the alignment which is the feature of the present invention. In FIG. 17, for the purpose of simplified illustration, the wafer surface position is depicted as having the leveling of zero. However, the results for AF1 to AF5 are dispersed in ordinary cases.

Figure 18:
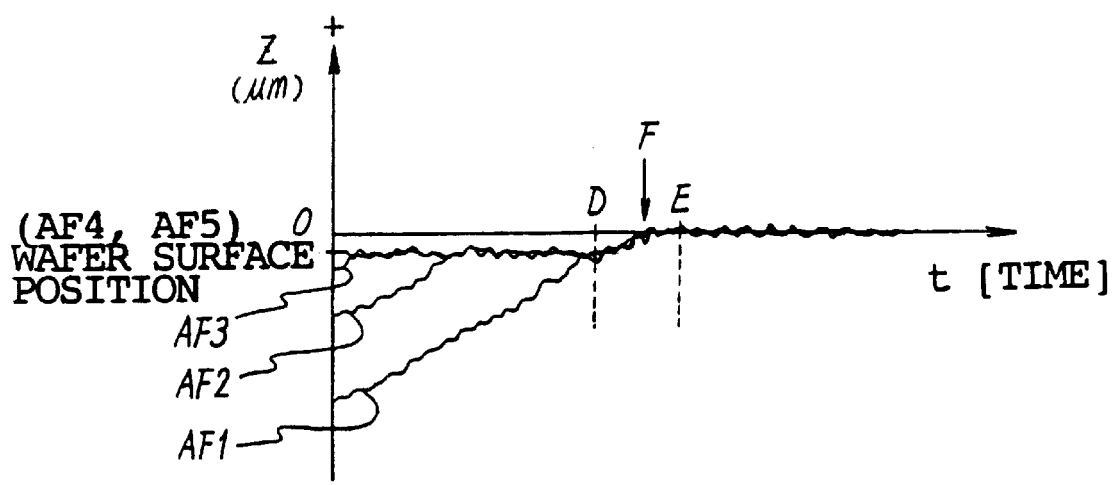
FIG. 18 shows a diagram illustrating the result of pre-measurement control, obtained when the reproducibility in measurement involves an error in the first embodiment.

In this embodiment, as shown in FIG. 14A, the AF measurement can be normally performed at the detecting points AF4 and AF5. Therefore, the obtained values of the AF measurement also indicate the wafer surface position in FIG. 17. On the contrary, the detecting points AF3, AF2, AF1 gradually indicate the wafer surface position in accordance with the movement in the scanning direction. When the focus measurement for the shot areas in the vicinity of the outer circumference of the wafer is performed beforehand as described above, it is possible to know what measured values are given in the following exposure sequence, for example, at the respective positions of A, B, C in FIG. 16. Accordingly, upon the actual pre-measurement control during the exposure, the position of the wafer is allowed to approach the target position (0) within a range of error concerning reproducibility of the measurement for the wafer surface position as shown in FIG. 18, as compared with the procedure shown in FIG. 15. That is, it is possible to perform quick driving for the focus.

Originally, as described in Japanese Laid-Open Patent Publication No. 6-283403, the follow-up control response in the autofocus lies in a condition under which an amount of 30% of the absolute error can be followed as estimated as primary response. The follow-up completion point F appears earlier (because of an identical allowable value) by decreasing the initial absolute value error. It is possible to complete the follow-up earlier than at the follow-up completion point E which is given when the normal pre-measurement control is performed.

As explained above, according to the projection exposure apparatus 10 concerning the first embodiment of the present invention, the two stages for holding the wafers are independently moved, and the wafer exchange and alignment operation is performed on one of the stages, while the exposure operation is concurrently performed in parallel on the other stage. The AF measurement for the wafer surface is performed by using the AF/AL system of the alignment system during the alignment. At the point of time at which the both operations are completed, the operations are mutually changed with each other. Therefore, the focus can be quickly driven even for shot areas which are located in the vicinity of the outer circumference of the wafer where the wafer surface is not disposed at the pre-measurement position during the exposure and for which the scanning exposure is performed from the outside to the inside of the wafer, by previously carrying out the focus measurement at the outer circumference of the wafer and using results obtained by the measurement. Thus, it is possible to avoid any delay in follow-up in the pre-measurement control. Therefore, the focus/leveling control can be performed highly accurately. It is unnecessary to adopt the internal scanning even when the shot areas in the vicinity of the outer circumference of the wafer are subjected to scanning exposure from the outside to the inside of the wafer. The respective shot areas can be exposed in the most efficient exposure order. Accordingly, it is possible to improve the throughput.

The AF measurement during the alignment is performed while conducting the scanning in the same direction as that for the scanning exposure for the shot areas located at the outer circumference of the wafer. Therefore, it is possible to perform the focus control which is free from, for example, the offset depending on, for example, the movement direction of the stage.

According to the projection exposure apparatus 10 concerning the first embodiment, there are provided the two wafer stages for independently holding the two wafers respectively. The two wafer stages are independently moved in the XYZ directions, wherein the wafer exchange operation and the alignment operation are executed for one of the wafer stages, during which the exposure operation is executed for the other wafer stage. The operations of the both are mutually changed at the point of time at which the both operations are completed. Accordingly, it is possible to greatly improve the through put.

During the change of the operations described above, the interferometer having the length-measuring axis to be used for the operation after the change is reset, simultaneously with which the measurement sequence is also performed for the fiducial mark plate disposed on the wafer stage. Therefore, no special inconvenience occurs even when the length-measuring axis of the interferometer system is deviated from the reflective surface of the wafer stage (or from the movement mirror, if the movement mirror is separately provided). It is possible to shorten the reflective surface of the wafer stage (or the movement mirror, if the movement mirror is separately provided). Accordingly, it is possible to easily realize miniaturization of the wafer stage. Specifically, the length of one side of the wafer stage can be miniaturized to have a size of a degree which is slightly larger than the diameter of the wafer. Thus, it is possible to easily incorporate, into the apparatus, the two wafer stages which are independently movable. In addition, it is possible to improve the positioning performance for the respective wafer stages.

As for the wafer stage for which the exposure operation is performed, the mark on the fiducial mark plate is measured simultaneously with the reset for the length-measuring interferometer by using the reticle alignment microscope 142, 144 (alignment sensor based on the use of the exposure light beam) by the aid of the projection optical system PL. As for the wafer stage for which the wafer exchange/alignment operation is performed, the mark on the fiducial mark plate is measured simultaneously with the reset for the length-measuring interferometer by using the alignment system 24a or 24b (off-axis alignment sensor). Therefore, it is also possible to change the length-measuring axis of the interferometer for managing the position of the wafer stage during the alignment effected by each of the alignment systems and during the exposure effected by the projection optical system. In this process, the following procedure is adopted. That is, (1) when the mark on the fiducial mark plate is measured by using the alignment system 24a or 24b, the coordinate position of the mark is measured on the first stage coordinate system, (2) the alignment mark of a sample shot on the wafer is thereafter detected to determine the array coordinate (coordinate position for the exposure) of each slot is determined on the first stage coordinate system in accordance with the EGA operation, (3) the relative positional relationship between the mark on the fiducial mark plate and the coordinate position for the exposure of each shot is determined from the results obtained in (1) and (2) described above, (4) the relative positional relationship between the mark on the fiducial mark plate and the coordinate position of those projected from the reticle is detected before the exposure on the second stage coordinate system by the aid of the projection optical system PL by using the reticle alignment microscope 142, 144, and the exposure is performed for each shot by using (3) and (4) described above. Accordingly, the exposure can be performed highly accurately even in the case of the change of the length-measuring axis of the interferometer for managing the position of the wafer stage. As a result, it is possible to perform the positional adjustment for the wafer without performing the baseline measurement which has been hitherto carried out to measure the spacing distance between the projection center of the projection optical system and the detection center of the alignment system. It is also unnecessary to carry a large fiducial mark plate as described in Japanese Laid-Open Patent Publication No. 7-176468.

According to the first embodiment of the present invention, there are provided at least two alignment systems for detecting the mark, the two alignment systems being disposed with the projection optical system PL interposed therebetween. Accordingly, the alignment operation and the exposure operation, which are performed by alternately using the respective alignment systems, can be concurrently dealt with in parallel to one another by alternately moving the two wafer stages.

According to the first embodiment of the present invention, the wafer loader for exchanging the wafer is arranged in the vicinity of the alignment system, especially to perform the operation at the respective alignment positions. Accordingly, the change from the wafer exchange to the alignment sequence is smoothly performed. Thus, it is possible to obtain a higher throughput.

According to the first embodiment of the present invention, the influence to cause deterioration of throughput disappears almost completely, even when the off-axis alignment system is installed at a position greatly separated from the projection optical system PL, because the high throughput is obtained as described above. Therefore, it is possible to design and install a straight cylinder type optical system having a high N.A. (numerical aperture) and having a small aberration.

According to the first embodiment of the present invention, each of the optical systems has the interferometer beam radiated from the interferometer for measuring the approximate center of each of the optical axes of the two alignment systems and the projection optical system PL. Accordingly, the positions of the two wafer stages can be accurately measured in a state free from any Abbe error at any time of the alignment and the pattern exposure by the aid of the projection optical system. Thus, it is possible to independently move the two wafer stages.

The length-measuring axes BI1X, BI2X, which are provided toward the projection center of the projection optical system PL from the both sides in the direction (X axis direction in this embodiment) along which the two wafer stages WS1, WS2 are aligned, are always used to effect radiation to the wafer stages WS1, WS2 so that the positions of the respective stages in the X axis direction are measured. Therefore, it is possible to move and control the two stages so that they exert no interference with each other.

The interferometers are arranged so that the length-measuring axes BI3Y, BI4Y, BI5Y effect radiation in the direction (Y axis direction in this embodiment) intersecting perpendicularly toward the positions of the detection center of the alignment system and the projection center of the projection optical system PL with respect to the length-measuring axes BI1X, BI2X. The position of the wafer stage can be accurately controlled by resetting the interferometers even when the length-measuring axis is deviated from the reflective surface due to movement of the wafer stage.

The fiducial mark plates FM1, FM2 are provided on the two wafer stages WS1, WS2 respectively. The positional adjustment for the wafer can be performed by adding the spacing distance from the correction coordinate system obtained by previously measuring the mark position on the fiducial mark plate and the mark position on the wafer by using the alignment system, to the measured position of the fiducial plate before the exposure, without performing the baseline measurement for measuring the spacing distance between the projection optical system and the alignment system as performed in the conventional technique. It is unnecessary to carry a large fiducial mark plate as described in Japanese Laid-Open Patent Publication No. 7-176468.

According to the first embodiment of the present invention, the double exposure is performed by using a plurality of reticles R. Accordingly, an effect is obtained to increase the resolution and improve DOF (depth of focus). However, in the double exposure method, it is necessary to repeat the exposure step at least twice. For this reason, in general, the exposure time is prolonged, and the throughput is greatly decreased. However, the use of the projection exposure apparatus according to the first embodiment of the present invention makes it possible to greatly improve the throughput. Therefore, the effect is obtained to increase the resolution and improve DOF without decreasing the throughput. For example, it is assumed that the respective processing times of T1 (wafer exchange time), T2 (search alignment time), T3 (fine alignment time), and T4 (exposure time for one exposure) for an 8-inch wafer are T1: 9 second, T2: 9 seconds, T3: 12 seconds, and T4: 28 seconds. When the double exposure is performed in accordance with the conventional technique in which a series of exposure processes are performed by using one wafer stage, there is given a throughput THOR=3600/(T1+T2+T3+T4×2)=3600/(30+28×2)=41 [sheets/hour]. Therefore, the throughput is lowered to be up to 66% as compared with a throughput (THOR=3600/(T1+T2+T3+T4)=3600/58=62 [sheets/hour]) obtained by using a conventional apparatus in which the single exposure method is carried out by using one wafer stage. However, when the double exposure is performed by using the projection exposure apparatus according to the first embodiment of the present invention while concurrently processing T1, T2, T3, T4 in parallel to one another, there is given a throughput THOR=3600/(28+28)=64 [sheets/hour], because it is sufficient to consider only the exposure time. Therefore, the throughput can be improved while maintaining the effect to increase the resolution and improve DOF. The number of points for EGA can be increased in a degree corresponding to the long exposure time. Thus, the alignment accuracy is improved.

In the first embodiment of the present invention, explanation has been made for the case in which the present invention is applied to the apparatus for exposing the wafer based on the use of the double exposure method. However, such explanation has been made because of the following reason. That is, as described above, when the exposure is performed twice with the two reticles (double exposure) on the side of one of the wafer stages, during which the wafer exchange and the wafer alignment are concurrently carried out in parallel on the side of the other wafer stage which is independently movable, by using the apparatus according to the present invention, then the especially large effect is obtained in that the high throughput can be obtained as compared with the conventional single exposure, and it is possible to greatly improve the resolving power. However, the range of application of the present invention is not limited thereto. The present invention can be preferably applied when the exposure is performed in accordance with the single exposure method. For example, it is assumed that the respective processing times (T1 to T4) for an 8-inch wafer are the same as those described above. When the exposure process is performed in accordance with the single exposure method by using the two wafer stages as in the present invention, if T1, T2, T3 are dealt with as one group (30 second in total), and the concurrent process is performed for T4 (28 seconds), then there is given a throughput THOR=3600/30=120 [sheets/hour]. Thus, it is possible to obtain the high throughput which is approximately two times the conventional throughput (THOR=62 [sheets/hour]) in which the single exposure is carried out by using one wafer stage.

Second Embodiment

Next, the second embodiment of the present invention will be explained with reference to FIGS. 22 and 23. In this embodiment, constitutive components which are the same as or equivalent to those referred to in the first embodiment described above are designated by the same reference numerals, explanation of which is simplified or omitted.

Figure 22:
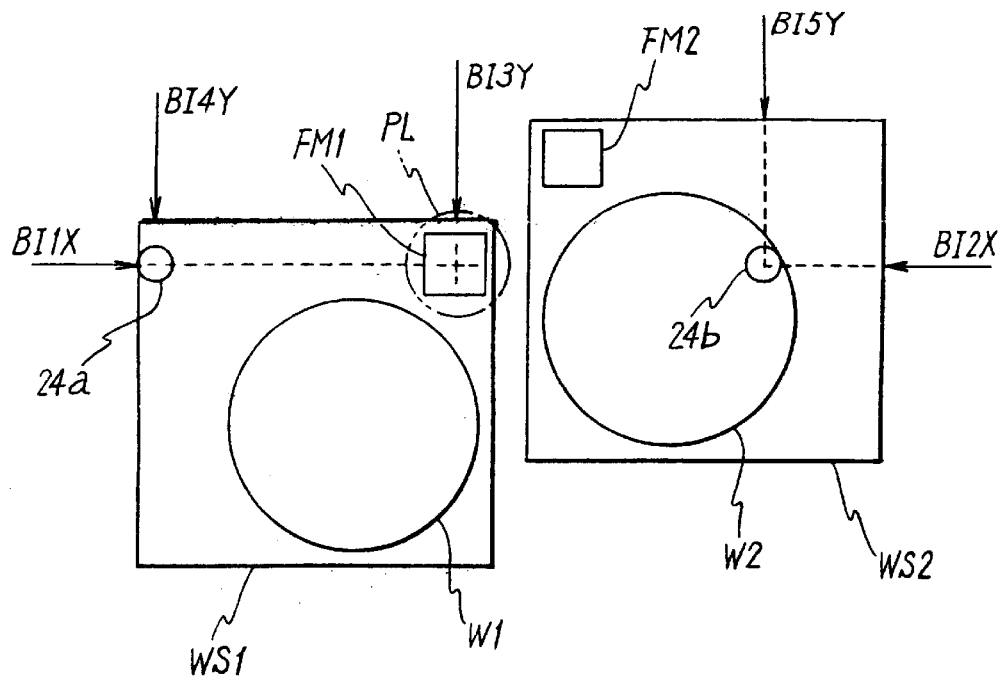
FIG. 22 explains the operation of the second embodiment, illustrating a situation in which the interferometer having the length-measuring axis BI3Y is reset after completion of the alignment for the wafer W1 on the wafer stage WS1.

As shown in FIG. 22, a projection exposure apparatus according to the second embodiment is characterized in that the length-measuring beam BI4Y (or BI5Y) is not deviated from the reflective surface of the stage during the movement of the wafer stage WS1 (or WS2) from the completion position of the alignment sequence to the start position of the exposure sequence, because the length of one side of the wafer stage WS1 (the length of one side of WS2 is identical thereto) is longer than the mutual distance BL between the length-measuring axes BI4Y and BI3Y (the mutual distance between the length-measuring axes BI5Y and BI3Y is identical thereto). Accordingly, the projection exposure apparatus according to the second embodiment is different from the projection exposure apparatus according to the first embodiment described above in that the reference mark on the fiducial mark plate can be measured after the reset for the interferometer as described later on. Other features are constructed in the same manner as the projection exposure apparatus 10 according to the first embodiment described above.

FIG. 22 shows a situation in which the interferometer having the length-measuring axis BI3Y is reset after completion of the alignment for the wafer W1 on the wafer stage WS1.

As also clarified from FIG. 22, the interferometers having the length-measuring axes BI1X, BI4X for managing the position of the wafer stage WS1 have their interferometer beams which are not deviated from the reflective surface formed on one end surface of the wafer stage WS1 in the Y axis direction, after the fine alignment operation (effected by EGA described above) for the wafer W1 by the aid of the alignment system 24a. Accordingly, the main control unit 90 is operated to move the wafer stage WS1 from the alignment completion position to the position shown in FIG. 22 at which the fiducial mark plate FM1 is located under the projection lens PL, while monitoring measured values obtained by using the interferometers having the length-measuring axes BI1X, BI4Y. During this process, the interferometer beam concerning the length-measuring axis BI3Y is reflected by the reflective surface of the wafer stage WS1 immediately before positioning the fiducial mark plate FM1 just under the projection lens PL.

In this embodiment, the position of the wafer stage WS1 is controlled on the basis of the measured values obtained by using the interferometer having the length-measuring axes BI1X, BI4Y. Therefore, unlike the first embodiment described above, the main control unit 90 can accurately manage the position of the wafer stage WS1. At this point of time (i.e., immediately before positioning the fiducial mark plate FM1 just under the projection lens PL), the interferometer having the length-measuring axis BI3Y is reset. After completion of the reset, the position of the wafer stage WS1 is controlled on the basis of measured values obtained by using the interferometer having the length-measuring axes BI1X, BI3Y (the coordinate system is changed from the first stage coordinate system to the second stage coordinate system).

After that, the main control unit 90 is operated so that the wafer stage WS1 is positioned at the position shown in FIG. 22 to perform the detection of the relative position between the marks MK1, MK3 on the fiducial mark plate FM1 and the projected images on the wafer surface, of the marks RMK1, RMK3 on the reticle corresponding thereto, i.e., the detection of the relative positional relationship between the marks MK1, MK3 and the exposure position (projection center of the projection optical system PL) by using the exposure light beam based on the use of the reticle microscopes 142, 144, in the same manner as performed in the first embodiment described above. After that, the main control unit 90 finally calculates the relative positional relationship between the exposure position and each shot in accordance with the relative positional relationship of each shot with respect to the mark MK2 on the fiducial mark plate FM1 previously determined and the relative positional relationship between the exposure position and the coordinate position of the mark MK1, MK3 on the fiducial mark plate FM1. Thus, the exposure (double exposure as described above) is performed in accordance with an obtained result (see FIG. 21).

During the exposure, the length-measuring axis BI4Y is deviated from the reflective surface depending on the exposure position, and the measurement therewith becomes impossible. However, no inconvenience occurs between the length-measuring axis has been already changed for the control of the position of the wafer stage WS1.

The operation of the exposure sequence is performed on the side of the one wafer stage WS1, during which the other wafer stage WS2 is subjected to the positional control on the basis of the measured values obtained by using the interferometers having the length-measuring axes BI2X, BI5Y, in which the W exchange sequence and the wafer alignment sequence are executed. In this process, the double exposure is performed on the side of the wafer stage WS1 as described above. Therefore, the operation of the wafer exchange sequence and the wafer alignment sequence performed on the side of the wafer stage WS2 are completed earlier, and then the wafer stage WS2 is in a waiting state.

At the point of time at which the exposure for all areas of the wafer W1 is completed, the main control unit 90 is operated to move the wafer stage WS1 to the position at which the interferometer beam concerning the length-measuring axis BI4Y is reflected by the reflective surface of the wafer steps WS1 while monitoring measured values obtained by using the interferometers concerning the length-measuring axes BI1X, BI3Y so that the interferometer having the length-measuring axis BI4Y is reset. After completion of the reset operation, the main control unit 90 is operated to change the length-measuring axes for controlling the wafer stage WS1 into the length-measuring axes BI1X, BI4Y again so that the wafer stage WS1 is moved to the loading position.

During the movement, the interferometer beam concerning the length-measuring axis BI3Y is once deviated from the reflective surface, and it falls into an immeasurable state. However, no inconvenience occurs because the length-measuring axis has been changed to control the position of the wafer stage WS1.

The main control unit 90 is operated to start movement of the wafer stage WS2 so that the fiducial mark plate FM2 for the wafer stage WS2 is positioned under the projection optical system PL, concurrently with the movement of the wafer stage WS1 to the loading position. During the movement, the reset of the interferometer having the length-measuring axis BI3Y is executed in the same manner as described above. After that, the reticle microscopes 142, 144 are used to perform the detection of the relative positions of the marks MK1, MK3 on the fiducial mark plate FM2 and the projected images on the wafer surface, of the marks RMK1, RMK3 on the reticle corresponding thereto, i.e., the detection of the relative positional relationship between the marks MK1, MK3 and the exposure position (projection center of the projection optical system PL), in the same manner as described above. Subsequently, the main control unit 90 finally calculates the relative positional relationship between the exposure position and each shot in accordance with the relative positional relationship of each shot with respect to the mark MK2 on the fiducial mark plate FM2 previously determined and the relative positional relationship between the exposure position and the coordinate position of the mark MK1, MK3 on the fiducial mark plate FM2. Thus, the exposure (double exposure as described above) is started in accordance with an obtained result.

Figure 23:
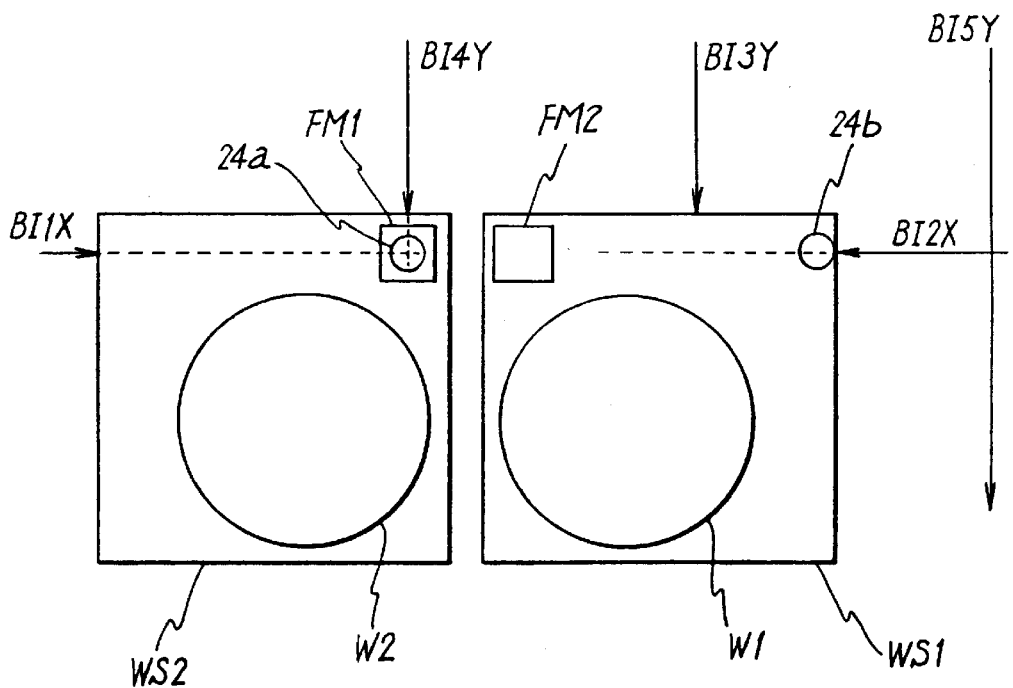
FIG. 23 explains the operation of the second embodiment, illustrating a situation in which the wafer stage WS1 is moved to the loading position, and the operation of the exposure sequence is performed on the side of the wafer stage WS2.

FIG. 23 shows a situation in which the wafer stage WS1 is moved to the loading position as described above, and the operation of the exposure sequence is performed on the side of the wafer stage WS2.

At the loading position, the mark MK2 on the fiducial mark plate FM1 is located under the alignment system 24a in the same manner as described in the first embodiment. The main control unit 90 is operated to detect the coordinate position of the mark MK2 on the first stage coordinate system (BI1X, BI4Y) simultaneously with completion of the wafer exchange in the same manner as described in the first embodiment. Subsequently, the EGA measurement is carried out for the mark on the wafer W1 to calculate the coordinate position of each shot in the same coordinate system. That is, the relative positional relationship of each shot with respect to the mark MK2 is calculated by subtracting the coordinate position of the mark MK2 on the fiducial mark plate FM1 from the coordinates position of each shot. The EGA operation is completed at this point of time, and the system waits for completion of the exposure for the wafer W2 on the wafer stage WS2 to make a change again to the state shown in FIG. 22.

According to the projection exposure apparatus concerning the second embodiment of the present invention explained above, it is possible to obtain effects equivalent to those obtained in the first embodiment described above. Besides, the reflection is allowed to occur simultaneously on the reflective surface of the wafer stage for the length-measuring axes used before and after the change respectively. during the movement of the stage when the change is made to the operation of the exposure sequence after completion of the operation of the alignment sequence. Further, the reflection is allowed to occur simultaneously on the reflective surface of the wafer stage for the length-measuring axes used before and after the change respectively during the movement of the stage when the change is made to the operation of the wafer exchange/alignment sequence after completion of the operation of the exposure sequence. Accordingly, it is possible that the mark on the fiducial mark plate is measured after the reset of the length-measuring interferometer by using the exposure light beam alignment sensor (reticle alignment microscope 142, 144) by the aid of the projection optical system PL, the reset for the length-measuring interferometer is executed prior to the wafer exchange, and the mark on the fiducial mark plate is measured after completion of the wafer exchange by using the off-axis alignment sensor (alignment system 24a, 24b). Therefore, the interferometer to be used for the stage control can be changed to the interferometer having the length-measuring axis to be used for the operation after the change, during the change from the alignment operation based on the use of each alignment system to the exposure operation based on the use of the projection optical system PL, and during the change from the exposure operation based on the use of the projection optical system PL to the wafer exchange operation. Accordingly, it is possible to further improve the throughput, as compared with the case of the first embodiment in which the length-measuring axis is changed simultaneously with the measurement of the mark on the fiducial mark plate.

In the first and second embodiments described above, explanation has been made for the case in which the present invention is applied to the apparatus for exposing the wafer based on the use of the double exposure method. However, such explanation has been made because of the following reason. That is, as described above, when the exposure is performed twice with the two reticles (double exposure) on the side of one of the wafer stages, during which the wafer exchange and the wafer alignment are concurrently carried out in parallel on the side of the other wafer stage which is independently movable, by using the apparatus according to the present invention, then the especially large effect is obtained in that the high throughput can be obtained as compared with the conventional single exposure, and it is possible to greatly improve the resolving power. However, the range of application of the present invention is not limited thereto. The present invention can be preferably applied when the exposure is performed in accordance with the single exposure method. For example, it is assumed that the respective processing times (T1 to T4) for an 8-inch wafer are the same as those described above. When the exposure process is performed in accordance with the single exposure method by using the two wafer stages as in the present invention, if T1, T2, T3 are dealt with as one group (30 second in total), and the concurrent process is performed for T4 (28 seconds), then there is given a throughput THOR=3600/30=120 [sheets/hour]. Thus, it is possible to obtain the high throughput which is approximately two times the throughput (THOR=62 [sheets/hour]) of the conventional apparatus in which the single exposure is carried out by using one wafer stage.

In the embodiment described above, explanation has been made for the case in which the scanning exposure is performed in accordance with the step-and-scan system. However, the present invention is not limited thereto. It is a matter of course that the present invention can be equivalently applied to a case in which the stationary exposure is performed in accordance with the step-and-repeat system, as well as those based on the use of the EB exposure apparatus and the X-ray exposure apparatus, and a process of the stitching exposure in which a chip is combined with another chip.

Third Embodiment

In the first embodiment of the present invention, the different operations are concurrently processed in parallel to one another by using the two wafer stages WS1, WS2. Therefore, there is a possibility that the operation performed on the one stage gives influence (disturbance) to the operation of the other stage. For this reason, as described above, it is necessary to adjust the timing for the operations performed on the two stages WS1, WS2.

In this embodiment, explanation will be made for the timing adjustment for the operations performed on the two stages WS1, WS2, with reference to FIGS. 11, 12 and 24.

As explained in the first embodiment, FIG. 11 shows an example of the timing of the exposure sequence for successively exposing the respective shot areas on the wafer W1 held on the stage WS1. FIG. 12 shows the timing of the alignment sequence for the wafer W2 held on the stage WS2, which is processed concurrently in parallel thereto.

As described above, the operations performed on the two stages WS1, WS2 include the disturbance factor operation in which the operation performed on one of the stages affects the operation performed on the other stage, and the non-disturbance factor operation in which the operation performed on one of the stages does no affect the operation performed on the other stage in a reverse manner. Accordingly, in the embodiment of the present invention, the operations to be concurrently processed are divided into disturbance factor operations and non-disturbance factor operations to achieve the timing adjustment so that a disturbance factor operation is successfully performed simultaneously with another disturbance factor operations, and a non-disturbance factor operations is successfully performed simultaneously with another non-disturbance factor operation.

Figure 24A:
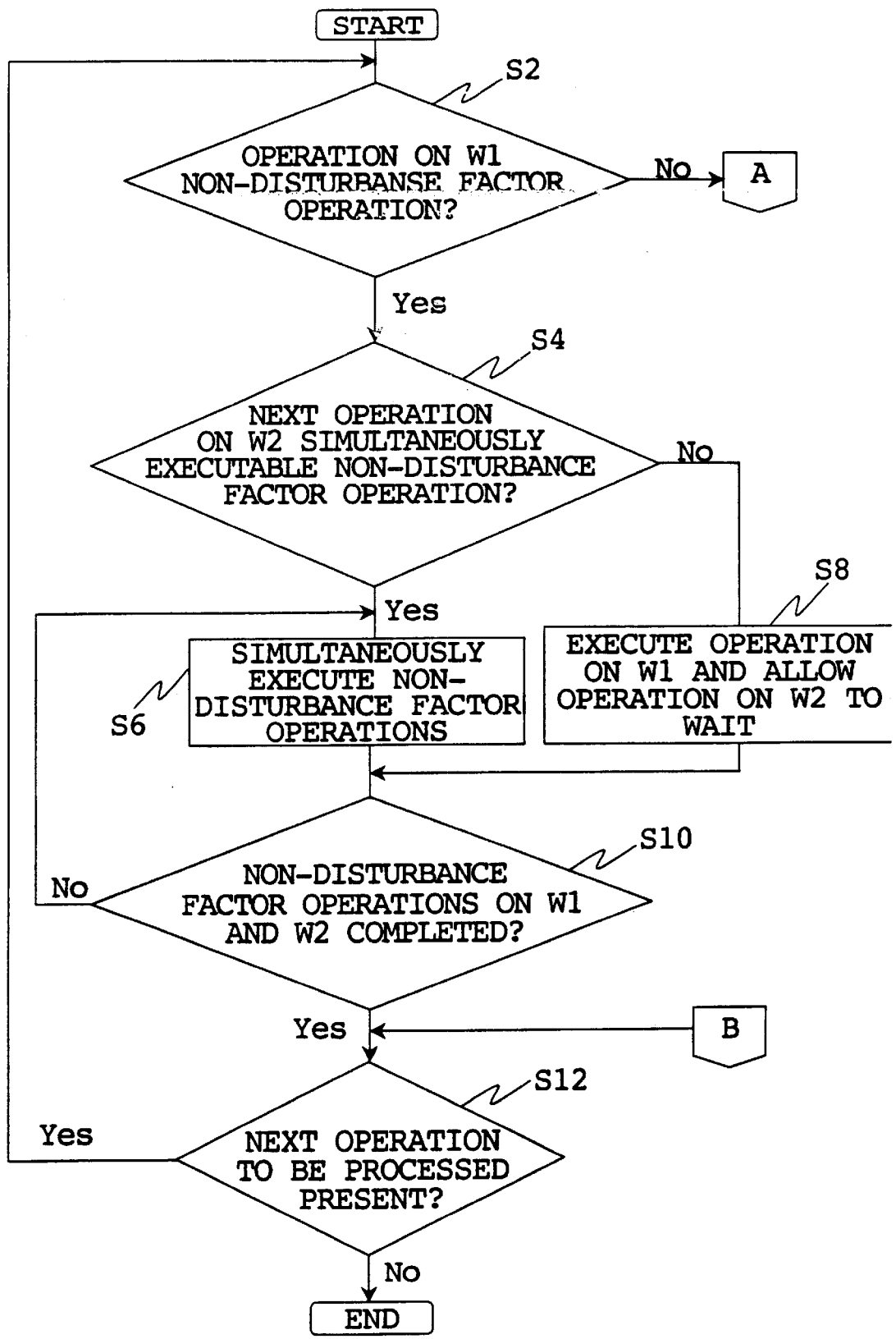
FIGS. 24A and B show a flow chart illustrating the timing control operation which is performed when the disturbance factor operation and the non-disturbance factor operation are performed on the two wafer stages.
Figure 24B:
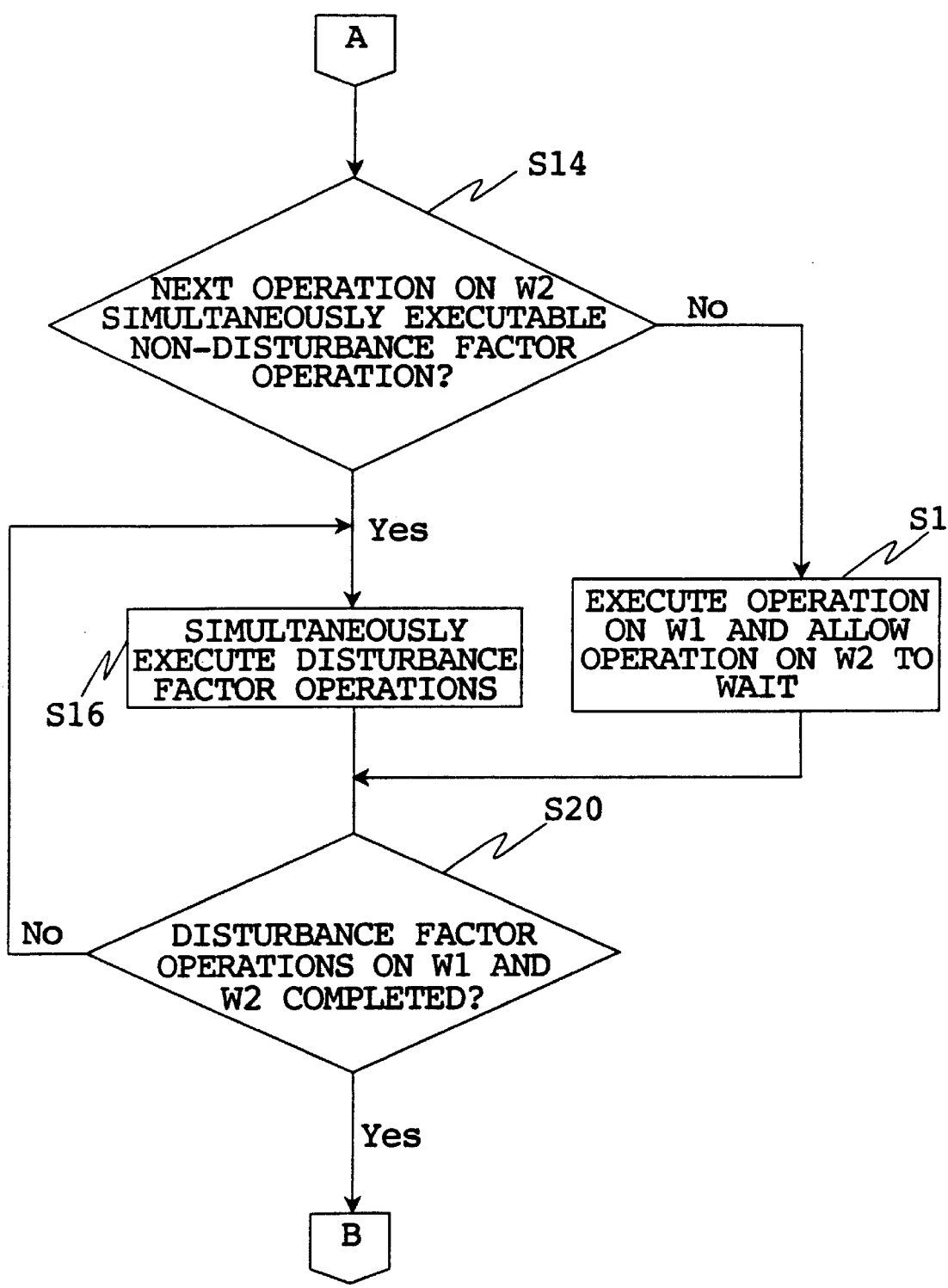

Upon the start of the timing adjustment for the operations as shown in FIG. 24, at first, the main control unit 90 is operated so that the exposure start position of the wafer W1 held on the stage WS1 is adjusted to be at the exposure position of the projection optical system PL for performing the exposure operation, and the detection start position for the mark on the wafer W2 held on the stage WS2 is adjusted to be at the detection position of the alignment system 24b for performing the alignment operation. In this state, the main control unit 90 waits for the input of a start command for the operation to be executed on the stage.

When the operation start command is inputted, the main control unit 90 judges in a step S2 whether or not the exposure operation performed on the wafer W2 is an operation not to behave as a disturbance factor (non-disturbance factor operation). The scanning exposure operation performed on the wafer W1 is a non-disturbance factor operation which does not affect the other stage, because the wafer W1 and the reticle R are subjected to synchronized scanning at a constant velocity. However, during the stepping operation corresponding to the movement between shot areas and across acceleration and deceleration areas existing before and after the constant velocity scanning, the scanning exposure operation behaves as a disturbance factor operation, because the stage WS1 is driven in an accelerating or decelerating manner. When the alignment operation is performed on the wafer W2, the operation behaves as a non-disturbance factor operation which does not affect the other stage, because the mark measurement is performed in a stationary state in which the mark is adjusted to the alignment system. However, the stepping operation corresponding to the movement between the marks to be measured behaves as a disturbance factor operation, because the stage WS2 is driven in an accelerating or decelerating manner.

Accordingly, in the step S2, when the operation performed on the wafer W1 is a non-disturbance factor operation such as the operation during the scanning exposure, it is necessary to exclude the disturbance factor operation from the operation concurrently processed on the wafer W2, because the exposure accuracy is lowered if the disturbance factor operation such as an stepping operation is performed on the other stage WS2. Therefore, if the judgment in the step S2 is affirmed, the main control unit 90 judges whether or not the operation to be performed next on the wafer W2 is a non-disturbance factor operation which is simultaneously executable (step S4). The non-disturbance factor operation, which is simultaneously executable on the wafer W2, includes, for example, a mark-detecting operation performed in a stationary state. In this embodiment, the non-disturbance factor operation as described above is executed simultaneously with another non-disturbance factor operation (step S6).

In the step S4, if the operation timing is deviated, or if there is no mark to be detected, then the routine proceeds to a step S8 to execute the scanning exposure operation on the wafer W1, and the processing operation on the wafer W2 is allowed to wait, because there is no non-disturbance factor operation which is simultaneously executable. The main control unit 90 judges in a step S10 whether or not the non-disturbance factor operations on the wafers W1, W2 are completed. If the operations are not completed, the routine returns to the step S6 to repeatedly perform the operation as described above. If the operations are completed, the presence or absence of the next processing operation is judged in the next step S12. If the next processing operation is present in the step S12, the routine returns to the step S2 to repeat the operation as described above. If the next processing operation is absent, the routine ends.

In the step S2, when the stage WS1 is subjected to stepping movement to make movement between shot areas on the wafer W1, then the main control unit 90 judges such movement to be a disturbance factor operation, and the routine proceeds to a step S14. The main control unit 90 judges whether or not an operation to be performed next on the wafer W2 is a simultaneously executable disturbance factor operation (step S14). The disturbance factor operation, which is simultaneously executable on the wafer W2, includes, for example, stepping movement between measurement marks. Therefore, the disturbance factor operation as described above is executed in a step S16 simultaneously with another disturbance factor operation.

In the step S14, if the operation timing is deviated, or if there is no stepping movement between measurement marks, then there is no simultaneously executable disturbance factor operation. Therefore, the routine proceeds to a step S18 to execute the stepping operation on the wafer W1, and the processing operation on the wafer W2 is allowed to wait. The main control unit 90 judges whether or not the disturbance factor operations on the wafers W1, W2 are completed in a step S20. If the operations are not completed, the routine returns to the step S16 to repeatedly perform the operation as described above. If the operations are completed, the routine proceeds to the step S12 to judge the presence or absence of any operation to be processed next. In the step S12, if there is any operation to be processed next, the routine returns to the step S2 again to repeat the operation as described above. If there is no operation to be processed next, the routine ends.

Next, explanation will be made for an example of adjustment for the operation timing on the two wafers W1, W2 with reference to FIGS. 11 and 12. At first, on the wafer W1 shown in FIG. 11, the scanning exposure operation (non-disturbance factor operation) indicated by the operation numbers of "1, 3, 5, 7, 9, 11, 13, 15, 17, 19, 21, 23" is successively performed along arrows depicted by chain lines. It is understood that on the wafer W2 shown in FIG. 12, the mark-measuring operation (non-disturbance factor operation) is performed in a stationary state at positions of respective alignment marks indicated by the operation numbers of "1, 3, 5, 7, 9, 11, 13, 15, 17, 19, 21, 23, . . . " in synchronization with the scanning exposure operation. On the other hand, no disturbance arises in the alignment sequence because the constant velocity movement is performed during the scanning exposure, and hence it is possible to perform highly accurate measurement.

In the alignment sequence (EGA) shown in FIG. 12, the alignment marks are measured at two points for each of the shot areas. Some of the alignment marks shown in FIG. 12 do not have operation numbers, because of the following reason. That is, for example, when an upper mark (before the operation number 4 in FIG. 12) of the next alignment shot is disposed in the vicinity of a lower mark (having the operation number 3 in FIG. 12) of the first alignment shot, then the upper mark is measured simultaneously with the lower mark, or the upper mark is measured after the wafer stage WS2 is moved by a minute distance at an acceleration of a degree at which the synchronization accuracy is not affected thereby with respect to the other wafer stage WS1. Therefore, these marks are indicated by the identical operation number (3 in this case). It is assumed that the measurement is performed in the same manner as described above for the alignment marks of the operation numbers other than the above.

On the wafer W1 shown in FIG. 11, the stepping movement (disturbance factor operation) between shot areas to be subjected to the scanning exposure is performed at the timing indicated by the operation numbers of "2, 4, 6, 8, 10, 12, 14, 16, 18, 20, 22". On the wafer W2 shown in FIG. 12, the stepping movement (disturbance factor operation) between measurement marks is performed at the timing indicated by the operation numbers of "2, 4, 6, 8, 10, 12, 14, 16, 18, 20, 22, . . . " in synchronization with the stepping movement of the wafer W1.

As shown in FIG. 7, when the wafer exchange operation is performed for the wafer W1, and the scanning exposure is performed for the wafer W2, then the disturbance factor arises, for example, in the vibration generated when the wafer W1 is delivered from the first load arm 188 to the center-up 180. However, in this case, it is assumed that the main control unit 90 performs the timing adjustment so that the wafer W2 is allowed to wait before and after the scanning exposure. Further, a disturbance factor arises concerning the wafer W2 in the process of acceleration or deceleration before or after the arrival at a constant velocity for the synchronized scanning for the wafer and the reticle. Therefore, the timing adjustment may be performed so that the wafer W1 is delivered in synchronization with this process.

As described above, the main control unit 90 is operated to adjust the operation timing so that the operations which behave as disturbance factors are performed in synchronization with each other as far as possible, or the operations which behave as non-disturbance factors are performed in synchronization with each other as far as possible, of the operations to be concurrently processed on the wafers W1, W2 held on the two stages respectively. Thus, it is possible to avoid the mutual influence which would be otherwise exerted by the disturbance, even when the respective operations are concurrently processed in parallel to one another on the two stages. All of the timing adjustment described above is performed by using the main control unit 90.

Figure 25A:
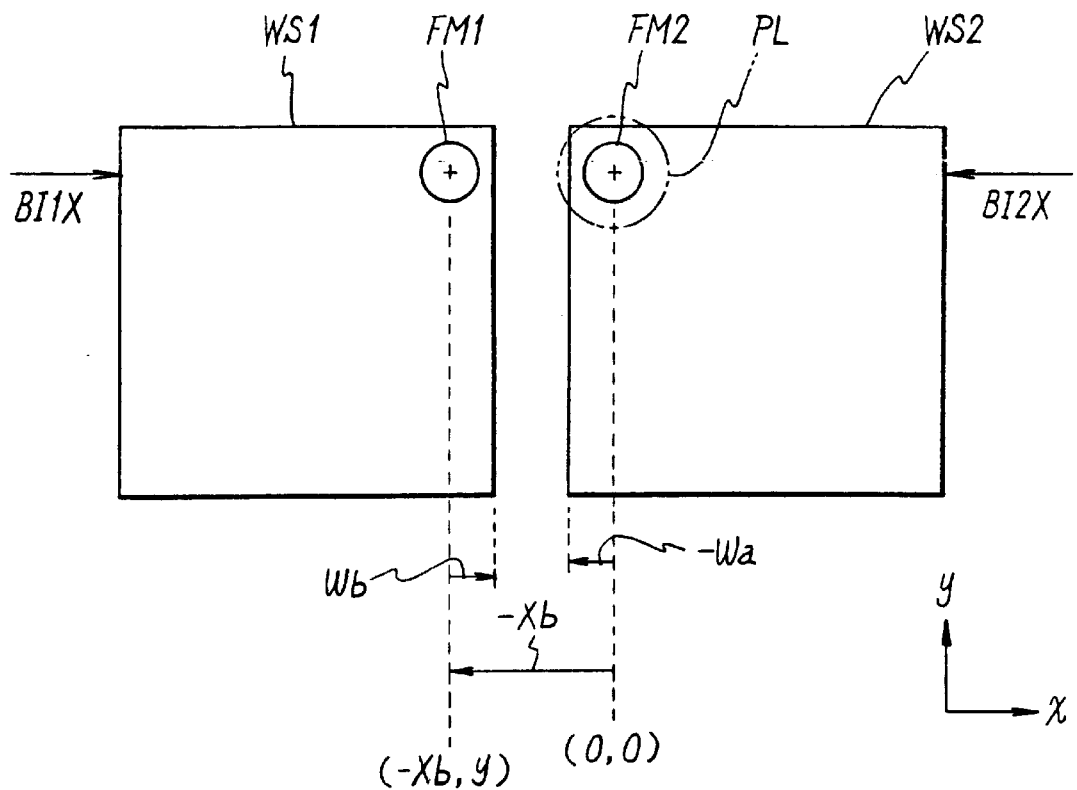
FIG. 25A shows a plan view of the stages illustrating the non-interference condition which is used when the two wafer stages are moved and controlled independently from each other.

Next, explanation will be made for the interference condition to determine whether or not the two wafer stages WS1, WS2 make contact with each other, with reference to FIGS. 25A and 25B. FIG. 25A shows a state in which the wafer stage WS2 is located under the projection optical system PL, and the reference mark on the fiducial mark plate FM2 on the wafer stage WS2 is observed by using the TTR alignment system described above. It is assumed that the coordinate position (x, y) of the wafer stage WS2 at this time is (0, 0). Assuming that the X coordinate at the left end of the wafer stage WS2 is (−Wa) with respect to the reference mark on the fiducial mark plate FM2, the coordinate position at the left end of the wafer stage WS2 is (−Wa, y).

The coordinate position concerning the wafer stage WS1 is assumed as follows in the same manner as described above. That is, the coordinate position, which is obtained when the reference mark is measured by moving the fiducial mark plate FM1 on the wafer stage WS1 up to the position under the projection optical system PL, is (0, 0). The amount of movement from this position to the position of the wafer stage WS1 shown in FIG. 25A is (−Xb). The X coordinate at the right end of the wafer stage WS1 with respect to the reference mark on the fiducial mark plate FM1 is (Wb). On this assumption, the coordinate position at the right end of the wafer stage WS1 is (−Xb+Wb, y).

The condition, under which the both wafer stages WS1, WS2 make no interference with each other, lies in a state in which the left end of the wafer stage WS2 makes no contact with the right end of the wafer stage WS1. Therefore, this condition may be represented by a conditional expression of $0 < -Wa-(-Xb+Wb)$.

Figure 25B:
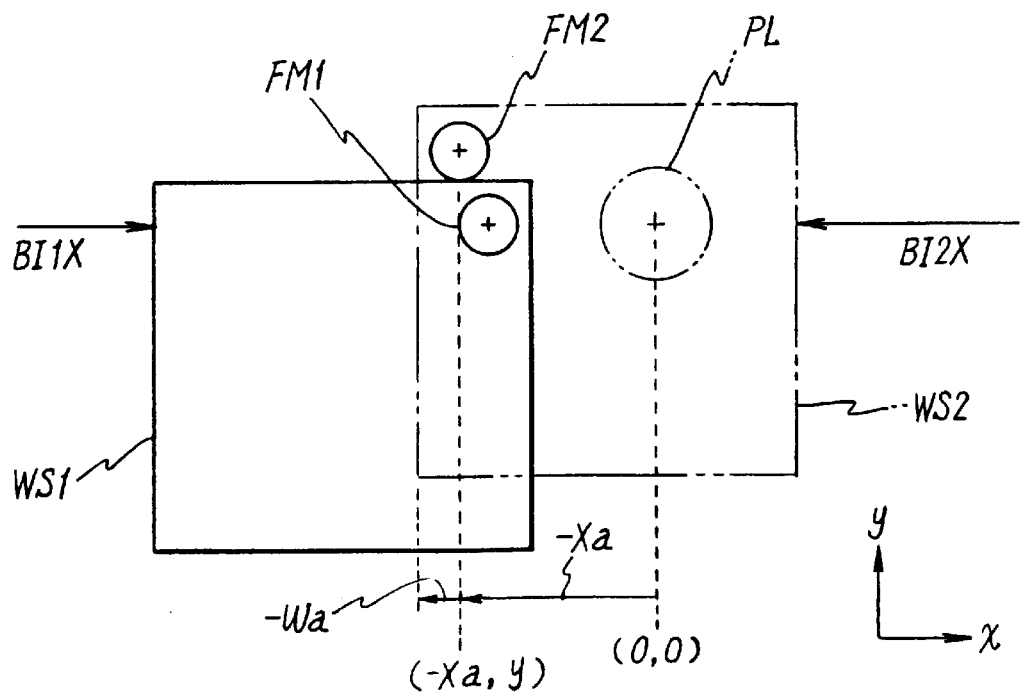
FIG. 25B shows a plan view of the stages illustrating the interference condition which is used when the two wafer stages are moved and controlled independently from each other.

On the contrary, FIG. 25B assumes a state in which the wafer stage WS1 is moved in the direction of (−Xa) by a predetermined distance from the state shown in FIG. 25A, and the two wafer stages WS1, WS2 are overlapped with each other (actually, the two wafer stages are not overlapped with each other, however, when the respective wafer stages are independently controlled, there is a possibility that target values for the respective stages may be set as shown in FIG. 25B). The coordinate position at the left end of the wafer stage WS2 is (−Xa−Wa, y). The condition, under which the both wafer stages WS1, WS2 cause interferrence with each other, lies in a state in which the left end of the wafer stage WS2 is contacted or overlapped with the right end of the wafer stage WS1. Therefore, this condition may be represented by a conditional expression depicted by $0 > -Xa-Wa-(-Xb+Wb)$.

The conditional expression may be represented by the following general expression by using a certain reference point based on the use of the same coordinate:

$$Wa+Wb<Xb-Xa \qquad \text{conditional expression 1}$$

If the conditional expression 1 is satisfied, the two wafer stages can be freely moved without any interference with each other.

On the other hand, if the following conditional expression 2 is satisfied, the two wafer stages make contact with each other to cause interference.

$$Wa+Wb \geq Xb-Xa \qquad \text{conditional expression 2}$$

Therefore, the main control unit 90 controls the movement of the respective wafer stages WS1, WS2 to satisfy the conditional expression 1 as far as possible, while if a situation in which the conditional expression 2 is satisfied is postulated, it is necessary to make control in order to allow any one of the stages to wait so that the occurrence of mutual interference between the stages is avoided. The conditional expressions 1 and 2 have been explained as two separate individuals for the purpose of more comprehensive explanation. However, the two conditional expressions are substantially one conditional expression, because there is a relationship in which one of the conditional expressions is in contradiction to the other.

Figure 26:
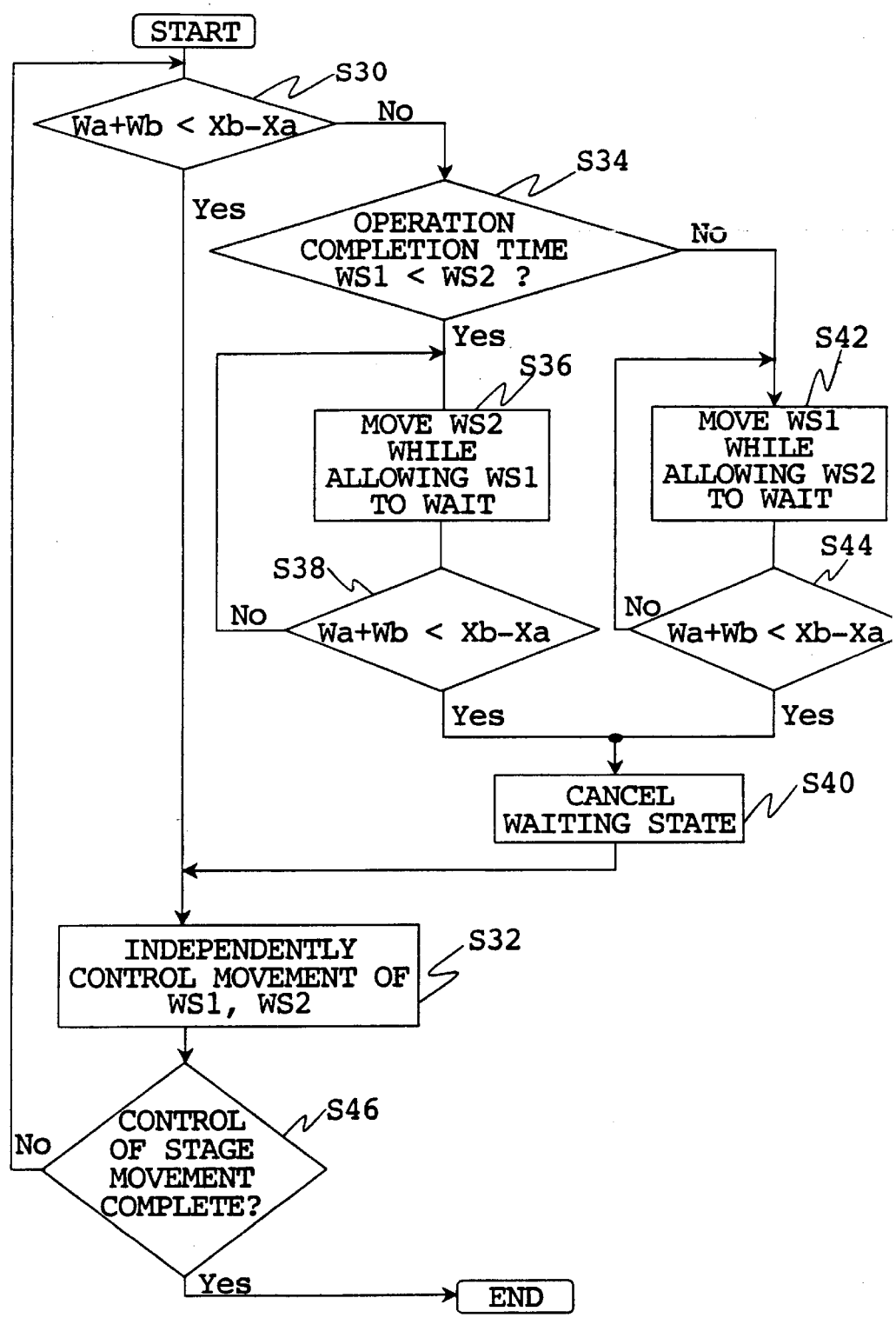
FIG. 26 shows a flow chart illustrating the movement control operation of the two stages, which is used when the interference condition is satisfied or when the interference condition is not satisfied.

Explanation will be made with reference to a flow chart shown in FIG. 26 for a sequence to perform control of the movement without causing any interference between the both wafer stages by using the main control unit 90 on the basis of the conditional expression described above. At first, upon the start of the control operation, the main control unit 90 measures the coordinate positions of the two wafer stages WS1, WS2 by using values obtained by the interferometers based on the use of the origin (0, 0) of the same reference position (position of the optical axis of the projection optical system PL in this case). The conditional expression 1, which is previously stored in the memory 91, is substituted with necessary parameters (Wa and Wb in this case).

When the stage movement control is started, the main control unit 90 grasps the present positions of the two wafer stages WS1, WS2 on the basis of values obtained by using the length-measuring axes (for example, BI1X, BI2X) of the interferometers. The main control unit 90 is able to calculate and postulate the coordinate positions of the stages WS1, WS2 in future, on the basis of driving target values inputted into the stage control unit 38. The main control unit 90 determines, from these coordinate positions, the movement direction and the movement distance (Xb and Xa in this embodiment) of the two stages WS1, WS2 with respect to the reference position to substitute the conditional expression 1 therewith. Thus, it is possible to judge whether or not the conditional expression 1 (Wa+Wb<Xb−Xa) is satisfied (step S30).

If the conditional expression 1 is satisfied, no mutual interference occurs between the two wafer stages WS1, WS2. Accordingly, the both stages WS1, WS2 can be independently moved and controlled (step S32).

If the conditional expression 1 is not satisfied in the step S30, the interference occurs between the wafer stages WS1 and WS2. Therefore, the main control unit 90 compares the time until completion of the operation performed on the stage WS1 with that of the stage WS2 (step S34). If the operation on the stage WS1 is completed earlier, then the main control unit 90 allows the stage WS1 to wait, and the wafer stage WS2 is preferentially moved and controlled (step S36). During the control of the movement of the wafer stage WS2, the main control unit 90 always judges whether or not a situation is given, in which the conditional expression 1 is satisfied (step S38). During the period in which the conditional expression 1 is not satisfied, the routine returns to the step S36 to preferentially move and control the wafer stage WS2. If the conditional expression 1 is satisfied in the step S38, the main control unit 90 is operated so that the waiting state of the wafer stage WS1 is canceled (step S40) to independently move and control the wafer stages WS1, WS2 respectively (step S32).

In the step S34, if the operation of the stage WS2 is completed earlier, then the main control unit 90 allows the stage WS2 to wait, and the wafer stage WS1 is preferentially moved and controlled (step S42). During the control of the movement of the wafer stage WS1, the main control unit 90 always judges whether or not a situation is given, in which the conditional expression 1 is satisfied (step S44). During the period in which the conditional expression 1 is not satisfied, the routine returns to the step S42 to preferentially move and control the wafer stage WS1. If a state is given, in which the conditional expression 1 is satisfied in the step S44, the waiting state of the wafer stage WS2 is canceled by the main control unit 90 (step S40) to independently move and control the wafer stages WS1, WS2 respectively (step S32).

If the stage movement control is continuously performed by using the main control unit 90, the routine returns from the step S46 to the step S30 to repeatedly perform the movement control as described above. If the stage movement control is not performed, the control operation is ended.

As described above, the main control unit 90 controls the movement of the two stages WS1, WS2 by the aid of the conditional expression and the stage control unit 38. Thus, it is possible to prevent the both stages from mutual interference.

When the double exposure method described above is carried out, the operation completion time on the stage for performing the exposure operation is later than that on the stage for performing the alignment operation, because the exposure operation is repeated twice. For this reason, when the mutual interference occurs between the stages, then the stage for the alignment, on which the operation is completed earlier, is allowed to wait, and the stage for the exposure is preferentially moved.

However, on the stage for the alignment, it is allowable to concurrently perform not only the fine alignment operation as described above but also the wafer exchange operation, the search alignment operation, and operations other than the above in parallel to one another. Therefore, it is desirable that the operation time on the stage for the alignment is shortened as short as possible.

Figure 27A:
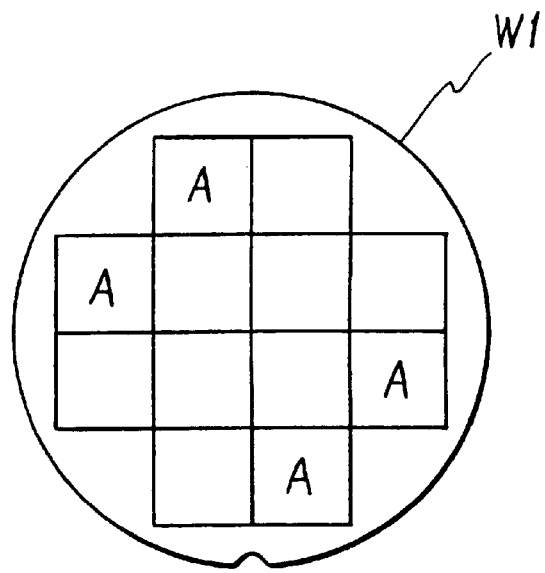
FIG. 27A shows a plan view of the wafer illustrating the sample shots for which the alignment is performed.
Figure 27B:
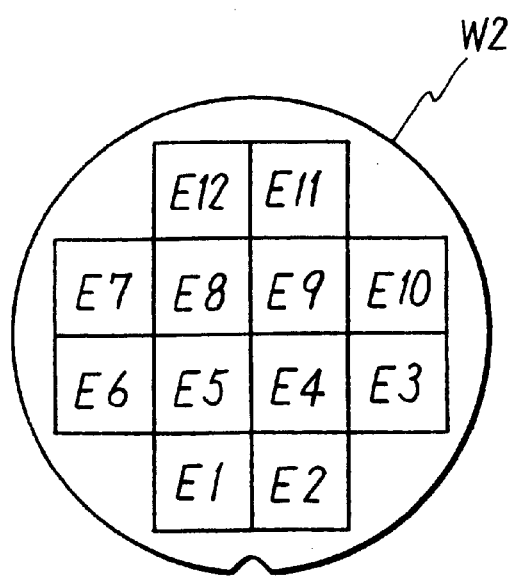
FIG. 27B shows a plan view of the wafer illustrating the shot areas for which the exposure is performed.
Figure 28A:
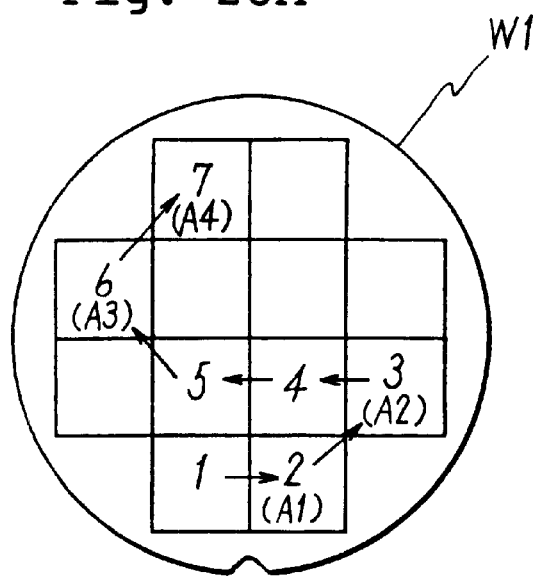
FIG. 28A shows a plan view of the wafer illustrating the order of shots used when the alignment sequence is performed.
Figure 28B:
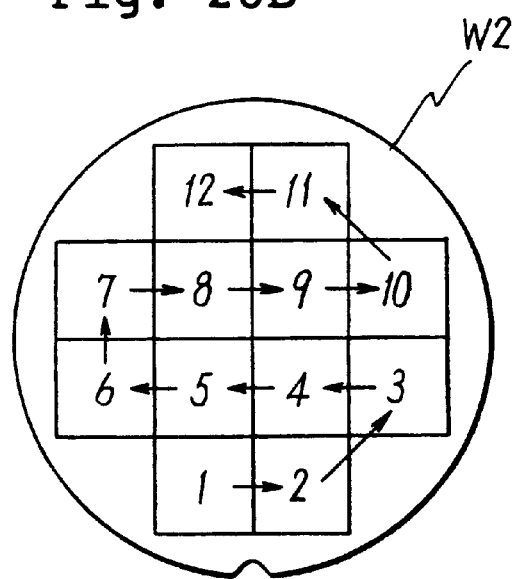
FIG. 28B shows a plan view of the wafer illustrating the order of exposure used when the exposure sequence is performed.

Accordingly, as shown in FIG. 27B, the most efficient stepping roller (E1 to E12) is set for the wafer W2 for performing the exposure operation, because the exposure operation constitutes the rate-limiting condition for the throughput. On the contrary, as shown in FIG. 27A, several shots of the exposure shots are selected as sample shots on the wafer W1 for performing the alignment operation based on EGA. In this embodiment, it is assumed, for example, that four shots indicated by symbol "A" are selected. The stepping order on the alignment side (W1) is determined to make movement corresponding to the stepping order in the exposure operation for the wafer W2, as on the wafer W1 disposed on the alignment side as shown in FIG. 28A. As for the wafer W2 shown in FIG. 28B, operations during the exposure, for which the influence of disturbance should be suppressed, are designated by numerical numbers (1 to 12), while stepping operations which are not affected by disturbance are indicated by arrows (→).

As shown in FIG. 28A, when the fine alignment operation based on EGA is performed on the wafer W1, the movement order is determined so that the alignment operation is performed for the shot areas corresponding to those on the wafer W2 to perform the scanning exposure as shown in FIG. 17B for the operation numbers 1 to 5. Accordingly, when the movement order of the alignment shots is made to be the same as that for the exposure shots, the two stages are moved in parallel to one another while maintaining a constant spacing distance therebetween. Therefore, it is possible to control the movement without satisfying the interference condition.

In the case of the wafer W1 shown in FIG. 28A, the alignment order is determined as follows. That is, when the operation number is moved from 5 to 6 in a stepping manner, the operation skips to the shot area A3 located thereover by one row, and when the operation number becomes 7, the operation skips to the shot area A4. This is because of the following reason. That is, when the shot area, which is indicated by the operation number 6 or 7 on the wafer W2 shown in FIG. 28B to be subjected to the scanning exposure, is disposed under the projection optical system PL, the wafer stage WS2 is at a position spaced apart from the wafer stage WS1 (the wafer W2 is disposed at the most rightward position concerning the position of the operation number 6 or 7, because the alignment system is fixedly secured, and the wafer is moved). Accordingly, it is possible to relatively freely move the wafer stage WS1 for performing the alignment operation. As described above, the fine alignment time can be further shortened by moving the wafer W1 as shown in FIG. 28A to perform the alignment operation.

Alternatively, when an alignment mark at one point is detected for every one shot area to use all shot areas as sample shots, unlike the sample shots used in the alignment sequence described above, it is possible to avoid deterioration of throughputs. In this procedure, the alignment marks in the shot areas corresponding to the exposure order on the wafer W2 are successively measured. The occurrence of interference between the stages disappears as described above. Further, when such EGA is performed, it is possible to expect further improvement in alignment accuracy owing to the averaging effect.

As explained above, according to the projection exposure apparatus 10 concerning the embodiment of the present invention, the operations of the both stages are controlled so that the operations which behave as disturbance factors are performed in synchronization with each other, or the operations when do not behave as disturbance factors are performed in synchronization with each other, of the operations to be performed on the two wafer stages which independently hold the two wafers respectively. Accordingly, the alignment operation can be processed concurrently with the exposure operation without decreasing the synchronization accuracy when the scanning exposure is performed and without decreasing the mark measurement accuracy when the alignment is performed. Thus, it is possible to improve the throughput.

According to the embodiment described above, when the two wafer stages are independently moved and controlled in the XY two-dimensional direction, then the condition of interference between the two wafer stages (interference condition) is previously stored, and the movement is controlled so that the interference condition is not satisfied as far as possible. Accordingly, the movement ranges of the both stages can be overlapped with each other. Therefore, it is possible to decrease the foot prints.

According to the embodiment described above, when the two wafer stages are independently moved in the XY direction, if the interference condition is satisfied in each of the stages, then the stage on which the operation is completed earlier is allowed to wait until the operation is changed, and the other stage is preferentially subjected to the movement control. Accordingly, it is possible to avoid the interference between the stages without deteriorating the throughput.

According to the embodiment described above, when arbitrary shots are selected as alignment shots from a plurality of shot areas on the wafer to be used in the alignment sequence for performing the mark measurement, the order of measurement of the alignment shots is determined so that the interference is avoided between the both stages as less as possible. Accordingly, it is possible to appropriately suppress the case of the interference condition between the stages and the case in which one of the stages is allowed to wait as described above.

In the embodiment described above, the order of alignment shots and the order of exposure shots are determined so that the two wafer stages are moved in the same direction, if possible. Accordingly, the range of movement of the two wafer stages can be decreased as small as possible, and it is possible to miniaturize the apparatus. However, when the projection optical system and the alignment system can be installed while they are spaced apart from each other by a certain distance, then the two wafer stages, which are movable on the base pedestal, may be moved in mutually opposite directions in a left-right symmetric manner. Accordingly, the loads act on the vibration-preventive mechanism for supporting the base pedestal so that the loads are offset with each other. Therefore, the output of the vibration-prevention mechanism can be suppressed to be small, the inclination of the stage and the occurrence of vibration are decreased, and the vibration convergence time can be shortened. Thus, it is possible to further improve the operation accuracy and the throughput.

In the embodiment described above, explanation has been made for the case in which the alignment operation and the wafer exchange operation are processed concurrently with the exposure operation. Of course, the present invention is not limited thereto. The operation, which may be performed concurrently with the exposure operation, includes, for example, base line check (BCHK). A sequence such as those for calibration which is performed every time when the wafer exchange is performed may be processed concurrently with the exposure operation in the same manner as described above.

Fourth Embodiment

Next, the fourth embodiment of the present invention will be explained with reference to FIGS. 29 to 43. In the fourth embodiment of the present invention, the pre-measurement AF/AL is performed by using one wafer stage WS, while the focus/leveling control is performed on the basis of obtained results of the measurement so that the exposure process is executed.

Figure 29:
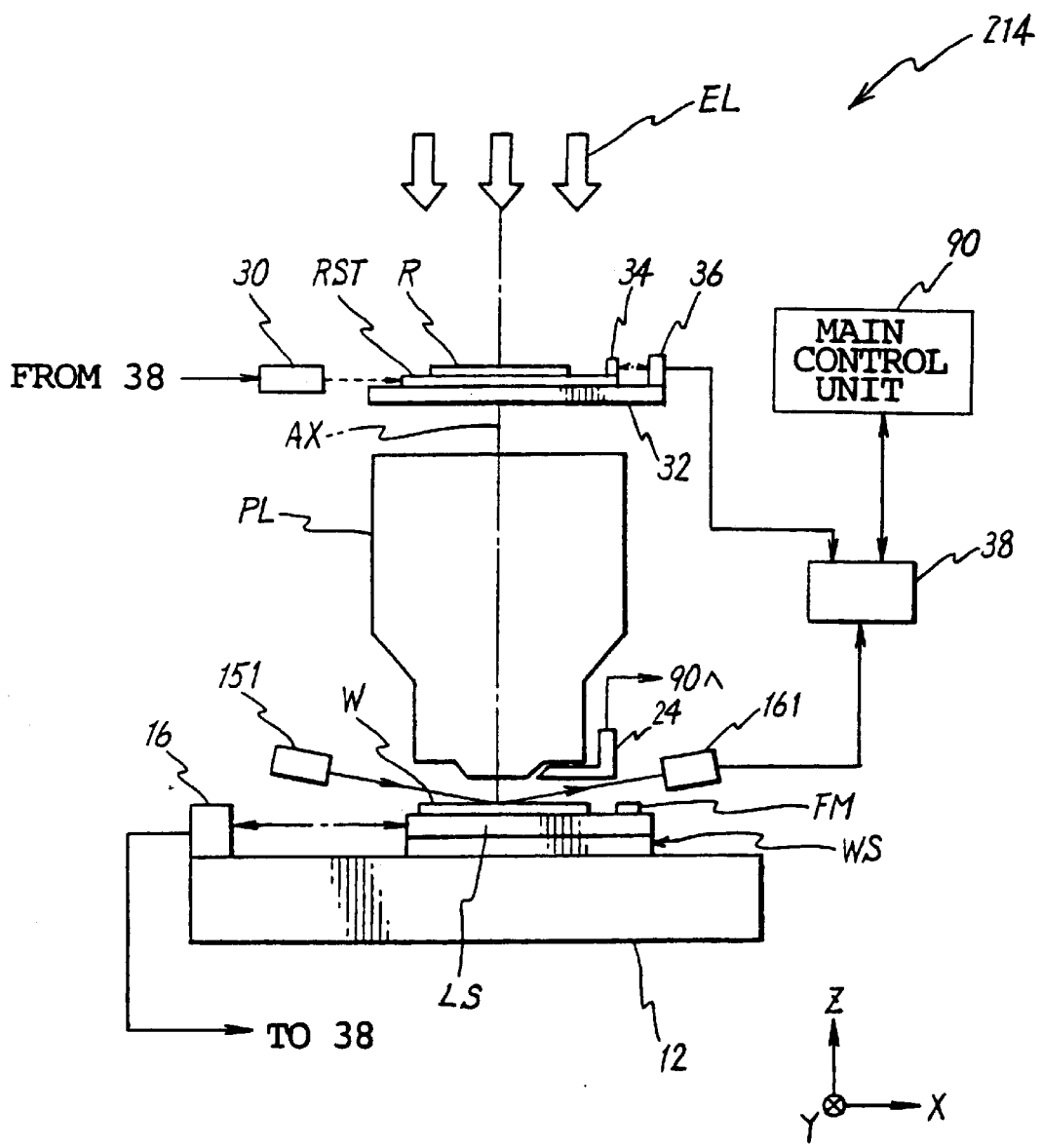
FIG. 29 shows a schematic arrangement of the projection exposure apparatus according to the second embodiment.

FIG. 29 shows a schematic arrangement of a projection exposure apparatus 214 according to the fourth embodiment. The projection exposure apparatus 214 is a scanning exposure type projection exposure apparatus based on the step-and-scan system in the same manner as described in the first embodiment. Basic constitutive components of the projection exposure apparatus 214 are the same as those of the projection exposure apparatus 10 according to the first embodiment shown in FIG. 1. The same parts or components are designated by the same reference numerals, explanation for the construction of which will be omitted. The projection exposure apparatus 214 is different from the projection exposure apparatus 10 of the first embodiment in the following points. That is, the wafer stage WS is constructed as one individual, and the AF/AL systems for measuring the surface position on the wafer W for pre-measurement control are provided on one side and the other side of the exposure area IF in the scanning direction. Further, the projection exposure apparatus 214 comprises an irradiating optical system 151 and a light-collecting optical system 161 based on the oblique incidence system constructed so that a plurality of detecting points are arranged over a range wider than the width of the exposure area IF in the non-scanning direction. Moreover, the wafer stage WS according to the fourth embodiment of the present invention is provided with a Z-leveling stage LS as a substrate-driving system for making fine driving and oblique driving in the Z axis direction while holding the wafer W.

Figure 30:
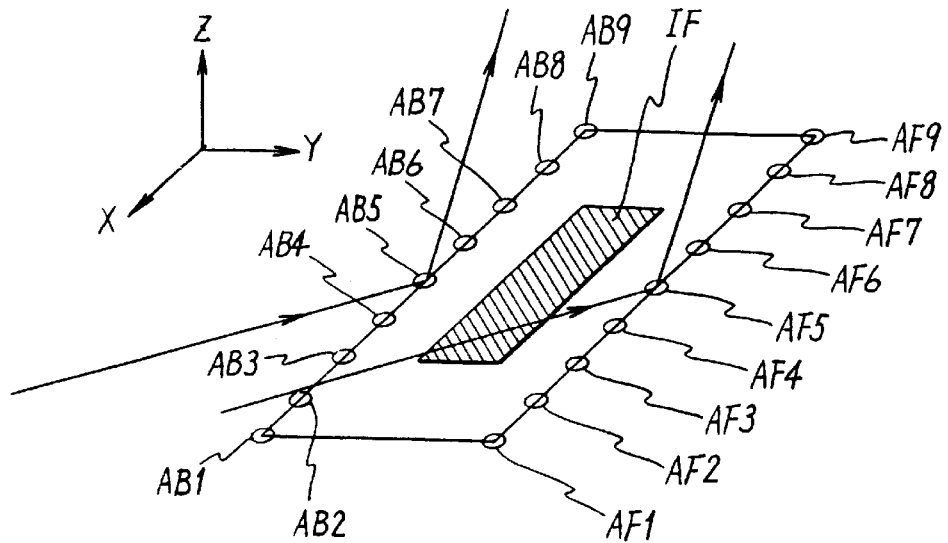
FIG. 30 shows a perspective view illustrating the arrangement of the AF detecting points for pre-measurement with respect to the exposure area.

As viewed in FIG. 30 illustrating, in a perspective view, the arrangement of the AF detecting points for the pre-measurement control with respect to the exposure area IF, a detecting area AFE (see FIG. 35), which is constructed by the detecting points AF1 to AF9 in the non-scanning direction (±X direction), is provided in the scanning direction (+Y direction) for the exposure area IF. The detecting area AFE is arranged over a range larger than the width of the exposure area IF in the non-scanning direction. Further, a detecting area ABE (see FIG. 35), which is constructed by the detecting points AB1 to AB9 in the non-scanning direction (±X direction), is provided in the scanning direction (−Y direction) for the exposure area IF. The detecting area ABE is arranged over a range larger than the width of the exposure area IF in the non-scanning direction. The detecting points AF1 to AF9 and the detecting points AB1 to AB9 are arranged on the front sides in the scanning directions (+Y direction, −Y direction) for scanning the exposure area IF respectively. The relative position, which indicates the degree of discrepancy of the surface of the wafer W at each of the detecting points with respect to a predetermined reference plane, is detected prior to the exposure for the shot area.

Figure 31:
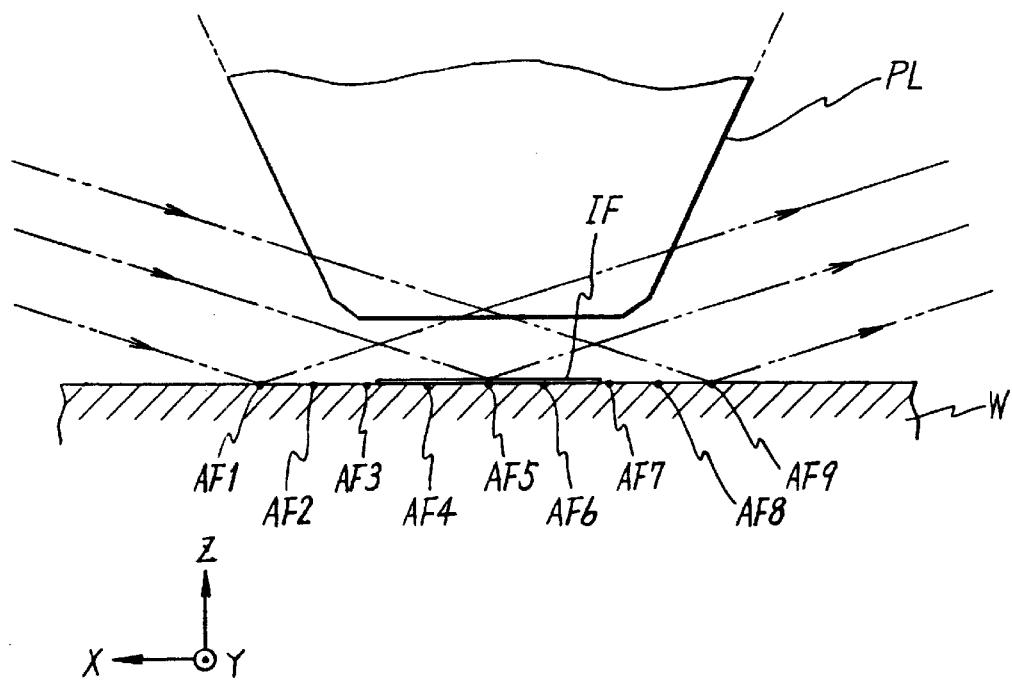
FIG. 31 shows a side view of FIG. 30 as viewed in the scanning direction.
Figure 32:
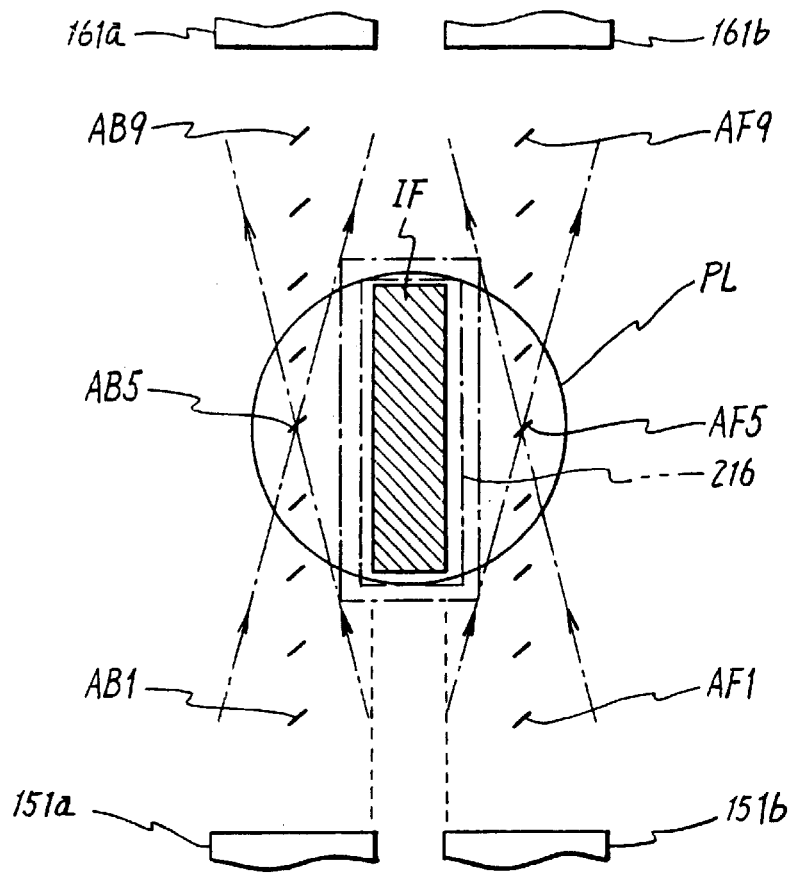
FIG. 32 shows a plan view of FIG. 31.
Figure 33:
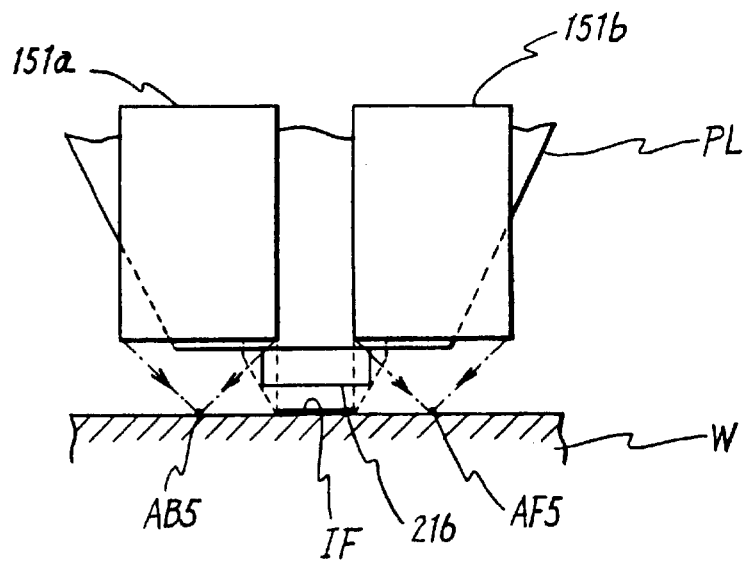
FIG. 33 shows a side view of FIG. 32 as viewed in the non-scanning direction.

FIG. 31 shows a side view of FIG. 30 as viewed in the scanning direction, FIG. 32 shows a plan view of FIG. 31, and FIG. 33 shows a side view of FIG. 32 as viewed in the non-scanning direction.

As shown in FIGS. 32 and 33, the light beams, which are radiated from the irradiating optical systems 151a, 151b of the oblique incidence type AF/AL system, form the detecting points AB1 to AB9 and the detecting points AF1 to AF9 extending over the surface of the wafer W in the non-scanning direction. The light beams reflected by the surface of the wafer W are received by the light-collecting optical systems 161a, 161b of the oblique incidence type AF/AL system. This arrangement is provided because of the following reason. That is, in general, it is impossible to perform measurement for the inside of the exposure area IF by using the oblique incidence AF system, because the working distance between the wafer W and the lower surface of the projection lens is narrowed in accordance with the increase in N.A. (numerical aperture) of the projection lens of the projection optical system PL. However, in the present invention, even in such a case, it is intended to execute the complete pre-measurement.

As shown in FIGS. 31 and 33, the fourth embodiment of the present invention is constructed as follows. That is, the shape of the projection optical system PL in the vicinity of its lower end is an inverted truncated cone. A plurality of irradiating light beams coming from the irradiating optical systems 151a, 151b are radiated onto the respective positions of the detecting points on the wafer W. The reflected light beams coming from the surface of the wafer W pass through the both sides of the projection optical system PL, and they are received by the light-collecting optical systems 161a, 161b. The arrangement as described above is provided in order that the AF light beams are not intercepted in the vicinity of the lower end of the projection optical system PL. A parallel flat plate 216 having a rectangular configuration is disposed at the lowermost plane of the projection optical system PL in conformity with the scanning direction in order to harmonize the extending portion of N.A. with the direction of 45° of the projection optical system PL, and in order to correct the aberration of the projection lens which constructs the projection optical system PL. The AF detecting points, which extend one-dimensionally in the non-scanning direction, are arranged at two places as those for +Y scanning and −Y scanning, in front of and at the back of the parallel flat plate 216 in the scanning direction. For example, when this system is compared with a two-dimensional detection type AF mechanism as described in Japanese Laid-Open Patent Publication No. 6-283403 corresponding to U.S. Pat. No. 5,448,332, then the AF measurement cannot be performed at the exposure position, while it is possible to form a long spot group extending in the non-scanning direction, and the detecting points are arranged one-dimensionally. Accordingly, this system is advantageous in that the offset error, which is caused by intra-plane curvature of the respective AF spots in the Z direction, can be easily corrected. Further, for example, when a method for forming the interference fringe in the non-scanning direction by means of two-directional incidence is adopted, the present invention is easily and advantageously applied, because the present invention resides in the pre-measurement control method for the one-dimensional process for detecting the AF/AL position by means of one-dimensional image processing in accordance with the distance error and the positional variation of the interference fringe. Moreover, the light beams are divided into those for the two places of the detection areas AFE, ABE. Accordingly, when a cover which does not intercept the respective light beams is provided so that the AF/AL accuracy, which varies depending on the temperature change, is improved by allowing a temperature-controlled gas to flow through the inside of the cover, then an effect is obtained in that the detection error is further reduced.

Figure 42:
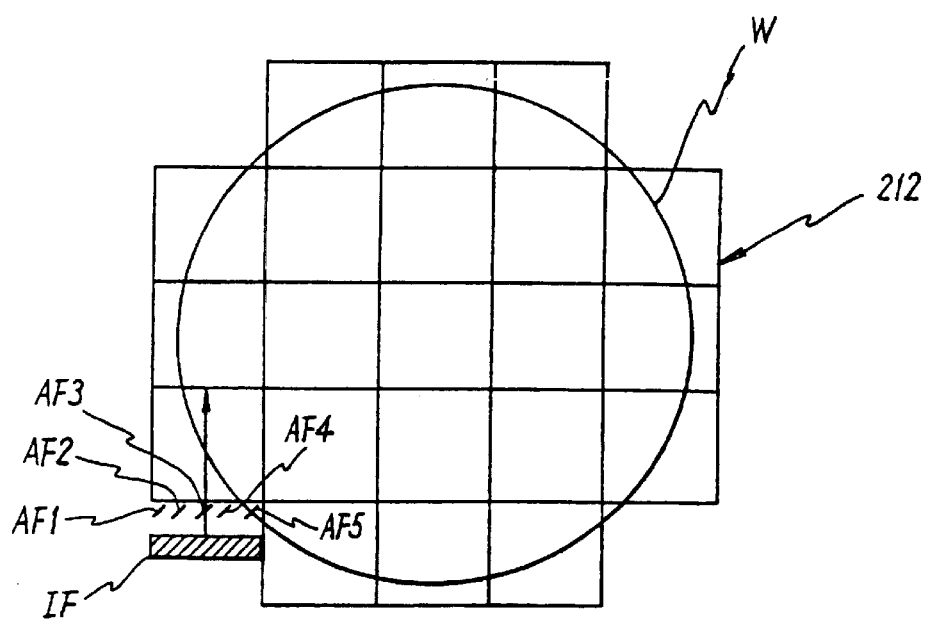
FIG. 42 shows Comparative Example concerning the pre-measurement control performed when the shot array is larger than the outer circumference of the wafer W.
Figure 43:
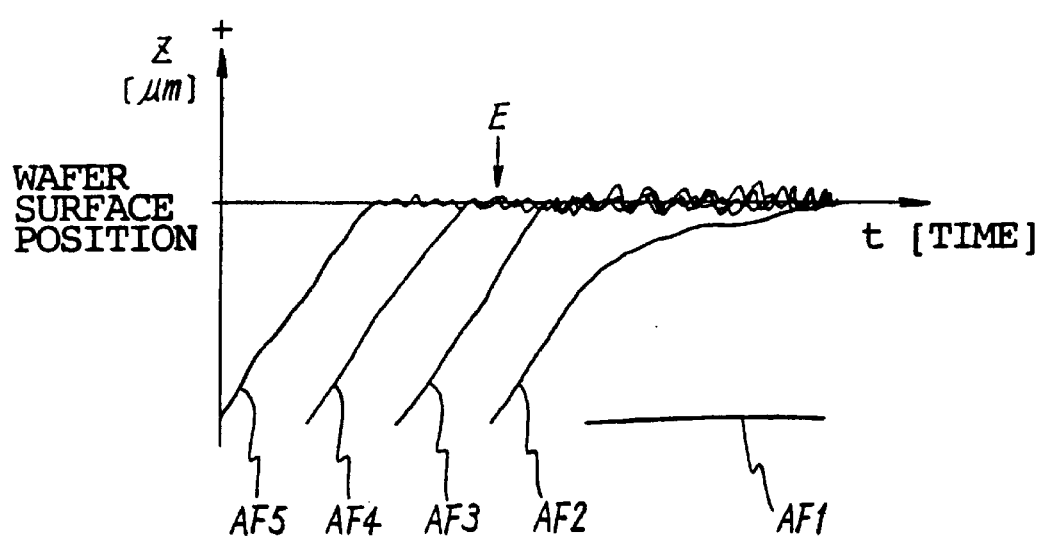
FIG. 43 shows Comparative Example concerning the pre-measurement control performed when the shot array is larger than the outer circumference of the wafer W.

Next, explanation will be made for the pre-measurement control based on the use of the projection exposure apparatus 214 according to the fourth embodiment of the present invention, in which the shot array is larger than the outer circumference of the wafer W. For example, FIG. 42 shows Comparative Example concerning pre-measurement control, in which the shot array is larger than the outer circumference of the wafer W. In FIG. 42, AF detecting points AF1 to AF5, which are arranged in the non-scanning direction, are disposed on the front side in the scanning direction with respect to the exposure area IF subjected to scanning exposure (in the direction indicated upwardly by an arrow in the plane of the paper; actually, the exposure area IF and the AF detecting point AF1 to AF5 are fixed, and the wafer W is scanned with respect thereto, however, for convenience, the illustration is given such that the exposure area IF and the AF detecting points shown in the drawing are scanned with respect to the wafer surface). A detecting area AFB, which is constructed by the AF detecting points AF1 to AF5, is provided to perform AF measurement for executing complete pre-measurement control. The width of the detecting area AFB is approximately the same as the width of the exposure area IF in the non-scanning direction. When the pre-measurement control is made by using the projection exposure apparatus constructed as shown in FIG. 42 (Comparative Example), AF output values ranging from AF1 to AF5 are obtained in accordance with the movement of the stage as shown in FIG. 43. In FIG. 43, the horizontal axis indicates the movement time [t] of the stage, and the vertical axis indicates the relative position [μm] in the Z direction with respect to the surface position of the wafer. As shown in the diagram in FIG. 43, the detecting points AF5 to AF3, which overlap the surface of the wafer W, gradually represent the surface position of the wafer in accordance with the movement of the detecting points in the scanning direction. However, the detecting points AF2 and AF1 do not pass over the wafer surface until the end. Therefore, no normal output value is obtained for the detecting points AF2 and AF1. As described above, when it is intended to carry out the pre-measurement control for all shot areas based on the five-point measurement as illustrated in Comparative Example shown in FIGS. 42 and 43, then an error occurs for the shot area in the vicinity of the outer circumference of the wafer, and it is impossible to perform the AF/AL control in some cases. In order to avoid this inconvenience, it is necessary to make change into an AF/AL control sequence for incomplete shot areas so that the pre-measurement control is carried out while performing scanning from the inside to the outside of the wafer W, or the exposure process is carried out by using measurement data on the surface position of the wafer concerning the adjacent shot.

On the contrary, as shown in FIG. 30, in the fourth embodiment of the present invention, the width of the AF detecting points in the non-scanning direction is widened as compared with the exposure area IF, and thus the surface position of the wafer of the adjacent shot area can be measured. Accordingly, the pre-measurement control, which scarcely suffers from error, is performed by utilizing the result of the measurement.

Figure 34:
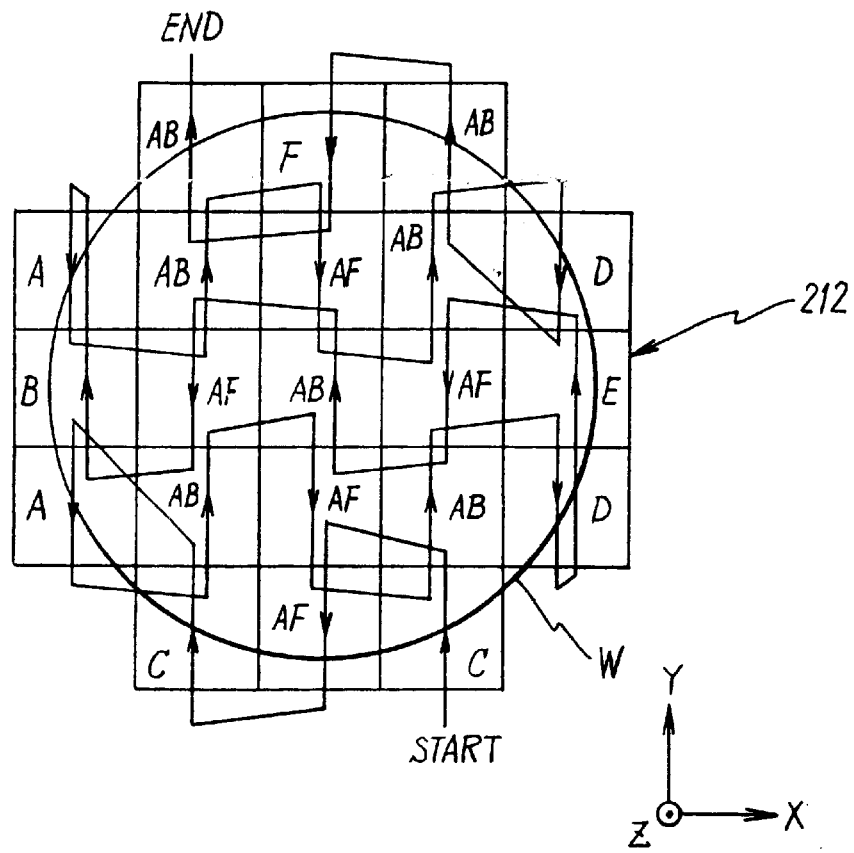
FIG. 34 shows a plan view illustrating the pre-measurement control method based on the use of the AF/AL system according to the second embodiment.
Figure 35:
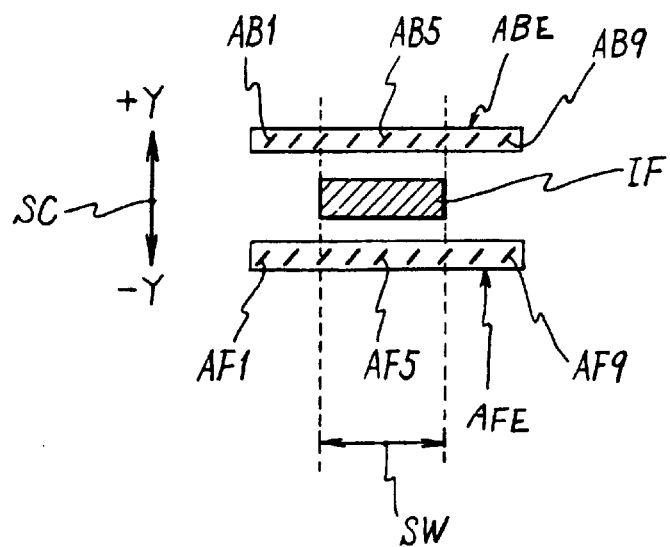
FIG. 35 shows the positional relationship between the exposure area IF and the AF detecting points during the focus measurement.

FIG. 34 shows a plan view of the wafer W, which explains the pre-measurement control method based on the use of the AF/AL system according to the fourth embodiment. FIG. 34 shows grouping for respective shot areas, designated when the pre-measurement control is carried out in an order in which the wafer W can be exposed most quickly. FIG. 35 shows a positional relationship between the exposure area IF and the AF detecting points during the focus measurement. In this embodiment, it is previously determined that what AF detecting points (AF1 to AF9, AB1 to AB9) are used for each of the shot areas to perform the AF measurement, by making grouping such as "A, B, C, D, E, F, AF, AB", so as to previously determine the positions of the detecting points used for respective groups, as shown in a table in FIG. 36. In the table shown in FIG. 36, the position of the AF detecting point (AF1 to AF9, AB1 to AB9) to be used is indicated in the lateral direction, and the name of the group obtained by grouping the respective shot areas is indicated in the vertical direction. The control is made by the main control unit 90 so that the pre-measurement control is performed by using the AF detecting points (sensors) affixed with circle symbols at the crossing positions thereof.

Figures 36, 37:
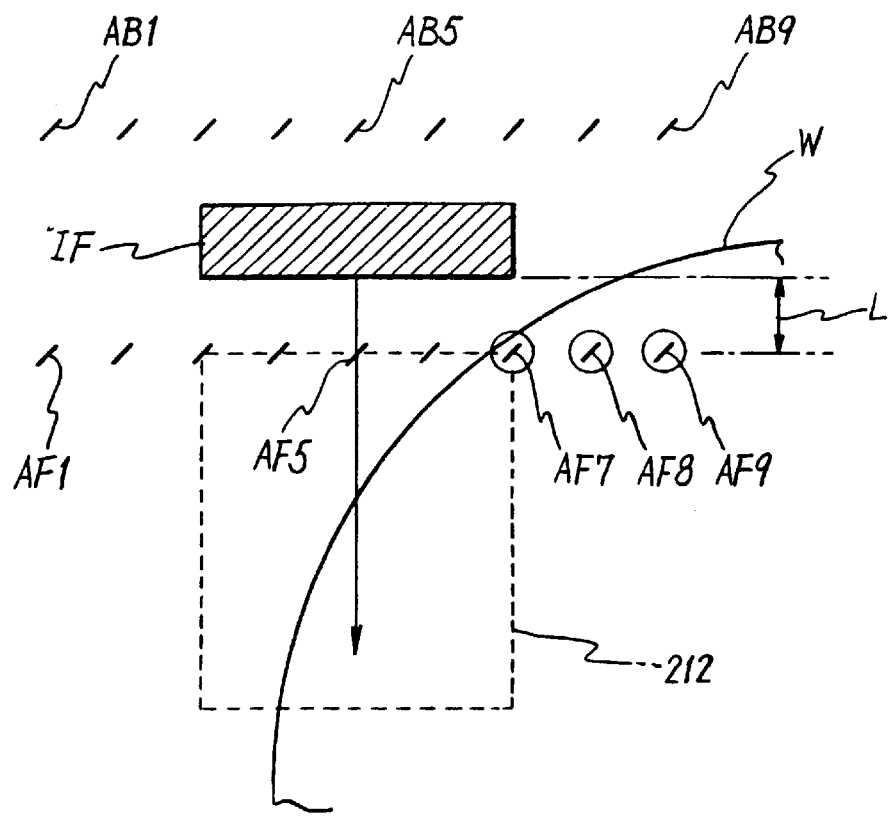
FIG. 36 shows a selection procedure for designating the position of the AF detecting point used for the AF measurement for each shot area.
FIG. 37 shows the positions of the AF detecting points used when the shot area belonging to the group A is exposed, and the wafer surface upon the start of the pre-measurement control.

For example, FIG. 37 shows the positional relationship at the point of time to start the pre-measurement control for the wafer surface and the AF detecting points used when the shot area 212 of the group A is exposed (for example, when the shot area located at the upper-left end in FIG. 34 is exposed). In this case, the control is made by the main control unit 90 so as to use the AF detecting points AF7, AF8, AF9 which are located at positions separated from the exposure area IF by a distance L in the scanning direction. In this procedure, at the point of time to start the pre-measurement control shown in FIG. 37, all of the three AF detecting points (AF7, AF8, AF9) designated by the main control unit 90 are located on the wafer surface. Therefore, the pre-measurement control is performed on the basis of measured values measured at the three AF detecting points AF7, AF8, AF9 until completion of the exposure for the shot area 212 indicated by broken lines.

The process shown in FIGS. 36 and 37 resides in the "AF detecting point fixation method" in which the AF detecting points to be used are previously fixed corresponding to the shot area. In the example shown in FIG. 37, only the detecting point AF7 is actually measured in the shot area 212. The AF/AL control based on the pre-measurement can be performed by using measured values for the detecting points AF8, AF9 disposed on the adjacent shot area.

When no incomplete AF detecting point is included in the shot area during the pre-measurement control, namely when the group AF or the group AB shown in FIG. 34 is processed, the measurement is performed by using only the detecting points AF3 to AF7 and AB3 to AB7 located in the shot area designated in the table in FIG. 36. The detecting points AF1, AF2, AF8, AF9 located outside the shot area are not used.

In the case of the group E shown in FIG. 34, the measurement is performed by using the detecting points AF1 to AF5 as designated in the table in FIG. 36. In the case of the group E, the detecting points AF6, AF7 can be measured on the way of the process of the pre-measurement control as shown in FIG. 34. Accordingly, the accuracy is increased when measured values for the detecting points AF6, AF7 are used. However, an advantage is obtained in that the control process effected by the main control unit 90 can be simplified in a degree corresponding to the nonnecessity to change the AF detecting point used in one time of exposure operation during setting for the shot array. Therefore, if the control process has a certain margin, it is preferable that the measured values for the detecting points AF6, AF7 are used to perform more highly accurate focus/leveling control.

Figure 38:
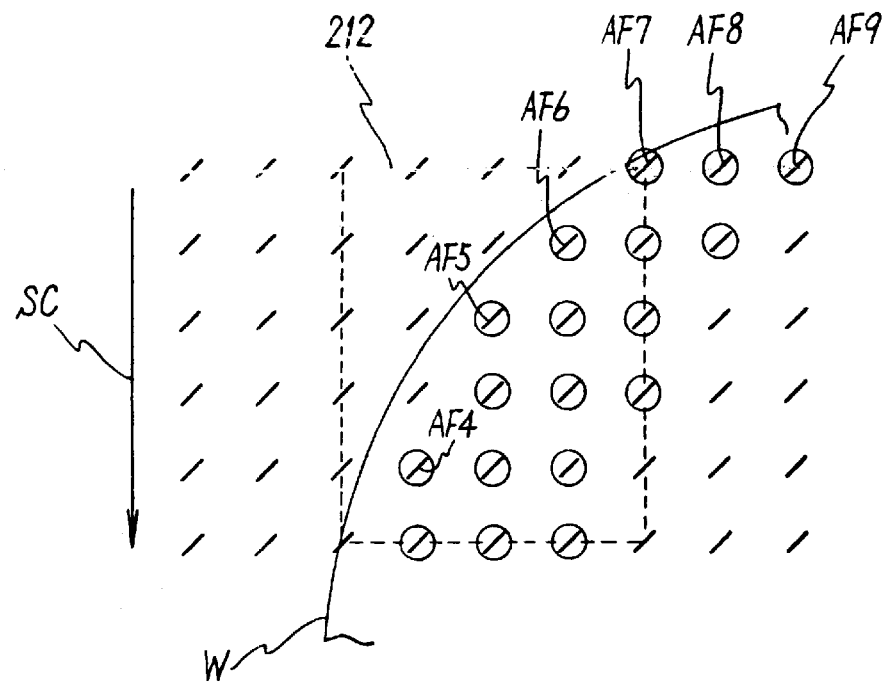
FIG. 38 shows the AF detecting points used when the focus measurement is performed for the wafer surface by moving the AF detecting points without changing the number of the AF detecting points to be used.

Next, explanation will be made for pre-measurement control methods other than above. FIG. 38 lies in the "AF detecting point movement type" in which the focus measurement for the wafer surface is performed for a predetermined shot area by moving the AF detecting points in conformity with successive movement in the scanning direction of the sensors capable of performing AF measurement on the surface of the wafer W without changing the number of AF detecting points to be used. In principle, this method is the most excellent measuring method having the highest accuracy, of AF measurement methods based on the pre-measurement control. When the "AF detecting point movement type" is carried out, the main control unit 90 makes control so that the AF detecting points are changed on the basis of positional information on the outer circumference of the wafer, positional information on the AF detecting points, and positional information on the shot area as the exposure objective, in order to recognize what AF detecting point overlaps the effective area located inside the prohibition zone defined at the circumferential edge portion of the wafer W, while moving the wafer W in the scanning operation. For example, in the case of the procedure shown in FIG. 38, the measurement is firstly performed by using three detecting points AF7, AF8, AF9. Secondly, detecting points AF6, AF7, AF8 are used. Thirdly, detecting points AF5, AF6, AF7 are used. Finally, detecting points AF4, AF5, AF6 are used. In such a way, the sensors are changed so as to select the three detecting points, if possible, within the shot area 212 within the effective area on the wafer surface. Accordingly, even when the outer circumferential portion of the wafer W, at which the shot area is provided, is subjected to scanning exposure from the outside to the inside by moving the exposure area IF (actually, the relative scanning is performed by moving the wafer W with respect to the exposure area IF which does not make movement), it is possible to quickly drive the wafer surface position into the image formation plane of the projection optical system PL by performing the pre-measurement control. Thus, it is possible to perform quickly and highly accurate focus/leveling control. As for the method for the change, it is preferable to perform grouping as described above, or it is preferable to always monitor the outputs of all of the sensors to use the detecting point which comes within an allowable value.

Figure 39:
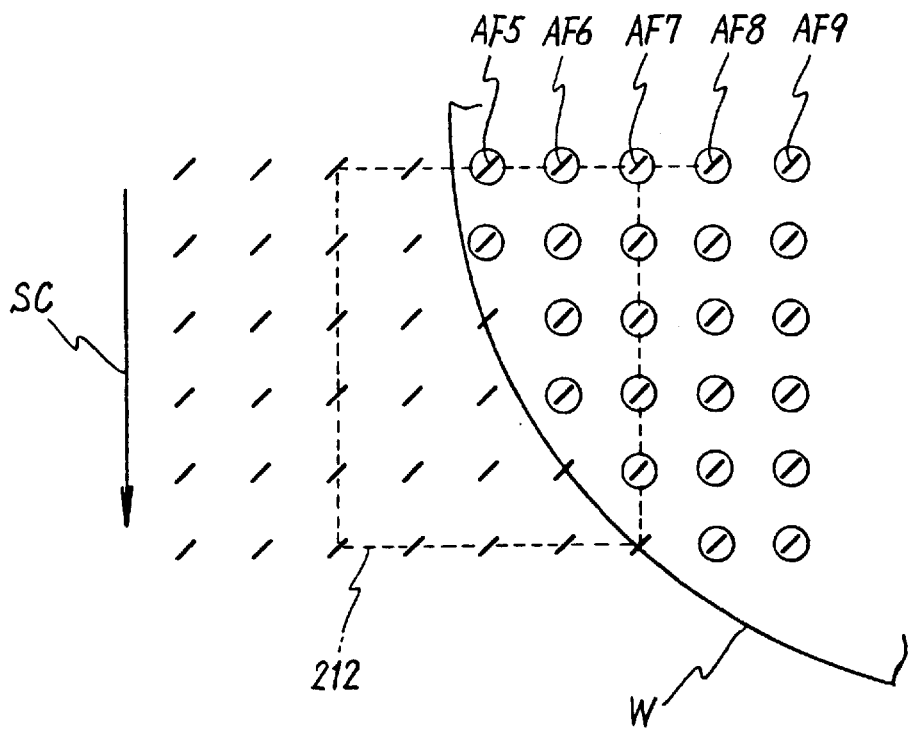
FIG. 39 shows the AF detecting points used when the focus measurement is performed for the wafer surface by using all of the measurable AF detecting points.

FIG. 39 resides in the "AP sensor number and position variable type" in which all detecting points are used provided that the measurement can be performed therefor, regardless of the number of the AF detecting points to be used. This procedure is characterized in that the averaging effect is enhanced owing to the use of a plurality of AF detecting points, making it possible to be scarcely affected by camber or the like possibly existing at the outer circumferential portion of the wafer. For example, when the reproducibility is unsatisfactory in the AF measurement, this effect is further enhanced. In the case of the procedure shown in FIG. 39, like in FIG. 38, the main control unit 90 also makes control so that the AF detecting points are changed on the basis of positional information on the outer circumference of the wafer, positional information on the AF detecting points, and positional information on the shot area as the exposure objective, in order to recognize what AF detecting point overlaps the effective area located inside the prohibition zone defined at the circumferential edge portion of the wafer W, while moving the wafer W in the scanning direction. In this procedure, the number of the AF detecting points is not limited. Therefore, the AF/AL measurement is performed by using all of the detecting points included in the effective area, of the detecting points AF1 to AF9. Accordingly, even when the shot area located in the vicinity of the outer circumferential of the wafer W is subjected to scanning exposure from the outside to the inside, it is possible to quickly drive the wafer surface position into the image formation plane of the projection optical system PL by performing the pre-measurement control. Thus, it is possible to perform quick and highly accurate focus/leveling control.

The use of the pre-measurement control method as described above may be used to make addition to the technique described, for example, in Japanese Laid-Open Patent Publication No. 6-283403 corresponding to U.S. Pat. No. 5,448,332. Thus, it is possible to perform quick and highly accurate scanning exposure for the respective shot areas on the wafer surface in accordance with the most rapid exposure order, regardless of classification of shot areas into those located inside the wafer and those located in the vicinity of the outer circumference of the wafer.

Next, explanation will be made for what data are adopted as pre-measurement data when the pre-measurement control is performed as described above. It is assumed, for example, that the width of the exposure area IF in the scanning direction is 6 to 8 mm, and the scanning velocity of the wafer during the exposure is 80 to 90 mm/sec. While being affected by the waviness frequency of the wafer surface, it is desirable for the throughput to give a relationship of the acceleration until the pre-measurement AF detecting point arrives at the wafer scanning velocity during exposure+the adjustment distance (L=8 to 10 mm), in a degree corresponding to the absence of unnecessary run-up. This procedure is executed as follows. That is, the pre-measurement position is calculated from information in the data file on the position of the outer circumference of the wafer, the coordinate position of the shot area, and the distance L from the exposure area IF to the AF detecting point. When the pre-measurement start position is located inside the pattern prohibition zone (usually about 30 mm; see FIG. 30) at the outer circumference of the wafer, the sensor corresponding thereto is adopted. However, the outer circumference of the wafer tends to be affected by camber and dust. Even in the case of the pre-measurement start position set in the data file, the position does not necessarily represent the accurate position of the wafer surface.

Figure 40:
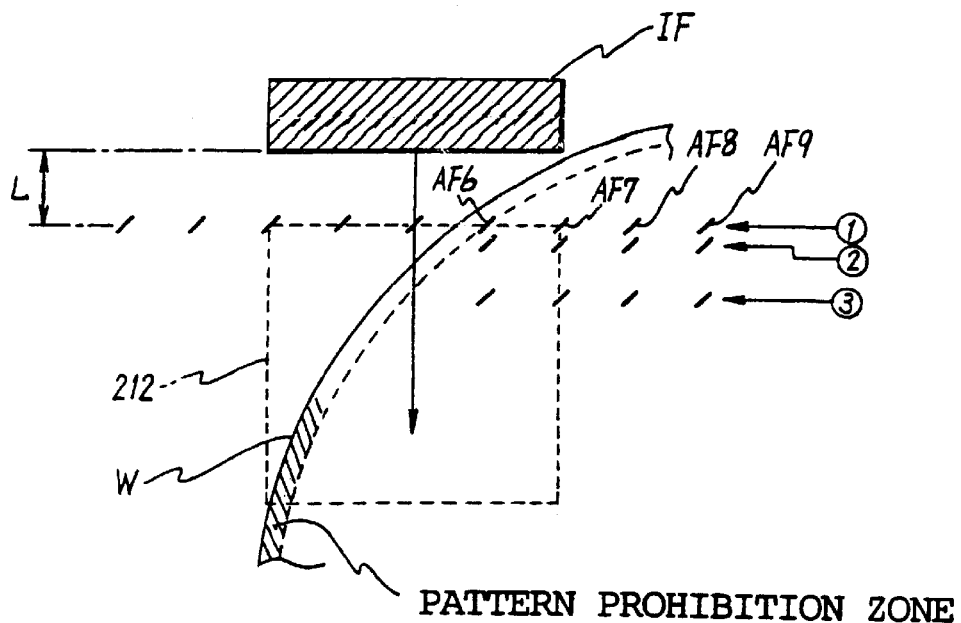
FIG. 40 shows the positions of the AF detecting points used when the shot area belonging to the group C is exposed, and the wafer surface upon the start of the pre-measurement control.
Figure 41:
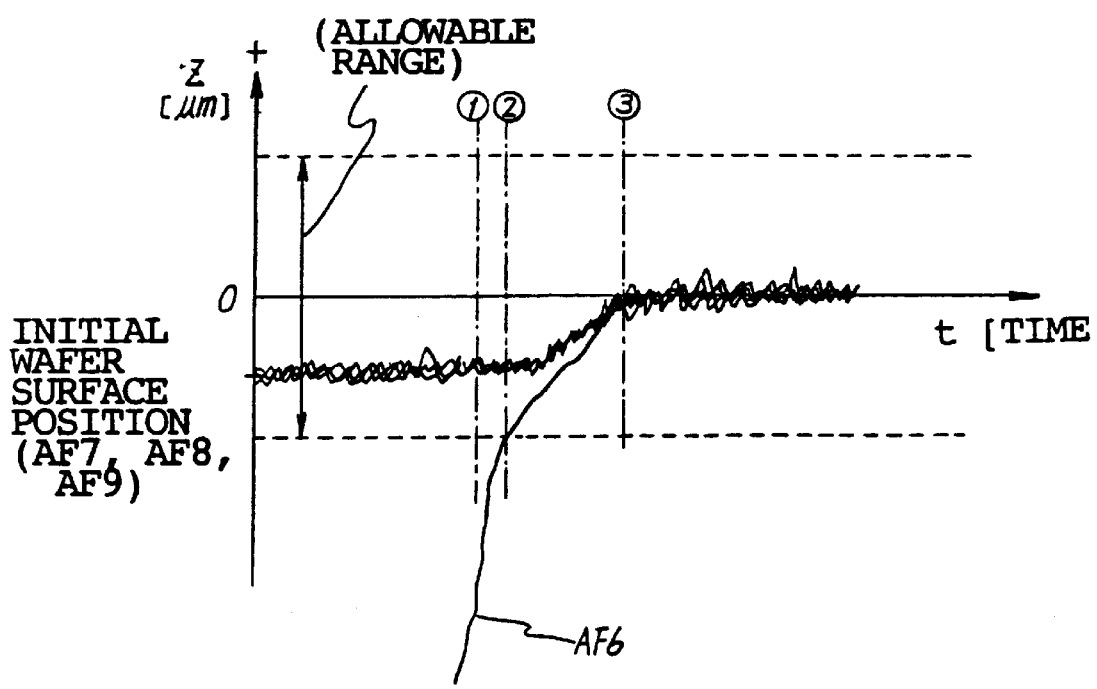
FIG. 41 shows a diagram illustrating the result of the pre-measurement control performed as shown in FIG. 40.

Explanation will now be made for the procedure in which the control error caused in the aforementioned case is made as small as possible, with reference to FIGS. 40 and 41. In FIG. 40, it is assumed that, for example, when the AF detecting points AF6 to AF9 are used as in the group C in the "AF detecting point fixation method" described above, the pre-measurement control start coordinate is located at a position (1) shown in FIG. 41 according to calculation based on the use of the data file, however, the position (1) is affected by the pattern prohibition zone, and it fairly suffers from de-focusing. In this case, as shown in FIG. 41, when the pre-measurement control is started at the position (1), the output values of the respective sensors are affected by the detecting point AF6. If the result of measurement obtained by the pre-measurement involves a sizeable error with respect to the target, it seriously affects the leveling control, because the corresponding sensor is disposed at the most right end of the AF detecting points.

If the system is designed such that the pre-measurement point is moved at 80 mm/sec, and 70% thereof can be subjected to control during scanning, and if the detecting point AF6 disposed at the most right end involves an error of not more than several $\mu$m in the Z axis direction, then the system merely suffers from a small error owing to the averaging effect obtained during the pre-measurement control. However, if there is an error of several tens $\mu$m in the Z axis direction, and if the leveling control is performed by using, as a target value, a result obtained by adding such a value including the error, then an error of an unallowable degree is produced. For this reason, it is desirable that the pre-measurement is started when the result obtained by monitoring data upon the start of the measurement for the pre-measurement detecting point is within an allowable range, while when the result exceeds the allowable range, the measurement result obtained by the pre-measurement control is not used until arrival at the point (2) at which the result is within the allowable range.

In the case of the "AF sensor position movement type" and the "AF sensor number and position variable type" described above, it is possible to use only the AF detecting points included in the allowable range.

Further, a certain allowable range may be also set for the measurement error concerning the respective detecting points, and the AF detecting points except for the AF detecting point which involves a cause to exceed the allowable range may be used. By doing so, for example, it is possible to decrease the frequency of occurrence of AF error caused by the influence of dust or the like attached to the back surface side of the wafer. However, in such a method, it is necessary to allow the wafer surface to be previously included within an allowable range with respect to the position for making driving into the target AF. Therefore, it is necessary to execute global AF or global AF/AL beforehand on the basis of the result of focus measurement during the wafer alignment.

As explained above, according to the projection exposure apparatus 214 concerning the fourth embodiment of the present invention, a plurality of AF detecting points are arranged for the area which is wider in the non-scanning direction than the exposure area IF on the wafer W, when the pattern on the reticle R is subjected to the scanning exposure onto the wafer W by the aid of the projection optical system PL. Further, prior to the exposure for the shot area 212 located in the vicinity of the outer circumference of the wafer W, the pre-measurement for the focus is started at the point of time at which a part of the plurality of AF detecting points overlap the surface of the wafer W. The focus control is started on the basis of the result of the measurement. Accordingly, the focus information on those located at the inside, which has not been able to be measured by using the pre-measurement control based on the use of the conventional scanning type projection exposure apparatus, can be used for the focus control as the pre-measurement data. Therefore, it is possible to perform the highly accurate focus control without deteriorating the throughput.

When one AF detecting point on the surface of the wafer W, of the plurality of AF detecting points is used, the leveling control during the exposure is performed by using the leveling information on the adjacent shot, or by using the fixed value (for example, both of the inclination amount in the X direction and the inclination amount in the Y direction are "0"). Accordingly, the pre-measurement control can be started even for the incomplete shot area located in the vicinity of the outer circumference of the wafer.

Further, upon execution of the pre-measurement control by using one point of the AF detecting point on the surface of the wafer W, when the AF detecting point different from the aforementioned point overlaps the surface of the wafer W, the pre-measurement is started at the corresponding position. When the leveling control can be performed by using the both results of the pre-measurement until the start of exposure, the leveling process based on the use of the adjacent shot or the leveling correction process based on the use of the fixed value as described above is changed to the leveling control process based on the pre-measurement for the inside of the shot. By doing so, even in the case of the pre-measurement control for the incomplete shot located at the outer circumference portion, it is possible to perform the focus/leveling control highly accurately.

The AF detecting points to be used when the pre-measurement is performed are determined on the basis of the positional information on the outer circumference of the wafer W, the positional information on the plurality of the AF detecting points, and the coordinate positions of the shot areas on the wafer W, at the point of time at which the shot array on the wafer W is determined. Alternatively, the detection process based on the use of the AF detecting points to be used for the pre-measurement control is always executed during the scanning for the wafer. The pre-measurement control is started from the point of time at which the detection result obtained at any of the detecting points is within the allowable value. Accordingly, even if the influence of the outer circumferential edge of the wafer is unexpectedly larger than that assumed from the designed coordinate, the focus control is not started at that point of time. Therefore, it is possible to avoid occurrence of a large focus/leveling error.

In the fourth embodiment described above, explanation has been made for the case in which one wafer stage is used. However, it is a matter of course that the present invention can be carried out in the case of the use of two stages as explained in the first to the third embodiments. In this case, it is not necessarily indispensable to previously perform the focus measurement by using the alignment system. However, for the purpose of higher accuracy, it is preferable to perform the focus measurement by using the alignment system. When the focus alignment based on the use of the alignment system is not performed, an advantage is obtained in that the operation time therefor can be used for the operation time for other purposes.

Fifth Embodiment

The fifth embodiment of the present invention will now be described with reference to FIGS. 44 to 47.

Figure 44:
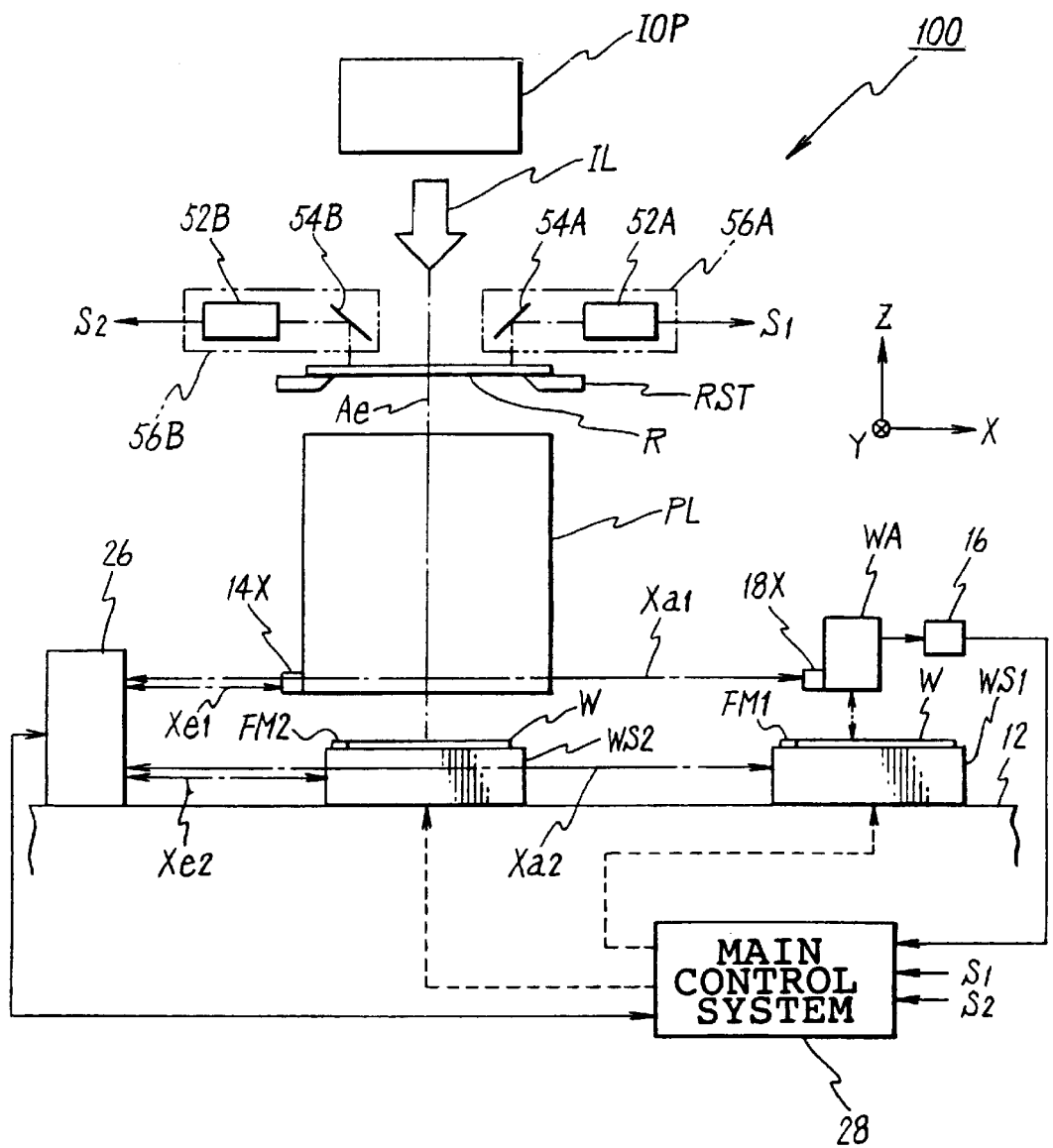
FIG. 44 is a view schematically showing the entire structure of an exposure apparatus related to the fifth embodiment.
Figure 45:
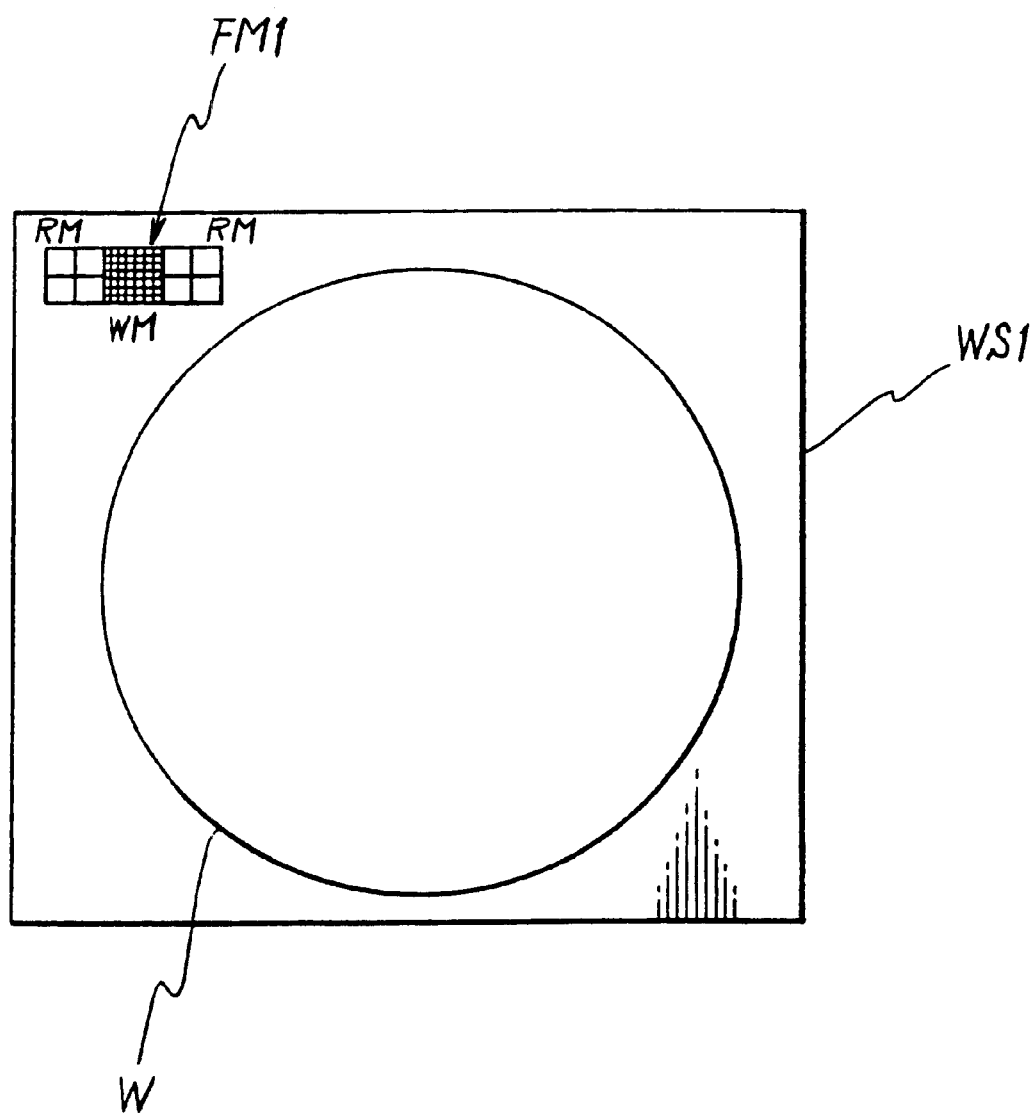
FIG. 45 is a schematic plan view of one wafer stage of FIG. 44.

FIG. 44 shows the constitution of an exposure apparatus 100 related to the first embodiment. This exposure apparatus 100 is a step-and-repeat reduced projection exposure apparatus (a so-called stepper).

The projection exposure apparatus 100 comprises an illumination system IOP, a reticle stage RST for holding a reticle R as a mask, a projection optical system PL for projecting the image of a pattern formed in the reticle R onto a wafer W as a sensitive substrate, a wafer stage WS1 as a first substrate stage moveable on a base 12 in a two-dimensional direction XY while holding the wafer W, a wafer stage WS2 as a second substrate stage movable on the base 12 in the two-dimensional direction XY independently of the wafer stage WS1 while holding the wafer W, an interferometer system 26 for measuring the positions of the two wafer stages WS1, WS2, and a main controller 28 as controller comprising a minicomputer (or a microcomputer) including CPU, ROM, RAM and I/O interface, for supervising and controlling the entire apparatus.

The illumination system IOP is composed of a light source (mercury lamp or excimer laser), and an illumination optical system comprising a fly eye lens, a relay lens, and a condenser lens. This illumination system IOP illuminates a pattern of the lower surface of the reticle R (pattern formation surface) with a uniform illuminance distribution by illumination light IL for exposure from the light source. The illumination light IL for exposure used is an emission line such as i-line from a mercury lamp, or excimer laser light from, say, KrF or Arf.

Onto the reticle stage RST, the reticle R is fixed via fixing means (not shown). The reticle stage RST is finely drivable by a driving system (not shown) in an X-axis direction (the right-and-left direction in the sheet face of FIG. 44), a Y-axis direction (the direction perpendicular to the sheet face of FIG. 44), and a θ direction (the direction of rotation in the XY plane). This measure enables the reticle stage RST to perform positioning of the reticle R (reticle alignment) such that the center of the pattern of the reticle R (the reticle center) periodically agrees with the optical axis Ae of the projection optical system PL. In FIG. 44, the state in which this reticle alignment has been performed is illustrated.

The projection optical system PL has the optical axis Ae lying in a Z-axis direction perpendicular to the moving plant of the reticle stage RST. Here, a both-sided telecentric system with a predetermined reduction ratio β (β of, say ⅕) is used. Thus, when the reticle R is illuminated at a uniform illuminance by the illumination light Il with the pattern of the reticle R being aligned with the shot areas on the wafer W, the pattern on the pattern formation surface is reduced by the projection optical system PL at the reduction ratio β. The so reduced pattern is projected onto the wafer W coated with a photoresist, whereby the reduced image of the pattern is formed in each shot area on the wafer W.

In the instant embodiment, an X fixed mirror 14X serving as a reference for X-axis direction position control during exposure of the wafer stages WS1, WS2 is fixed to one side (left side in FIG. 44) surface of the projection optical system PL in the X-direction. Similarly, a Y fixed mirror 14Y serving as a reference for Y-axis direction position control during exposure of the wafer stage WS1, WS2 is fixed to one side (rear side of the sheet face of FIG. 44) surface of the projection optical system PL in the Y-direction (see FIG. 46).

On the bottom surface of each of the wafer stages WS1, WS2, a gas static pressure bearing (not shown) is provided. By these gas static pressure bearings, the wafer stages WS1, WS2 are supported floatingly above the base 12 with a clearance of about several microns kept between them and the upper surface of the base 12. One side (left side in FIG. 44) surface in the X-axis direction of each of the wafer stages WS1, WS2, and one side (rear side of the sheet face in FIG. 44) surface in the Y-axis direction of each of the wafer stages WS1, WS2 are mirror finished to form reflecting surfaces that function as moving mirrors for reflecting a measuring beam from the interferometer system 26.

Onto the bottom surface of the wafer stages WS1, WS2, magnets are fixed. Under an electromagnetic force generated by driving coils (not shown) embedded in predetermined ranges of the base (concretely, a predetermined region near a site below the projection optical system PL, and a predetermined region near a site below the alignment microscope WA), the wafer stages WS1, WS2 are moved on the base 12 in the two-dimensional direction XY. That is, the magnets on the bottom surfaces of the wafer stages WS1, WS2 and the driving coils embedded in the base 12 constitute a so-called moving magnet type linear motor as driving means for the wafer stages WS1, WS2. The driving current of the driving coils of this linear motor is controlled by the main controller 28.

On the wafer stages WS1, WS2, wafers W are held by vacuum suction or the like via wafer holders (not shown). Onto the wafer stages WS1, WS2, too, reference mark plates FM1, FM2 whose surface is as high as the surface of the wafer W are fixed. On the surface of the reference mark plate FM1, as shown in the plan view of FIG. 45, a mark WM for measurement with a wafer alignment microscope WA to be described later on is formed at the center in the longitudinal direction of the surface. On both sides of the mark MW in the longitudinal direction, a pair of marks RM are formed for use in measuring the relative positional relation with the reticle R via the projection optical system PL. On the other reference mark plate FM2, exactly the same marks WM, RM are formed.

In the instant embodiment, moreover, an off-axis alignment microscope WA as an alignment system for detecting a position detecting mark (alignment mark) formed on the wafer W is provided at a predetermined distance of, say, 3,000 mm from the objection optical system PL in a direction at an angle of nearly 45° to the XY axis. The wafer W has level difference formed by exposure and processing for the previous layers. They include position detecting marks (alignment marks) for measurement of the positions of short areas on the wafer. These alignment marks are measured by the alignment microscope WA.

The alignment microscope WA used here is an FIA (field image alignment) type alignment microscope relying on image processing. According to this microscope, illumination light emitted from a light source (not shown) which produces broad band illumination light, such as a halogen lamp, is cast on the wafer W (or the reference mark plate FM) after passing an objective lens (not shown). Reflected light from a wafer mark region (not shown) on the surface of the wafer W passes sequentially through the objective lens and an indicator plate (not shown), forming an image of the wafer mark and an image of the indicator on the indicator plate on an imaging surface of a CCD or the like (not shown). Photoelectric conversion signals of these images are processed by a signal processing circuit (not shown) in a signal processing unit 160. The relative positional relation between the wafer mark and the indicator is calculated by a computing circuit (not shown), and this relative positional relation is conveyed to the main controller 28. The main controller 28 calculates the position of the alignment mark on the wafer W on the basis of the relative positional relation and the measured values of the interferometer system 26.

To one side (left side in FIG. 44) surface of the alignment microscope WA in the X-axis direction, an X fixed mirror 18X is fixed for serving as a reference for position control in the X-axis direction during the alignment action of the wafer stages WS1, WS2. Similarly, to one side (rear side of the sheet face of FIG. 44) surface of the alignment microscope WA in the Y-axis direction, a Y fixed mirror 18Y is fixed for serving as a reference for position control in the Y-axis direction during the exposure action of the wafer stages WS1, WS2.

Available as the alignment microscope are not only the FIA type, but other optical alignment devices such as LIA (laser interferometric alignment) or LSA (laser step alignment) devices, other optical devices such as a phase contrast microscope and a differential interference microscope, and non-optical devices such as STM (scanning tunnel microscope) for detecting the atomic-level irregularities of the surface of a specimen by utilizing the tunnel effect, and AFM (atomic force microscope) for detecting the atomic- and molecular-level irregularities of the surface of a specimen by utilizing atomic force (gravity, repulsion).

In the projection exposure apparatus 100 of the instant embodiment, reticle alignment microscopes 52A, 52B as mark detecting system for simultaneously observing an image of the reference mark RM on the reference mark plate FM and a reticle alignment mark (not shown) on the reticle R through the projection optical system PL are provided above the reticle R. Detection signal S1, S2 from the reticle alignment microscopes 52A, 52B are supplied to the main controller 28. In this case, deflecting mirrors 54A, 54B for guiding detection light from the reticle R to the reticle alignment microscopes 52A, 52B are unitized integrally with the relevant reticle alignment microscopes 52A, 52B to constitute a pair of microscope units 56A, 56B. Upon start of an exposure sequence, these microscope units 56A, 56B are retreated by a mirror driving device (not shown) to positions beyond the reticle pattern surface under a command from the main controller 28.

Next, the interferometer system 26 of FIG. 44 which manages the positions of the wafer stages WS1, WS2 will be described in detail.

Figure 46:
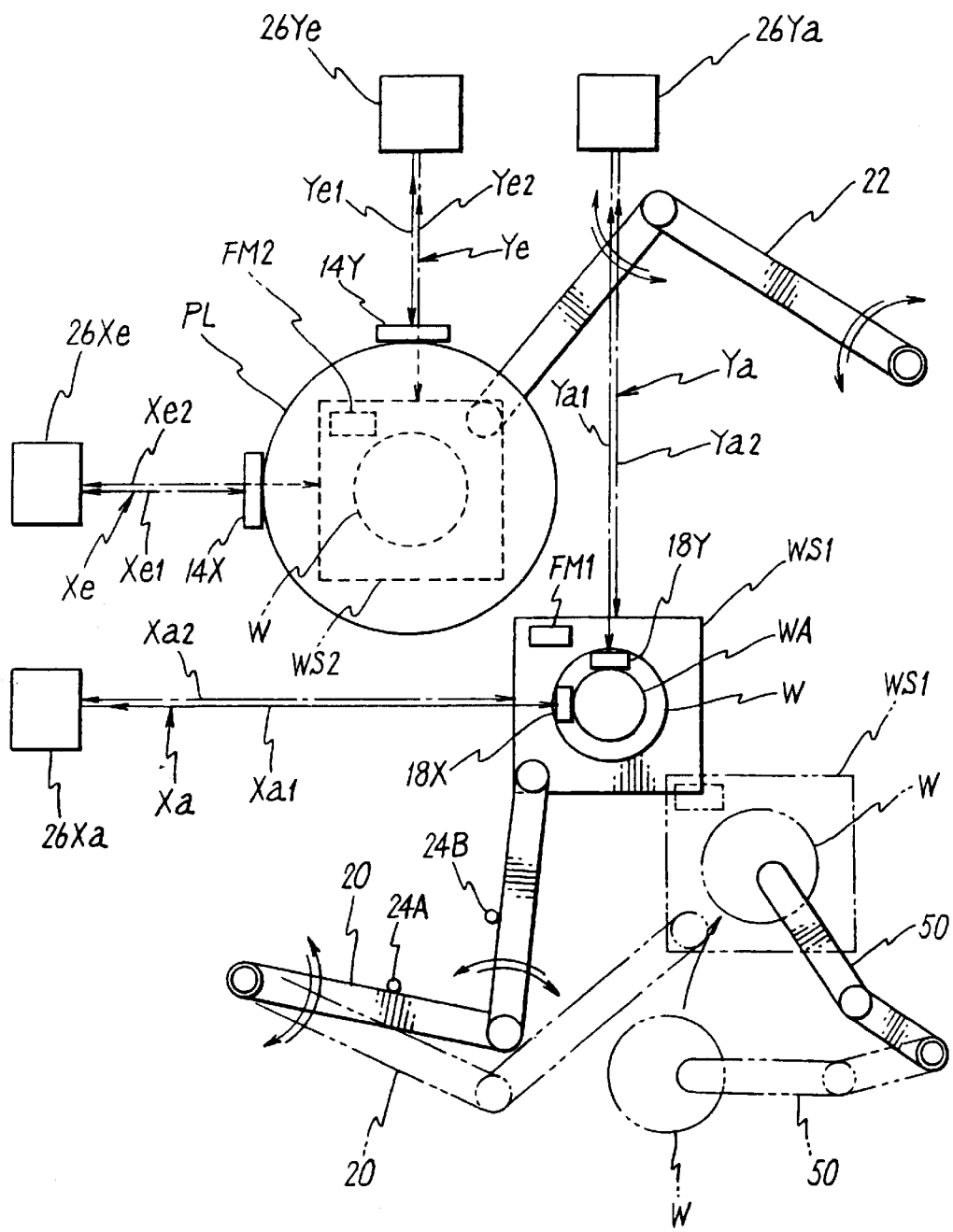
FIG. 46 is a schematic plan view of the apparatus of FIG. 44.

This interferometer system 26, actually is composed of a first laser interferometer 26Xe for X-axis direction position measurement, a second laser interferometer 26Xe for Y-axis direction position measurement, a third laser interferometer 26Xa for X-axis direction position measurement, and a fourth laser interferometer 26Ya for Y-axis direction position measurement, as illustrated in FIG. 46. These components are representatively shown in FIG. 44 as the interferometer system 26.

The first laser interferometer 26Xe projects onto the X fixed mirror 14X a reference beam $X_{e1}$ in the X-axis direction that passes through the center of projection of the projection optical system PL. The first laser interferometer 26Xe also projects a measuring beam $X_{e2}$ onto the reflecting surfaces of the wafer stage (WS1 or WS2). Reflected light waves from these two beams are superposed into one for interference. Based on this interference state, the displacement of the reflecting surface of the wafer stage relative to the fixed mirror 14X is measured The second laser interferometer 26Ye projects onto the Y fixed mirror 14Y a reference beam $Y_{e1}$ in the Y-axis direction that passes through the center of projection of the projection optical system PL. The second laser interferometer 26Ye also projects a measuring beam $Y_{e2}$ onto the reflecting surface of the wafer stage (WS1 or WS2).

Reflected light waves from these two beams are superposed into one for interference. Based on this interference state, the displacement of the reflecting surface of the wafer stage relative to the fixed mirror 14Y is measured.

The third laser interferometer 26Xa projects onto the X fixed mirror 18X a reference beam $X_{a1}$ in the X-axis direction that passes through the center of detection of the alignment microscope WA. The third laser interferometer 26Xa also projects a measuring beam $X_{a2}$ onto the reflecting surface of the wafer stage (WS1 or WS2). Reflected light waves from these two beams are superposed into one for interference. Based on this intereference state, the displacement of the reflecting surface of the wafer stage relative to the fixed mirror 18X is measured.

The fourth laser interferometer 26Ya projects onto the Y fixed mirror 18Y a reference beam $Y_{a1}$ in the Y-axis direction that passes through the center of detection of the alignment microscope WA. The fourth laser interferometer 26Ya also projects a measuring beam $Y_{a2}$ onto the reflecting surface of the wafer stage (WS1 or WS2). Reflected light waves from these two beams are superposed into one for interference. Based on this interference state, the displacement of the reflecting surface of the wafer stage relative to the fixed mirror 18Y is measured.

Here, the measuring axis of the first laser interferometer 26Xe that consists of the reference beam $X_{e1}$ and the measuring beam $X_{e2}$ is called the first measuring axis Xe. The measuring axis of the second laser interferometer 26Ye that consists of the reference beam $Y_{e1}$ and the measuring beam $Y_{e2}$ is called the second measuring axis Ye. The measuring axis of the third laser interferometer 26Xa that consists of the reference beam $X_{a1}$ and the measuring beam $X_{a2}$ is called the third measuring axis Xa. The measuring axis of the fourth laser interferometer 26Ya that consists of the reference beam $Y_{a1}$ and the measuring beam $Y_{a2}$ is called the fourth measuring axis Ya. The first measuring axis Xe and the second measuring axis Ye intersect each other perpendicularly at the center of projection of the projection optical system PL (consistent with the center of the optical axis Ae), while the third measuring axis Xa and the fourth measuring axis Ya intersect each other perpendicularly at the center of detection of the alignment microscope WA. Because of this constitution, the position of the wafer stage can be measured precisely in the direction of each measuring axis, without Abbe's error due to yawing or the like of the wafer stage, both during measurement of the position detecting mark on the wafer W (alignment mark) and during exposure of the wafer W with the pattern. To raise the accuracy of measurement, it is more desirable to use two-frequency heterodyne interferometers as the above first to fourth laser interferometers.

Returning to FIG. 44, the measured values of the interferometer system 26 are supplied to the main controller 28. The main controller 28 controls the positions of the waver stages WS1, WS2 via the aforementioned linear motors while monitoring the measured values of the interferometer system 26.

As clear also from FIG. 46, the instant fifth embodiment is constructed such that during the exposure of the wafer W on the wafer stage WS1 or WS2 with the reticle pattern through the projection optical system PL, the position of the wafer stage is managed by the first and second laser interferometers 26Xe, 26Ye. During the measurement of the position detecting mark on the wafer W (alignment mark) by the alignment microscope WA, on the other hand, the position of the wafer stage is managed by the third and fourth laser interferometers 26Xa, 26Ya. After completion of the exposure, or after completion of the alignment mark measurement, however, each measuring axis does not hit the reflecting surface of each wafer stage. Thus, the positional control of the wafer stage by the interference system 26 becomes difficult.

The projection exposure apparatus 100 of the instant embodiment, therefore, has a first robot arm 201 as a moving device for freely moving the wafer stage WS1 among three locations, i.e., a third position indicated by a virtual line in FIG. 46, a second position indicated by a solid line in FIG. 46, and a first position at which the wafer stage WS2 is located in FIG. 46; and a second robot arm 221 as a moving device for freely moving the wafer stage WS2 similarly among the three locations, the first position, the second position and the third position. These first and second robot arms 201, 221 are also controlled by the main controller 28, and the wafer stage position control accuracy of these first and second robot arms 201, 221 is generally about ±1 μm. As these robot arms 201, 221, articulated robot arms of a known structure are sued, and their detailed description is omitted. To realize that position control accuracy without fail, upward/downward moving pins as illustrated by the numerals 24A, 24B in FIG. 46 may be provided as stoppers.

A brief explanation for the third, second and first positions will be offered here. The third position refers to a wafer replacement position at which the wafer W is passed on between a carrier arm 500 constituting part of an external substrate carrier mechanism and the wafer stage (WS1, WS2). The second position refers to a position at which the alignment of the wafer W on the wafer stage is performed after loading of the wafer W is completed, and also an arbitrary position at which the third measuring axis Xa and the fourth measuring axis Ya both hit the reflecting surfaces of the wafer stage. The first position refers to a position at which the exposure of the wafer W on the wafer stage is performed after alignment of the wafer is completed, and also an arbitrary position at which the first measuring axis Xe and the second measuring axis Ye both hit the reflecting surfaces of the wafer stage.

In the instant embodiment, as described above, the positions illustrated in FIG. 46 are determined as the first, second and third positions. However, the second position may be any position if it satisfies the above-mentioned definition. For example, a position at which the mark WM on the reference mark plate FM rests in the detection area of the alignment microscope WA may be set as the second position. Likewise, the first position may be any position if it satisfies the above-mentioned definition. For example, a position at which the mark RM on the reference mark plate FM rests in the projection area of the projection optical system PL may be set as the first position.

The following is an explanation for the overall flow of actions of the projection exposure apparatus 100 of the instant embodiment constructed as stated above.

1̂ Assume that the wafer stages WS1 lies at the third position, while the wafer stage WS2 lies at the first position.

First of all, wafer replacement is performed between the wafer stage WS1 and the carrier arm 500. This wafer replacement is carried out by a center lifting (wafer lifting) mechanism above the wafer stage WS1 and the carrier arm 500 as done in the above-mentioned embodiment. Thus, a detailed description is omitted. As stated previously, the positioning accuracy of a robot arm is generally abut ±1 μm or less, so that the positioning accuracy of the carrier arm 500 is also comparable to this value. Prior to this wafer replacement, the wafer W has roughly been positioned by a prealignment device (not shown) in the directions of X, Y and θ. Thus, its position of loading on the wafer stage does not deviate markedly. The loading position of the wafer W relative to the reference mark plate FM1, for example, is within the error of ±1 μm or less.

During the water replacement, the wafer stage WS1 is not position-controlled by a laser interferometer. However, the first robot arm 201 grasps the wafer stage WS1, so that the disadvantage of the water stage WS1 wandering about does not occur. During the grasp by the first robot arm 201, the linear motor that drives the wafer stage WS1 is at a halt (the same holds in the following description).

Upon completion of wafer replacement (loading of the wafer W onto the wafer stage WS1), the main controller 28 controls the first robot arm 201 to move the wafer stage WS1 to the second position indicated by the solid line in FIG. 46. At this position, the main controller 28 resets the third and fourth laser interferometers 26Xa, 26Ya simultaneously. Upon completion of this resetting, the first robot arm 201 finishes its role. Thus, the first robot arm 201 is retreated, away from the wafer stage WS1, by a drive system (not shown) to a non-interfering position in accordance with a command from the main controller 28.

After resetting of the third and fourth laser interferometers 26Xa, 26Ya is completed, the main controller 28 controls the wafer stage WS1 via the aforementioned linear motor, while monitoring the measured values of the interferometers 26Xa, 26Ya, so that the mark WM on the reference mark plate FM1 on the wafer stage WS1 is positioned in the detection area of the alignment microscope WA. The accuracy of positioning to the second position by the first robot arm 201 can be generally about ±1 μm or less, as stated earlier. Since the interferometric measuring axes have been reset at this second position, position control can be performed afterwards with a resolving power of about 0.01 μm on the basis of design value (the relative positional relation in design between the reflecting surface of the wafer stage WS1 and the mark WM on the reference mark plate). As a result, the wafer stage WS1 is positioned with sufficient accuracy for measurement of the mark WM by the alignment microscope WA. When the second position is set at a position at which the mark WM on the reference mark plate FM1 on the wafer stage WS1 is positioned in the detection area of the alignment microscope WA, the movement of the wafer stage WS1 after resetting of the interferometers is not necessary. This is more desirable from the aspect of throughput.

Then, the alignment microscope WA measures the position of the mark ($\Delta W_X$, $\Delta W_Y$) on the reference mark plate FM1 relative to the center of detection (center of indicator) of the alignment microscope WA. The main controller 28 obtains the average values ($X_0$, $Y_0$) of the measured values of the third and fourth laser interferometers 26Xa, 26Ya during this measurement. The outcome shows that when the measured values of the laser interferometers 26Xa, 26Ya show ($X_0-\Delta W_S$, $Y_0-\Delta W_Y$), the mark WM on the reference mark plate FM1 lies directly below the center of detection (center of indicator) of the alignment microscope WA. A series of actions of the third and fourth laser interferometers 26Xa, 26Ya will be called W-SET in the following description.

While wafer replacement, interferometer resetting, and a series of actions of the W-SET are being performed on the one wafer stage, WS1, in the above manner, the actions described below are carried out on the other wafer stage, WS2.

That is, the wafer stage WS2 is moved to the first position by the second robot arm 221 as described previously. The control for positioning to the first position is also performed with an accuracy of ±1 μm or less. At the same time that the movement of the wafer stage WS2 to the first position is completed, the main controller 28 resets the first and second laser interferometers 26Xe, 26Ye.

Upon completion of this resetting by the first and second laser interferometers 26Xe, 26Ye, the second robot arm 221 finishes its role. Thus, the second robot arm 22 is retreated, away from the wafer stage WS2, by a drive system (not shown) to a non-interfering position in accordance with a command from the main controller 28.

Then, the main controller 28 controls the position of the wafer stage WS2 via the linear motor, while monitoring the measured values of the laser interferometers 26Xe, 26Ye, so that the mark RM on the reference mark plate FM2 is positioned at a position at which it overlaps via the projection optical system PL the reticle alignment mark (not shown) formed on the reticle R in the projection area of the projection optical system. In this case, the accuracy of positioning to the first position by the second robot arm 22 can be generally about ±1 μm or less, as stated earlier. Since the interferometric measuring axes have been reset at this first position, position control can be performed afterwards with a resolving power of about 0.01 μm on the basis of the design values (the relative positional relation in design between the reflecting surfaces of the wafer stage WS2 and the marks RM on the reference mark plate FM2). As a result, the wafer stage WS2 is positioned with necessary and sufficient accuracy for the simultaneously observation of the reticle alignment mark and the mark RM on the reference mark plate FM by the reticle alignment microscopes 52A, 52B.

Then, the reticle alignment microscopes 52A, 52B measure the relative spacings ($\Delta R_X$, $\Delta R_Y$) between the reticle alignment mark on the reticle R and the mark RM on the reference mark plate FM2, namely, the positional deviations ($\Delta R_X$, $\Delta R_Y$) of the center of the reference mark RM as the reference point on the wafer stage WS2 from the center of projection of the pattern image of the reticle R as the predetermined reference point in the projection area of the projection optical system PL. The main controller 28 takes in these measured values of the reticle alignment microscopes 52A, 52B, and simultaneously read the measured values ($X_1$, $Y_1$) of the laser interferometers 26Xe, 26Ye. The results show that the positions at which the measured values of the laser interferometers 26Xe, 26Ye become ($X_1-\Delta R_X$, $Y_1-\Delta R_Y$) are the positions at which the reticle alignment mark and the mark RM on the reference mark plate FM2 just overlap each other via the projection optical system PL. This series of actions after resetting of the first and second laser interferometers 26Xe, 26Ye will be called R-SET in the following description.

② Then, wafer alignment on the wafer stage WS1 side and exposure on the wafer stage WS2 side are performed in parallel.

After resetting of the third and fourth laser interferometers 26Za, 26Ya, the position of the wafer stage WS1 is managed based on the measured values of the laser interferometers 26Xa, 26Ya. The main controller 28 measures the positions of the position detecting marks (alignment marks) for predetermined specific sample shots among a plurality of shot areas on the wafer W. The main controller 28 measures these positions on the (Xa, Ya) coordinate system based on output from the alignment microscope WA, by moving the wafer stage WS1 sequentially via the linear motor, while monitoring the measured values of the interferometers 26Ya, 26Xa. In this case, the measured values of the interferometers ($X_0-\Delta_X$, $Y_0-\Delta_Y$) when the mark WM on the reference mark plate FM1 comes directly below the center of detection of the alignment microscope WA have been obtained. Based on these values and the design values for the relative positions of each alignment mark to the reference mark WM, it is determined by computation what the measured values of the laser interferometers 26Ya, 26Xa should be in order to position each alignment mark on the wafer W in the detection area of the wafer alignment microscope WA, and what position the wafer stage WS1 should be moved to in order to achieve those values. Based on the results of these computations, the wafer stage WS1 is moved sequentially.

To position the wafer W in the directions of X, Y and θ, it suffices to measure, at least, two X measurement marks and one Y measurement mark (or one X measurement mark and two Y measurement marks). Here, three or more X measurement marks not on a straight line, and three or more Y measurement marks not on a straight line should be measured as EGA sample shots.

The measured alignment mark (wafer mark) positions of the respective sample shots and the data on arrangement of the designed shot areas are used to perform statistical calculation by the least-squares method as disclosed in Japanese Laid-Open Patent Publication No. 61-44429, corresponding to U.S. Pat. No. 4,780,617, thereby obtaining all data on the arrangement of the plurality of shot areas on the wafer W. However, it is desirable to subtract from the results of calculation the aforementioned value of the interferometers ($X_0-\Delta_X$, $Y_0-\Delta_Y$), which is obtained when the mark WM on the reference mark plate FM1 comes directly below the center of detection of the alignment microscope WA, so as to convert into data relative to the reference mark MA on the reference mark plate FM1. This measure gives a necessary and sufficient knowledge of the relative positional relation between the mark WM on the reference mark plate FM1 and the reference point of each shot area on the wafer W.

In parallel with the fine alignment (EGA) on the wafer stage WS1 side, superposed exposure of the pattern image of the reticle R and a known pattern of shot areas on the wafer W is performed on the wafer stage WS2 side in the following manner:

That is, the main controller 28 positions each shot area on the wafer W in the exposure position, while monitoring the measured values of the interferometers 26Ye, 26Xe, based on the results of measurement of the positional deviations, the coordinate position (Xe, Ye) of the wafer stage WS2 at that time, and the coordinate data on the arranged shots relative to the reference mark WM on the reference mark plate FM2 calculated in the same way as in the alignment action. Performing this positioning, the main controller 28 exposes the wafer W with the reticle pattern sequentially in the step-and-reap manner, while controlling the opening and closing of the shutter in the illumination optical system. Here, high precision superposition is possible although the interferometers 26Xe, 26Ye are reset (the measuring axes of the interferometers are interrupted) prior to the exposure of the wafer W on the wafer stage WS2. Detailed reasons for this are as follows: The spacing between the mark WM and the mark RM on the reference mark plate FM2 is known. As a result of fine alignment (EGA) performed previously, the relative positional relation between the mark WM on the reference mark plate FM2 and the reference point of each shot area on the wafer W has been calculated in the same manner as described earlier. Also, it has been measured where on the wafer stage WS2 the reticle alignment mark on the reticle R is situated (namely, what is the relative positional relation between the center of projection of the pattern image of the reticle (almost consistent with the center of projection of the projection optical system PL) as the predetermined reference point in the projection area of the projection optical system PL and the mark RM as the reference point on the wafer stage WS2). Based on the results of these measurements, it is clear what measured values of the first and second laser interferometers 26Xe, 26Ye result in the exact superposition of the pattern image of the reticle R with each shot area on the wafer W.

③ In the foregoing manner, fine alignment (EGA) is completed on the wafer stage WS1 side, while exposure with the reticle pattern for all the shot areas on the wafer W is completed on the wafer stage WS2 side. Then, the wafer stage WS1 is moved to the first position below the projection optical system PL, while the wafer stage WS2 is moved to the third position, the position of wafer replacement.

In detail, the wafer stage WS1 is grasped by the first robot arm 201 and moved to the first position in accordance with an instruction from the main controller 28. The control for positioning to the first position is performed with an accuracy of ±1 μm or less. Simultaneously with the completion of movement of the wafer stage WS1 to the first position, the main controller 28 resets the first and second laser interferometers 26Xe, 26Ye.

Upon completion of this resetting, the first robot arm 201 finishes its role. Thus, the first robot arm 201 is retreated, away from the wafer stage WS1, by the drive system (not shown) to a non-interfering position in accordance with an instruction from the main controller 28.

Then, the main controller 28 carries out R-SET in the same manner as for the wafer stage WS2 side stated earlier. This step results in the measurement of the relative spacings ($\Delta R_X$, $\Delta R_Y$) between the reticle alignment mark and the mark RM on the reference mark plate FM1, namely, the positional deviations ($\Delta R_X$, $\Delta R_Y$) of the center of the reference mark RM as the reference point on the wafer stage WS2 from the center of projection of the pattern image of the reticle R as the predetermined reference point in the projection area of the projection optical system PL, as well as the stage coordinate position ($X_1$, $Y_1$) at the time of measuring the positional deviations.

While the interferometer resetting and the R-SET are being performed on the wafer stage WS1 side in the above manner, the second robot arm 221 grasps the wafer stage WS2, whose exposure action has been completed, in accordance with an instruction from the main controller 28. The second robot arm 22 moves this wafer stage WS2 to the wafer passing-on position (third position) for wafer replacement. Then, wafer replacement, interferometer resetting and W-SET are performed in the same manner as on the wafer stage WS1 side that has been mentioned previously.

④ Then, the main controller 28, as stated earlier, controls the actions of the wafer stages WS1 and WS2 so that fine alignment (EGA) is performed on the wafer stage WS2 side, while the wafer W is sequentially exposed with the reticle pattern by the step-and-repeat method on the wafer stage WS1 side in parallel with EGA.

⑤ Thereafter, the main controller 28 controls the actions of the stages WS1, WS2 and the actions of the first and second robot arms so that the actions of ① to ④ explained above will be repeated in sequence.

Figure 47:
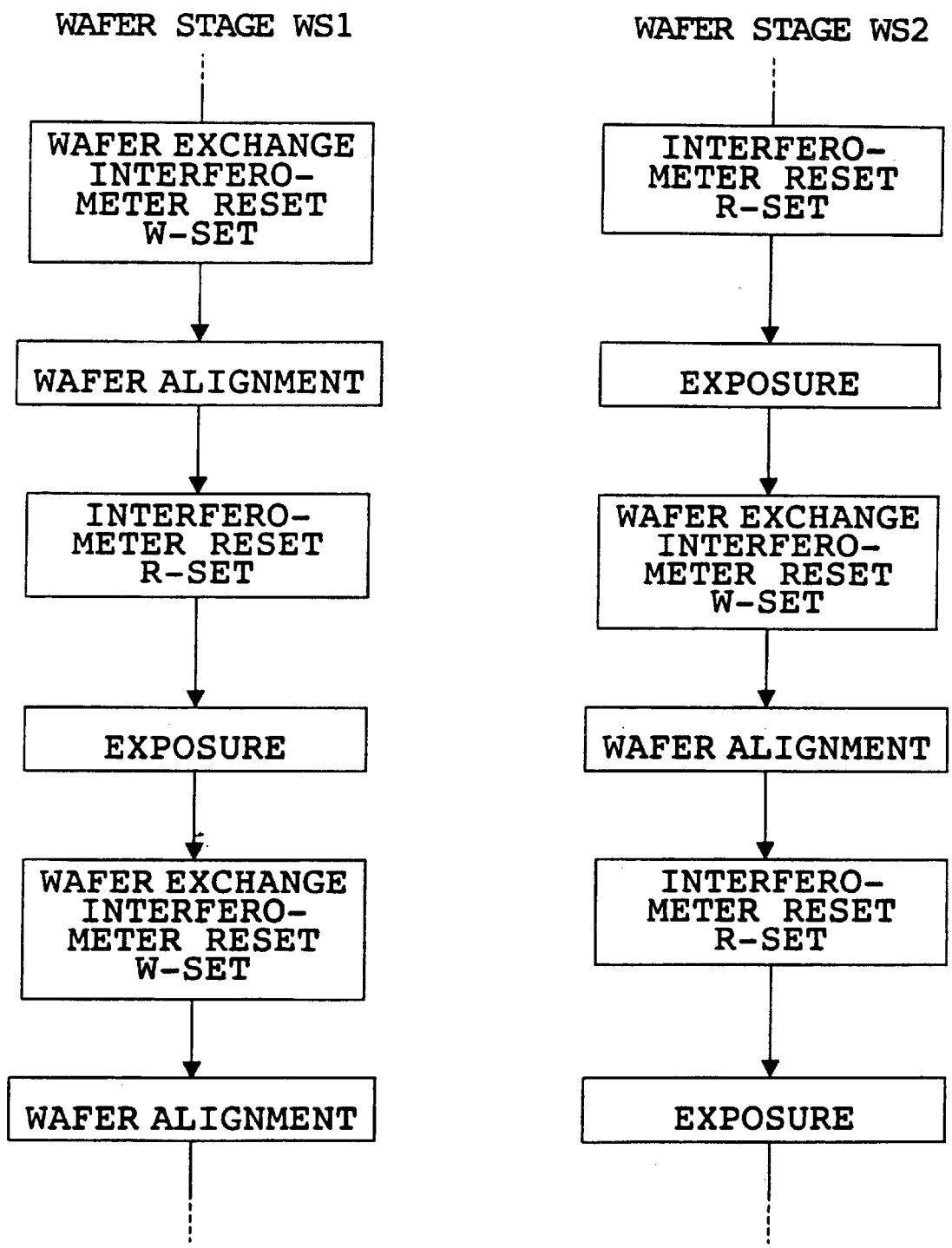
FIG. 47 is a view showing a flow of actions in the apparatus of FIG. 44.

A flow of the above-described parallel actions taking place on the two stages, WS1 and WS2, is illustrated in FIG. 47.

As described above, the projection exposure apparatus 100 related to the fifth embodiment can perform an exposure action on one of the wafer stage WS1 and the wafer stage WS2, and a fine alignment action on the other stage in parallel. Thus, throughput can be expected to improve markedly in comparison with earlier technologies by which wafer replacement (including search alignment), fine alignment and exposure were performed sequentially. This is because a fine alignment action and an exposure action account for a high proportion of the time required for an exposure sequence.

The above embodiment also makes it a precondition that the measuring axes of the interferometer system 26 are interrupted. Thus, it suffices for the reflecting surface (a moving mirror, if any) of each wafer stage to be slightly longer than the wafer diameter. Compared with earlier technologies requiring uninterrupted measuring axes, therefore, the wafer stage can be compact and light-weight, so that an improvement in stage controlling performance can be expected.

The embodiment, moreover, makes it a precondition that the measuring axes of the interferometer system are interrupted, and the position of the mark on the reference mark plate FM on the stage is measured each before alignment and exposure. Thus, it produces no disadvantage however long the center distance (baseline amount) between the center of projection of the projection optical system PL and the center of detection of the alignment microscope WA will be. By providing a somewhat large spacing between the projection optical system PL and the alignment microscope WA, wafer alignment and exposure can be performed in a time-parallel manner, with no interference between the wafer stage WS1 and the wafer stage WS2.

In the above embodiment, furthermore, the interferometer system 26 has the first measuring axis Xe and the second measuring axis Ye intersecting perpendicularly at the center of projection of the projection optical system PL, and the third measuring axis Xa and the fourth measuring axis Ya intersecting perpendicularly at the center of detection of the alignment system WA. Thus, the two-dimensional position of the wafer stage can be managed accurately both during an alignment action and during exposure.

In addition, the fixed mirrors 14X, 14Y, 18X, 18Y for interferometers are fixed to the side surfaces of the projection optical system PL and the side surfaces of the alignment microscope WA. Unless the positions of the fixed mirrors change during alignment and exposure, therefore, disadvantages, such as a fall in the position control accuracy of the wafer stage, will not emerge, even if the positions of the fixed mirrors change owing to changes over time or vibrations of the apparatus. Thus, constructing the alignment microscope WA so as to be movable upward and downward would not cause any disadvantage.

The foregoing fifth embodiment has been described such that the wafer stages WS1 and WS2 are moved by the first and second robot arms 201, 221 among three locations, i.e., the first, second and third positions. However, the present invention is in no way limited to this constitution. If the wafer is replaced at the second position, for example, the wafer stages WS1 and WS2 may be moved by the first and second robot arms 201, 221 between the first and second positions. In this case, the main controller 28 controls the actions of the wafer stages WS1 and WS2 so that an exposure action for the wafer W on one of these stages and an alignment action for the wafer W on the other stage are performed in parallel. Then, the main controller 28 causes the first and second robot arms 201, 221 to interchange the positions of both stages.

The fifth embodiment has also been described such that step-and-repeat type exposure is performed for the wafer W on the stage on the basis of EGA. However, the present invention is in no way limited to this constitution, and the pattern image of the reticle may be projected sequentially onto each shot area on the wafer W with alignment and exposure being repeated die by die. In this case, the relative position of each alignment mark relative to the mark WM formed on the reference mark plate FM on the stage is measured during alignment. Thus, the reticle pattern image can be superimposed on each shot area based on this relative position in the same manner as described above. Such a die-by-die method is desirably adopted when the number of the shot areas on the wafer W is small. If the number of the shot areas is large, the aforementioned EGA method is desirable from the point of view of preventing a decrease in throughput.

The fifth embodiment has also been described such that the first robot arm 201 moves one stage, WS1, among three locations, i.e., the first, second and third positions, while the second robot arm 221 moves the other stage, WS2, among the three locations, i.e., the first, second and third positions. However, the present invention is in no way limited to this constitution. It is permissible, for example, to employ a method by which one robot arm 201 carries the stage WS1 (or WS2) to a position other than the first, second or third position and frees it there during its carriage from the first position to the third position, while the other robot arm 221 moves this stage WS1 (or WS2) from this position to the third position. This makes it possible to use one robot arm 201 exclusively for carriage between the second and first positions of both stages, and use the other robot arm 221 exclusively for carriage between the third and second positions of both stages.

Also, each laser interferometer constituting the interferometer system 26 may be a multi-axis interferometer which can measure not only the rectilinear positions of the wafer stage in the X- and Y-direction, but also its yawing or pitching.

Sixth Embodiment

Next, the sixth embodiment of the present invention will be described with reference to FIG. 48. The constituent parts identical with or comparable to those in the fifth embodiment will be assigned the same numerals or symbols, and their explanations will be omitted.

The sixth embodiment is characterized in that a wafer stage WS1 is constituted to be divisible into two parts, i.e., a stage body WS1a and a substrate holding member WS1b detachably mounted on the stage body WS1a and having the same shape as the stage body WS1a; and that likewise, a wafer stage WS2 is constituted to be divisible into two parts, i.e., a stage body WS2a and a substrate holding member WS2b detachably mounted on the stage body WS2a and having the same shape as the stage body WS2a.

On the substrate holding members WS1b, WS2b, the wafer W is held by suction via a wafer holder (not shown). Reflecting surfaces functioning as moving mirrors for an interferometer are formed on the side surfaces thereof. On these substrate holding members WS1b, WS2b, reference mark plates FM1, FM2 are provided, respectively, on their upper surfaces.

In this sixth embodiment, parallel processings are performed on the wafer stages WS1, WS2 in practically the same manner as in the aforementioned fifth embodiment. At a time when an alignment action is completed on one stage side, and an exposure action is completed on the other stage side, the main controller 28 controls a first and a second robot arm 201, 221. As a result, the substrate holding member WS1b (or WS2b) on the alignment-completed stage side is carried (moved) onto the stage body WS2a that has stopped at the first position. In parallel, the substrate holding member WS2b (or WS1b) on the exposure-completed stage side is carried onto the stage body WS1a that has stopped at the second position. In this manner, the substrate holding members WS1b, WS2b are replaced. During replacement of the substrate holding members WS1b, WS2b, the measuring axes of an interferometer system 26 are interrupted, making the position control of the wafer stages WS1, WS2 impossible. During this period, stage stoppers 30a, 30b appear and hold the stage bodies WS1a, WS2a in place. In this case, wafer replacement is performed at the second position by a carrier arm (not shown).

Figure 48:
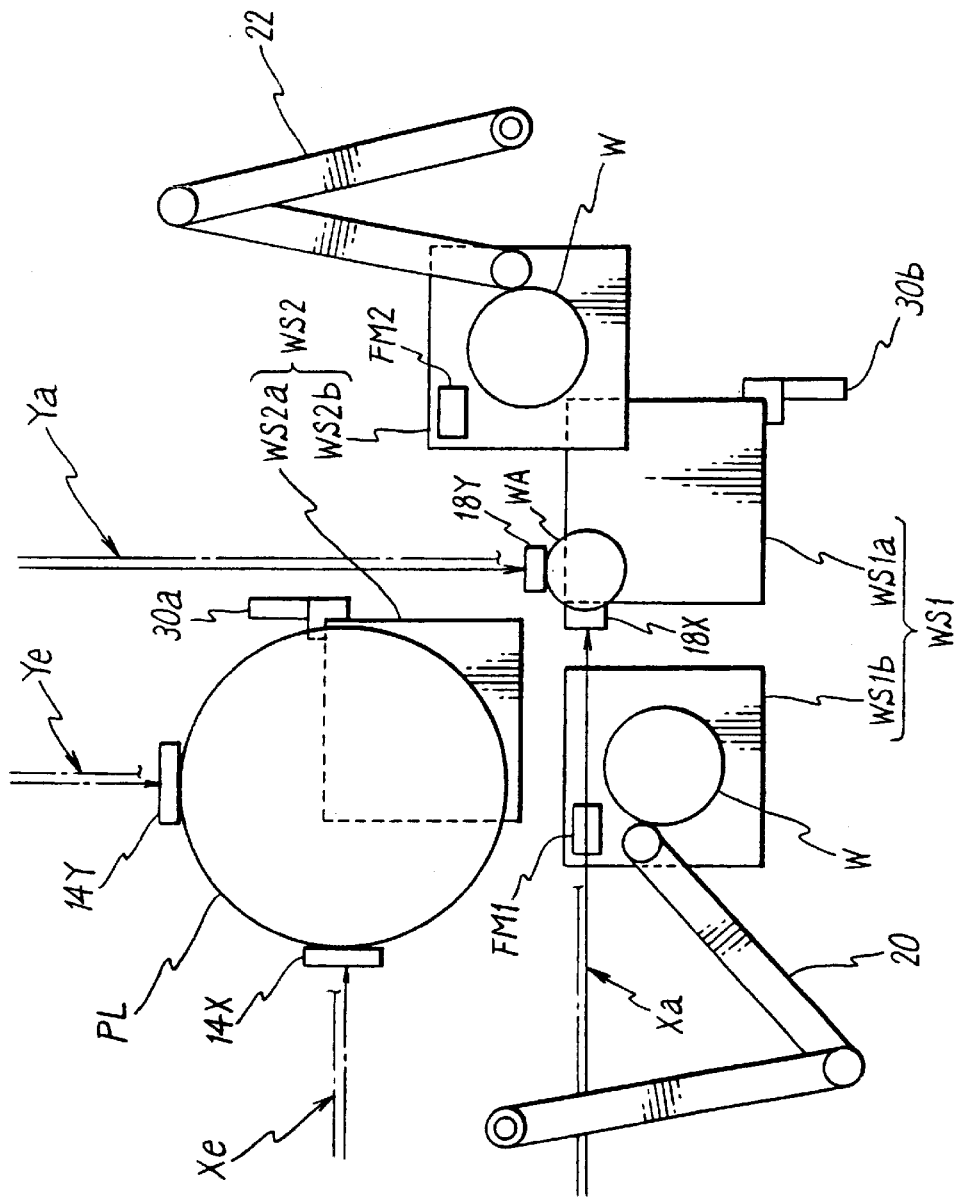
FIG. 48 is a schematic plan view showing the structure of a main part of an exposure apparatus as the sixth embodiment.

In the instant sixth embodiment, as will be easily imaged from FIG. 48, the position at which the mark WM on the reference mark plate FM lies in the detection area of the alignment microscope WA is determined as the second position; whereas the position at which the mark RM on the reference mark plate FM lies in the projection area of the projection optical system PL is determined as the first position. Thus, the main controller 28 carries out the movement of the substrate holding members WS1b, WS2b onto the stage bodies, resetting of the measuring axes of the interferometer system 26, and the R-SET or W-SET.

The sixth embodiment can obtain comparable effects to those by the fifth embodiment.

The sixth embodiment has been described such that the first and second robot arms 201, 221 move the substrate holding member between the first and second positions. However, as in the first embodiment, the first and second robot arms 201, 221 may move the substrate holding member among three locations, i.e., the first, second and third positions. In this case, wafer replacement can be performed at a site unrelated to the projection optical system PL or the alignment microscope WA. Hence, even if the working distance below the alignment microscope WA is narrow, for example, there are none of disadvantages such that the alignment microscope WA impedes wafer replacement.

The fifth and sixth embodiments have been described such that robot arms or stages stoppers are used as measures during the interruption of the measuring axes of the interferometer system 26. The present invention is not limited to this constitution. For instance, a two-dimensional grating may be formed on the lower surface of the wafer stage, so that the position can be read by an optical encoder from below the stage travel surface. Alternatively, there may be employed means capable of precisely moving the stage to a next position once the interferometer measuring axes are interrupted, or means capable of holding the stage body at a predetermined position while stopping it there.

The fifth and sixth embodiments have also been described such that two wafer stages movable independently are provided. However, three or more wafer stages which are movable independently may be provided. If three wafer stages are provided, an exposure action, an alignment action, and a wafer flatness measuring action, for example, can be performed in parallel. There may be a plurality of the projection optical system PL and alignment microscopes WA. If a plurality of the projection optical systems PL are present, an alignment action and two different patterns of exposure actions can be performed in parallel. This is suitable for double exposure or the like.

The above embodiments have been illustrated in which the present invention was applied to a step-and-repeat projection exposure apparatus. However, the range of application of this invention is not restricted to this constitution. This invention is applicable not only to a step-and-scan projection exposure apparatus, but to other types of exposure apparatuses, such as an electron beam direct drawing device.

Industrial Applicability

As explained above, according to the projection exposure apparatus and the projection exposure method of the invention, it possible to further improve the throughput. According to the projection exposure apparatus and the projection exposure method of the invention, an excellent effect, which has not been obtained in the conventional technique, is obtained in that it is possible to improve the throughput, miniaturize the substrate stage, and reduce the weight of the substrate stage.

According to the projection exposure apparatus and the projection exposure method of the invention, it is possible to further improve the throughput and avoid any mutual influence of disturbance between two substrate stages.

According to the projection exposure apparatus and the projection exposure method of the invention, it is possible to further improve the throughput and avoid any mutual interference between the two substrate stages. According the exposure method of the invention, it is possible to improve throughput and determine the size of the substrate stage regardless of the baseline amount. According to the exposure apparatus of the invention, it is possible to improve throughput by the parallel execution of an exposure action on one substrate stage and an alignment action on the other substrate stage.

According to the projection exposure apparatus and the projection exposure method of the invention, it is possible to perform the highly accurate focus/leveling control while further improving the throughput. According to the projection exposure method of the invention, it is possible to perform the highly accurate focus/leveling control while further improving the throughput, even in the case of the use of EGA in which the positional adjustment is performed with respect to the mask on the basis of the arrangement of the sample shot areas. According to the projection exposure apparatus of the invention, it is possible to perform the highly accurate focus/leveling control while improving the throughput, by using, as the pre-measurement data for the focus control, the focus information on those located at the inside which could not be subjected to pre-measurement when the shot areas located in the vicinity of the outer circumference of the sensitive substrate are exposed.

According to the scanning exposure method of the invention, it is possible to perform the highly accurate focus/leveling control while further improving the throughput. Therefore, the exposure apparatus and the exposure method of the invention are extremely suitable for producing semiconductor elements and liquid crystal display elements by means of the photolithography process.

What is claim is:

1. An exposure apparatus for forming a predetermined pattern on a sensitive substrate, wherein the exposure apparatus comprises:
   a first holding member which holds a sensitive substrate;
   a second holding member which holds a sensitive substrate;

a first movable member which is used commonly for the first and second holding members, and which is movable in a two-dimensional plane while supporting one of the first and second holding members in order for an exposure to be performed of the sensitive substrate held by the one holding member; and a second movable member which is used commonly for the first and second holding members, and which is movable in a two-dimensional plane while supporting the other of the first and second holding members in order for a measurement to be performed of the sensitive substrate held by the holding member;

a first interferometer system which obtains positional information of the one holding member held by the first movable member; and a second interferometer system which obtains positional information of the other holding member held by the second movable member;

each of the first and second holding members having a reflective surface used for the first and second interferometer systems; and the first and second movable members alternately support the first and second holding members.

2. An exposure apparatus according to claim 1, further comprising an exchanging mechanism which exchanges the one holding member supported by the first movable member and the other holding member supported by the second movable member.

3. An exposure apparatus according to claim 1, wherein the first and second movable members are moved by an electromagnetic force.

4. An exposure apparatus according to claims 1, wherein reflective surfaces used for the first and second interferometer systems are formed on the first and second holding members, respectively.

5. An exposure apparatus according to claim 1, wherein the first and second movable members are supported on a common base.

6. An exposure apparatus according to claim 5, further comprising a gas-bearing which supports the first and second movable members on the common base.

7. An exposure apparatus according to claim 1, wherein the exposure apparatus performs a scanning-exposure while moving the sensitive substrates relative to an exposure light.

8. An exposure apparatus according to claim 1, wherein the measurement includes a determination of positional information about a plurality of defined areas on the sensitive substrate.

9. An exposure apparatus according to claim 1, wherein the measurement includes a detection of an alignment mark on the sensitive substrate.

10. An exposure apparatus according to claim 9, herein the measurement includes a detection of focusing information of the substrate held on the other holding member supported by the second movable member.

11. An exposure apparatus according to claim 1, wherein the first movable member is moved without the second interferometer system, and the second movable member is moved without the first interferometer system.

12. An exposure apparatus according to claim 11, wherein the first and second movable members move on a common base.

13. An exposure apparatus according to claim 1, wherein the measurement includes a determination of positional relationship between a plurality of defined areas on the substrate held on the other holding member supported by the second movable member and a reference provided on the other holding member supported by the second movable member, and wherein after exchanging the holding members so that the one holding member is supported by the second movable member and the other holding member is supported by the first movable member, the reference provided on the other holding member is detected in order for alignment of the plurality of defined areas on the other holding member supported by the first holding member.

14. An exposure apparatus according to claim 13, wherein the first movable member is moved without the second interferometer system, and the second movable member is moved without the first interferometer system.

15. An exposure apparatus according to claim 14, wherein the first and second movable members move on a common base.

16. A micro-device manufacturing method including a lithography process utilizing the exposure apparatus defined in claim 1.

17. An exposure method for forming a predetermined pattern on sensitive substrate, the method comprising:

exposing a sensitive substrate which is held on a first holding member, while moving a first movable member which supports said first holding member;

monitoring positional information of the first holding member which is supported by the first movable member by using a first interferometer system;

measuring alignment information of a sensitive substrate which is held on a second holding member, while moving a second movable member which supports said second holding member;

monitoring positional information of the second holding member which is supported by the second movable member by using a second interferometer system;

exchanging the holding members so that the first holding member is supported by the second movable member and the second holding member is supported by the first movable member;

exposing, after the exchange, the sensitive substrate held on the second holding member, while moving said first movable member which supports the second holding member; and monitoring, after the exchange, positional information of the second holding member which is supported by the first movable member by using said first interferometer system, each of the first and second holding members having a reflective surface used for the first and second interferometer systems.

18. An exposure method according to claim 17, wherein said first and second movable members are moved by an electromagnetic force.

19. An exposure method according to claim 17, wherein reflective surfaces used for the first and second interferometer systems are formed on the first and second holding members, respectively.

20. An exposure method according to claim 17, wherein each of said first and second holding members has a reference, and wherein the reference of one of said holding members which is supported by the first movable member is detected prior to an exposure.

21. An exposure method according to claim 17, wherein said exposure is performed by a scanning-exposure method.

22. An exposure method according to claim 17, wherein said first interferometer system measures yawing and pitching.

23. An exposure method according to claim 22, wherein said second interferometer system measures yawing and pitching.

24. An exposure method according to claim 23, wherein the alignment information includes positional relationship between a plurality of defined areas on the substrate held on the second holding member supported by the second movable member and a reference provided on the second holding member supported by the second movable member, and wherein after the exchange, the reference provided on the second holding member is detected in order for alignment of the plurality of defined areas on the second holding member supported by the first holding member.

25. An exposure method according to claim 24, wherein the first movable member is moved without the second interferometer system, and the second movable member is moved without the first interferometer system.

26. An exposure method according to claim 25, wherein the first and second movable members are moved on a common base.

27. An exposure method according to claim 23, wherein the first movable member is moved without the second interferometer system, and the second movable member is moved without the first interferometer system.

28. An exposure method according to claim 27, wherein the first and second movable members are moved on a common base.

29. An exposure method according to claim 17, wherein said alignment information is obtained by detecting a plurality of marks on the sensitive substrate.

30. An exposure method according to claim 17, wherein said exposure of the substrate held on the first holding member is performed, while executing said measurement of the alignment information of the substrate held on the second holding member.

31. A device manufacturing method including an exposure process utilizing the method defined in claim 17.

32. An exposure method according to claim 17, wherein the alignment information includes positional relationship between a plurality of defined areas on the substrate held on the second holding member supported by the second movable member and a reference provided on the second holding member supported by the second movable member, and wherein after the exchange, the reference provided on the second holding member is detected in order for alignment of the plurality of defined areas on the second holding member supported by the first holding member.

33. An exposure method according to claim 32, wherein the first movable member is moved without the second interferometer system, and the second movable member is moved without the first interferometer system.

34. An exposure method according to claim 33, wherein the first and second movable members are moved on a common base.

35. An exposure apparatus according to claim 1, further comprising:
    a position control device, functionally associated with the first and second movable members, which controls the first and second movable members without using the first and second interferometer systems, when the first and second holding members are uncoupled from the first and second movable members, respectively.

36. An exposure apparatus according to claim 35, wherein the position control device moves the first and second movable members without using the first and second interferometer systems, when the first and second holding members are uncoupled from the first and second movable members, respectively.

37. An exposure apparatus according to claim 35, wherein the first and second movable members are stopped by the position control device without using the first and second interferometer systems, when the first and second holding members are uncoupled from the first and second movable members, respectively.

38. An exposure apparatus according to claim 37, wherein the position control device includes stoppers.

39. An exposure apparatus according to claim 35, wherein the position control device includes a measuring device which detects positional information of the first and second movable members in order to control the first and second movable members without using the first and second interferometer systems, when the first and second holding members are uncoupled from the first and second movable members, respectively.

40. An exposure apparatus according to claim 39, wherein the measuring device includes an encoder.

41. An exposure apparatus according to claim 35, further comprising:
    a driving system which moves the first and second movable members, respectively.

42. An exposure apparatus according to claim 41, further comprising:
    a switching device having coupling members which are respectively coupled to the first and second holding members in order to carry out the first and second holding members between the first movable member and the second movable member.

43. An exposure method according to claim 17, further comprising:
    controlling positions of the first and second movable members without using the first and second interferometer systems, when the first and second holding members are uncoupled from the first and second movable members, respectively.

44. An exposure method according to claim 43, wherein the first and second movable members are moved without using the first and second interferometer systems, when the first and second holding members are uncoupled from the first and second movable members, respectively.

45. An exposure method according to claim 43, wherein the first and second movable members are stopped without using the first and second interferometer systems, when the first and second holding members are uncoupled from the first and second movable members, respectively.

46. An exposure method according to claim 45, wherein the first and second movable members are stopped by stoppers.

47. An exposure method according to claim 43, further comprising:
    detecting positional information of the first and second movable members without using the first and second interferometer systems, when the first and second holding members are uncoupled from the first and second movable members, respectively.

48. An exposure method according to claim 47, wherein the positional information of the first and second movable members are optically detected, when the first and second holding members are uncoupled from the first and second movable members, respectively.

49. An exposure method according to claim 48, wherein the positional information of the first and second movable members are optically detected by using an encoder.

50. An exposure method according to claim 43, further comprising:
    physically connecting a switching device to the first and second holding members in order to carry the first and second holding members, which are uncoupled from the first and second movable members, between the first movable member and the second movable member, respectively.

* * * * *